US006079041A

United States Patent [19]

Kunisa et al.

[11] Patent Number: 6,079,041

[45] Date of Patent: Jun. 20, 2000

[54] DIGITAL MODULATION CIRCUIT AND DIGITAL DEMODULATION CIRCUIT

[75] Inventors: Akiomi Kunisa, Anpachi-Gun; Seiichiro Takahashi, Gifu; Nobuo Itoh, Nagoya, all of Japan

[73] Assignee: Sanyo Electric Co., Ltd., Osaka, Japan

[21] Appl. No.: 08/691,649

[22] Filed: Aug. 2, 1996

[30] Foreign Application Priority Data

| | | | |
|---|---|---|---|
| Aug. 4, 1995 | [JP] | Japan | 7-199978 |
| Aug. 24, 1995 | [JP] | Japan | 7-240664 |
| Sep. 14, 1995 | [JP] | Japan | 7-262141 |
| Mar. 15, 1996 | [JP] | Japan | 8-087335 |

[51] Int. Cl.[7] .......... H03M 13/00

[52] U.S. Cl. .......... 714/752; 714/755; 714/753; 714/762; 370/203; 370/330; 370/329; 370/335; 704/229; 704/205; 386/46; 386/81

[58] Field of Search .......... 371/37.11, 37.4, 371/39.1, 37.2; 704/229, 205; 386/46, 81; 370/203, 330, 319, 310, 329, 335

[56] References Cited

U.S. PATENT DOCUMENTS

| | | | |
|---|---|---|---|
| 4,499,454 | 2/1985 | Shimada | 340/347 |
| 4,541,093 | 9/1985 | Furuya et al. | 371/40 |
| 5,508,701 | 4/1996 | Nose et al. | 341/58 |

FOREIGN PATENT DOCUMENTS

| | | |
|---|---|---|
| 52-128024 | 10/1977 | Japan . |
| 1-27510 | 5/1989 | Japan . |
| 4-77991 | 12/1992 | Japan . |
| 5-34747 | 5/1993 | Japan . |
| 6-311042 | 11/1994 | Japan . |

*Primary Examiner*—William Grant
*Assistant Examiner*—McDieunel Marc
*Attorney, Agent, or Firm*—Armstrong, Westerman, Hattori, McLeland & Naughton

[57] ABSTRACT

A digital modulation circuit which minimizes a DC component of an NRZI modulated code sequence while setting the $T_{max}$ and $T_W$ not to be varied. An m-n coding mode is determined for each data block composed of the predetermined number of m-bit datawords. That is, an m-n coding mode which minimizes the absolute value of the DSV is selected and the selected m-n coding mode is utilized for the m-n coding of the current data block. The code indicating the selected m-n coding mode is multiplexed to the m-n coded current block. An m—m mapping table is also determined for each data block. That is, such an m—m mapping table that minimizes the absolute value of the DSV is selected and the selected m—m mapping table is utilized for the m—m translation of the current data block. Then, the m—m mapped data block is m-n translated into a code block composed of the same number of n-bit codewords by utilizing the single m-n translation table.

42 Claims, 34 Drawing Sheets

1 BLOCK MEMORY
RLL ENCODER
NRZI MODULATOR
SYNC. CODE GENERATOR
ENCODING MODE CODE GENERATOR
TABLE NUMBER GENERATOR
CDS & POLARITY ROM
EXCLUSIVE OR
ADDER / SUBTRACTOR
DSV 24 STEP SHIFT REGISTER
POLARITY 24 STEP SHIFT REGISTER
REGISTER
|DSV| COMPARATOR
DSV CALCULATOR
(0~23)
(CDS)
(0/1)
(+/-)
(DSV)

1 BLOCK MEMORY
RLL ENCODER
NRZI MODULATOR
TABLE NUMBER GENERATOR
ENCODING MODE CODE GENERATOR
SYNC. CODE GENERATOR
CDS & POLARITY ROM
(0~23)
(CDS)
(0/1)
EXCLUSIVE OR
ADDER / SUBTRACTOR
POLARITY 24 STEP SHIFT REGISTER
DSV 24 STEP SHIFT REGISTER
DSV CALCULATOR
set
(DSV)
|DSV| COMPARATOR
MAX |DSV| 24 STEP SHIFT REGISTER
DELAY MEMORY
DELAY MEMORY
REGISTER
REGISTER
|DSV| COMPARATOR 1 BLOCK MEMORY
RLL ENCODER
NRZI MODULATOR
SYNC. CODE GENERATOR
ENCODING MODE CODE GENERATOR
ENCODING MODE ERROR CORRECTING CODE GENERATOR
TABLE NUMBER GENERATOR
CDS & POLARITY ROM
EXCLUSIVE OR
ADDER / SUBTRACTOR
DSV 24 STEP SHIFT REGISTER
POLARITY 24 STEP SHIFT REGISTER
DSV CALCULATOR
|DSV| COMPARATOR
REGISTER
REGISTER
(0~23)
(CDS)
(0/1)
(+/-)
(DSV)
(0/1)
1
2
3
4
5
6
8
9
10
11
12
13
14
15
16a
17a
18a
18b
27

Fig.6

| NUMBER | ENCODING MODE CODE | | CDS | | POLARITY | |
|---|---|---|---|---|---|---|
| | INFORMATION BITS 1 2 3 4 5 6 7 | PARITY BITS 1 2 3 4 5 6 7 8 | 0 | 1 | 0 | 1 |
| 0 | 0 0 0 1 0 1 0 | 0 * 0 0 0 0 1 0 | −7 | −1 | 1 | 0 |
| 1 | 0 0 0 0 0 0 1 | 0 * 0 0 1 0 1 0 | −1 | −7 | 1 | 0 |
| 2 | 1 0 1 0 0 0 1 | 0 0 0 * 0 0 1 0 | +3 | +1 | 0 | 1 |
| 3 | 1 0 0 0 0 1 0 | 1 0 0 * 0 0 1 0 | +7 | +5 | 0 | 1 |
| 4 | 0 1 0 1 0 0 0 | 1 0 1 0 0 * 0 0 | −7 | −1 | 0 | 1 |
| 5 | 1 0 1 0 0 1 0 | 0 0 1 0 0 * 0 0 | −3 | +3 | 0 | 1 |
| 6 | 0 0 0 1 0 0 1 | 0 0 1 0 0 * 0 0 | +3 | −3 | 1 | 0 |
| 7 | 0 0 1 0 1 0 0 | 1 0 0 0 0 * 0 0 | +5 | −1 | 1 | 0 |
| 8 | 1 0 1 0 1 0 1 | 0 0 1 0 0 * 0 0 | +5 | −1 | 1 | 0 |
| 9 | 1 0 0 1 0 0 0 | 1 0 0 0 0 * 0 0 | +7 | +1 | 1 | 0 |
| 10 | 0 0 0 0 1 0 1 | 0 0 1 0 1 0 0 * | −7 | −5 | 0 | 1 |
| 11 | 1 0 0 1 0 1 0 | 1 0 1 0 1 0 0 * | −1 | +1 | 0 | 1 |
| 12 | 1 0 0 0 1 0 0 | 1 0 0 0 1 0 0 * | +1 | +3 | 0 | 1 |
| 13 | 0 0 0 0 0 1 0 | 0 0 1 0 1 0 0 * | +1 | −1 | 1 | 0 |
| 14 | 0 1 0 1 0 1 0 | 1 0 0 0 1 0 0 * | +1 | −1 | 1 | 0 |
| 15 | 0 1 0 0 1 0 0 | 1 0 1 0 1 0 0 * | +3 | +1 | 1 | 0 |
| 16 | 0 0 0 1 0 0 0 | 0 0 1 0 1 0 1 0 | +1 | | 0 | |
| 17 | 0 1 0 0 0 0 0 | 1 0 0 0 1 0 1 0 | +1 | | 0 | |
| 18 | 0 0 1 0 0 0 0 | 1 0 1 0 0 0 1 0 | +3 | | 0 | |
| 19 | 1 0 1 0 1 0 0 | 0 0 1 0 1 0 1 0 | +3 | | 0 | |
| 20 | 0 0 0 0 1 0 0 | 0 0 1 0 0 0 1 0 | −1 | | 1 | |
| 21 | 0 1 0 0 0 1 0 | 1 0 1 0 0 0 1 0 | +1 | | 1 | |
| 22 | 0 0 1 0 0 1 0 | 1 0 0 0 1 0 1 0 | +3 | | 1 | |
| 23 | 1 0 0 0 0 0 0 | 1 0 1 0 1 0 1 0 | +7 | | 1 | |

Fig.8

| NUMBER | ENCODING MODE CODE | | CDS | POLARITY |
|---|---|---|---|---|
| | INFORMATION BITS | PARITY BITS | | |
| 0 | 0 0 0 0 0 1 0 0 0 0 0 | 1 0 0 1 | −1 | 1 |
| 1 | 0 0 0 0 1 0 0 0 0 1 0 | 0 1 0 0 | +1 | 1 |
| 2 | 0 0 0 1 0 0 0 0 0 1 0 | 0 0 0 1 | −1 | 1 |
| 3 | 0 0 0 1 0 0 0 0 1 0 0 | 1 0 0 0 | +3 | 1 |
| 4 | 0 0 0 1 0 0 0 1 0 0 0 | 1 0 0 1 | −1 | 0 |
| 5 | 0 0 0 1 0 0 1 0 0 0 1 | 0 0 0 1 | −1 | 0 |
| 6 | 0 0 1 0 0 0 0 0 1 0 0 | 0 0 1 0 | +1 | 1 |
| 7 | 0 0 1 0 0 0 1 0 0 0 0 | 0 0 0 1 | −5 | 1 |
| 8 | 0 0 1 0 0 1 0 0 0 1 0 | 0 0 1 0 | −1 | 0 |
| 9 | 0 1 0 0 0 0 0 0 0 0 1 | 0 0 0 1 | +5 | 1 |
| 10 | 0 1 0 0 0 0 0 1 0 0 0 | 0 1 0 0 | +3 | 1 |
| 11 | 0 1 0 0 0 0 1 0 0 1 0 | 0 0 0 1 | +5 | 0 |
| 12 | 0 1 0 0 0 1 0 0 0 0 0 | 0 0 1 0 | −3 | 1 |
| 13 | 0 1 0 0 1 0 0 0 0 0 0 | 1 0 0 0 | −1 | 1 |
| 14 | 0 1 0 0 1 0 0 0 0 0 1 | 0 0 1 0 | −3 | 0 |
| 15 | 1 0 0 0 0 0 0 0 0 1 0 | 0 0 1 0 | +7 | 1 |
| 16 | 1 0 0 0 0 0 0 1 0 0 1 | 0 0 0 0 | +9 | 1 |
| 17 | 1 0 0 0 0 0 1 0 0 0 0 | 1 0 0 0 | +5 | 1 |
| 18 | 1 0 0 0 0 0 1 0 0 0 1 | 0 0 1 0 | +3 | 0 |
| 19 | 1 0 0 0 0 1 0 0 1 0 0 | 0 0 1 0 | +5 | 0 |
| 20 | 1 0 0 0 1 0 0 0 0 1 0 | 0 0 0 1 | +3 | 0 |
| 21 | 1 0 0 0 1 0 0 0 1 0 0 | 1 0 0 0 | −1 | 0 |
| 22 | 1 0 0 0 1 0 0 1 0 0 0 | 1 0 0 1 | +3 | 1 |
| 23 | 1 0 0 1 0 0 0 0 0 1 0 | 0 1 0 0 | −3 | 0 |

$$G=\begin{pmatrix}1&0&0&0&0&0&0&1&1&1&1\\0&1&0&0&0&0&0&1&0&1&1\\0&0&1&0&0&0&0&1&1&0&1\\0&0&0&1&0&0&0&0&1&1&1\\0&0&0&0&1&0&0&0&1&0&1\\0&0&0&0&0&1&0&0&1&1&0\\0&0&0&0&0&0&1&0&0&1&1\end{pmatrix}$$

$$H=\begin{pmatrix}1&1&1&0&0&0&0&1&0&0&0\\1&0&1&1&1&1&0&0&1&0&0\\1&1&0&1&0&1&1&0&0&1&0\\1&1&1&1&1&0&1&0&0&0&1\end{pmatrix}$$

(b)

$$G=\begin{pmatrix}1&0&0&0&0&0&0&0&0&0&0&0&1&0&1\\0&1&0&0&0&0&0&0&0&0&0&1&0&1&1\\0&0&1&0&0&0&0&0&0&0&0&1&1&0&0\\0&0&0&1&0&0&0&0&0&0&0&0&1&1&0\\0&0&0&0&1&0&0&0&0&0&0&0&0&1&1\\0&0&0&0&0&1&0&0&0&0&0&1&0&0&1\\0&0&0&0&0&0&1&0&0&0&0&1&1&0&1\\0&0&0&0&0&0&0&1&0&0&0&1&1&1&1\\0&0&0&0&0&0&0&0&1&0&0&1&1&1&0\\0&0&0&0&0&0&0&0&0&1&0&0&1&1&1\\0&0&0&0&0&0&0&0&0&0&1&1&0&1&0\end{pmatrix}$$

$$H=\begin{pmatrix}0&1&1&0&0&1&1&1&1&0&1&1&0&0&0\\1&0&1&1&0&0&1&1&1&1&0&0&1&0&0\\0&1&0&1&1&0&0&1&1&1&1&0&0&1&0\\1&1&0&0&1&1&1&1&0&1&0&0&0&0&1\end{pmatrix}$$

S/P
m-n ENCODER 1
m-n ENCODER 2
m-n ENCODER j
DSV CALCULATOR 1
DSV CALCULATOR 2
DSV CALCULATOR j
MINIMUM |DSV| SELECTOR
MEMORY
SELECTOR
P/S
ENCODING MODE CODE MULTIPLEXER
ERROR CORRECTING CODE FOR ENCODING MODE CODE MULTIPLEXER
NRZI MODULATOR
28
29
30
30a
30b
31
31a
31b
32
33
34
35
36
37
38
39
m
n

Fig.12
(a)
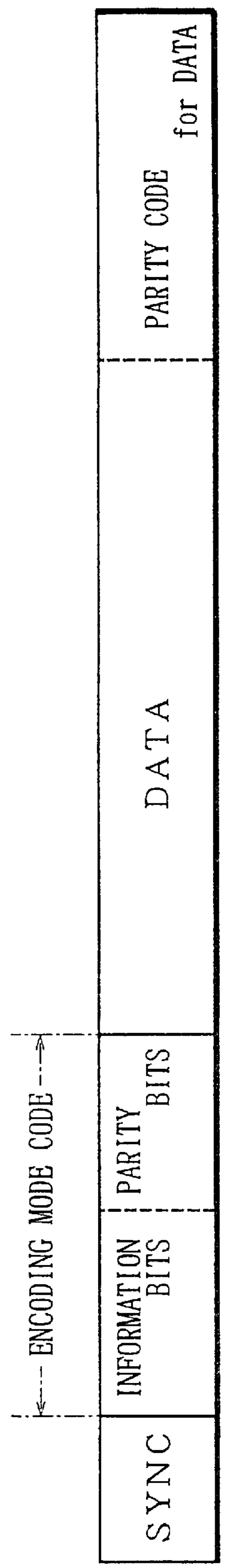
(b)
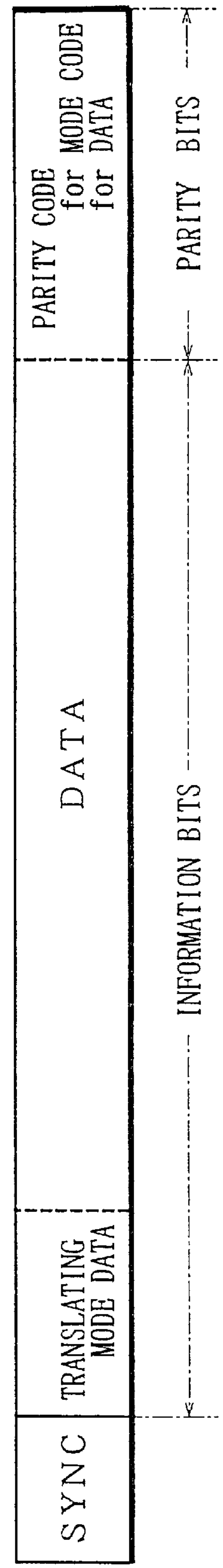

50
51a
j Different Types of DATA TRANSLATOR
52a
j Different Types of TRANSLATING MODE DATA MULTIPLEXER
53a
ERROR CORRECTING CODE ENCODER × j
54a
1 BLOCK MEMORY × j
55
j Different Types of |DSV| CALCULATOR |DSV| COMPARATOR
56
SELECTOR
57
RLL ENCODER
58
NRZI MODULATOR
59

Fig.16

| ELEMENT DEFINED OVER GALOIS FIELD GF $(2^3)$ (mod $X^3+X+1$) | | |
|---|---|---|
| POWER REPRESENTATION | 3-TUPLE REPRESENTATION | POLYNOMIAL REPRESENTATION |
| 0 | 0 0 0 | 0 |
| 1 $(=\alpha^0)$ | 0 0 1 | 1 |
| $\alpha$ | 0 1 0 | $X$ |
| $\alpha^2$ | 1 0 0 | $X^2$ |
| $\alpha^3$ | 0 1 1 | $X+1$ |
| $\alpha^4$ | 1 1 0 | $X^2+X$ |
| $\alpha^5$ | 1 1 1 | $X^2+X+1$ |
| $\alpha^6$ | 1 0 1 | $X^2+1$ |

FORMAT OF REED-SOLOMON CODES
REED-SOLOMON CODES
W (X)
$W_{n-1}$
$W_{n-2}$
$W_1$
$W_0$
n BYTES
1 BYTE
=m BITs (REPRESENTATION ELEMENTS OF DEFINED OVER GALOIS FIELD GF ($2^m$))
POLYNOMIAL REPRESENTATION:
$W(X) = W_{n-1} X^{n-1} + W_{n-2} X^{n-2} + \cdots + W_1 X + W_0$
OTHER CODES
W (X)
$W_{n-1}$
$W_{n-2}$
$W_1$
$W_0$
n BITS
1 BIT
=0 or 1
POLYNOMIAL REPRESENTATION:
$W(X) = W_{n-1} X^{n-1} + W_{n-2} X^{n-2} + \cdots + W_1 X + W_0$ CONVENTIONAL RS-CODE POLYNOMIALW (X), ERROR POLYNOMIAL E (X), RECEIVER POLYNOMIALR (X)

Fig.20

COMPARISON BETWEEN RS-CODES AND GALOIS-FIELD-MULTIPLIED RS-CODES

| | | |
|---|---|---|
| CONVENTIONAL RS-CODES | CODE POLYNOMIAL | $W(x)=I(x)x^{2t}+P(x)$ |
| | RECEIVER POLYNOMIAL | $R(x)=I(x)x^{2t}+P(x)+E(x)$ |
| | SYNDROME POLYNOMIAL | $S(x)=\{I(x)x^{2t}+P(x)+E(x)\}\bmod G(x)$<br>$=\{I(x)x^{2t}+P(x)\}\bmod G(x)+E(x)\bmod G(x)$<br>$=E(x)\bmod G(x)$ |
| GALOIS-FIELD -MULTIPLIED RS-CODES | CODE POLYNOMIAL | $W'(x)=\alpha^{i}\{I(x)x^{2t}+P(x)\}$ ········ $(i=0,\ldots,2^{n-2})$ |
| | RECEIVER POLYNOMIAL | $R'(x)=\alpha^{i}\{I(x)x^{2t}+P(x)\}+E(x)$ |
| | SYNDROME POLYNOMIAL | $S'(x)=[\alpha^{i}\{I(x)x^{2t}+P(x)\}+E(x)]\bmod G(x)$<br>$=\alpha^{i}\{I(x)x^{2t}+P(x)\}\bmod G(x)+E(x)\bmod G(x)$<br>$=E(x)\bmod G(x)$ |

Fig.22
(a)
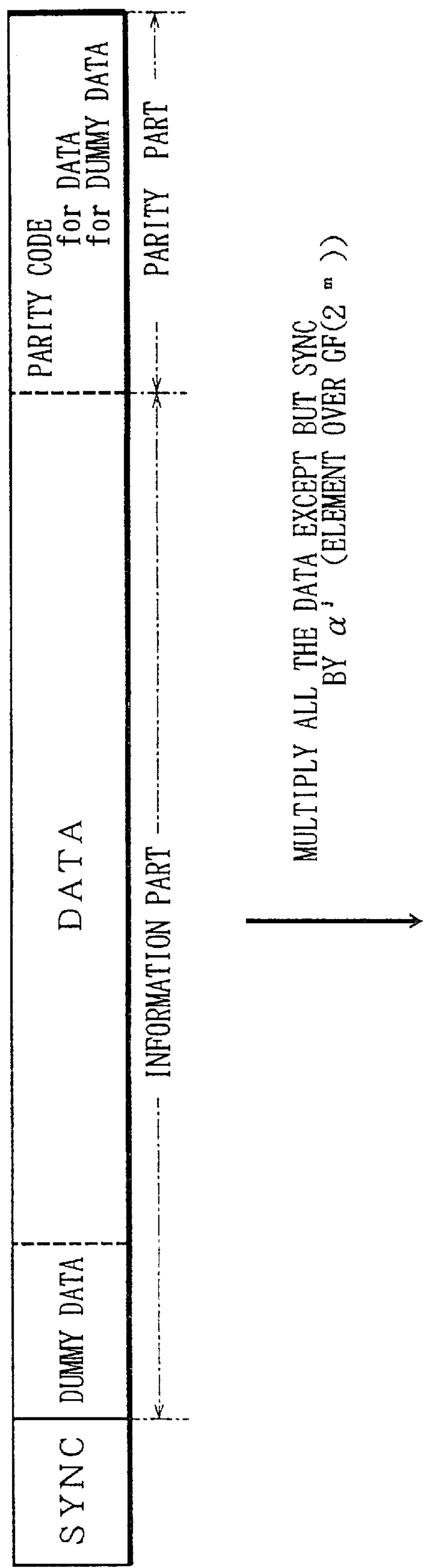
(b)
INFORMATION OF
$\alpha^j$ (ELEMENT OVER GF($2^m$))
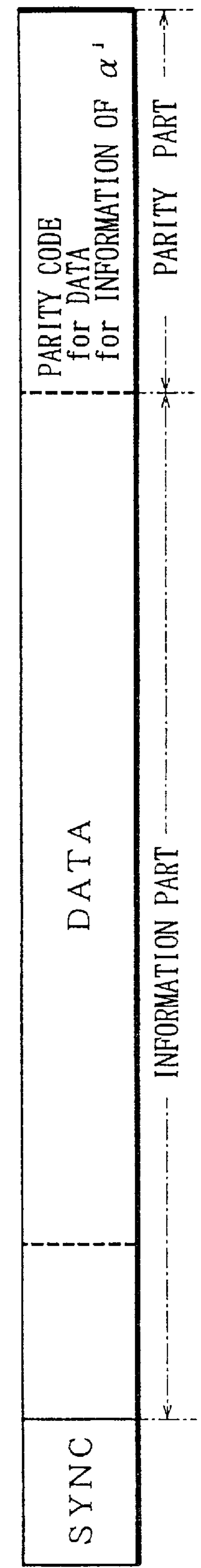

70
71
GALOIS FIELD DUMMY DATA MULTIPLEXER
72
RS ENCODER
73a
j Different Types of GALOIS FIELD MULTIPLEXER
74a
1 BLOCK MEMORY × j
75
j Different Types of |DSV| CALCULATOR |DSV| COMPARATOR
76
SELECTOR
77
RLL ENCODER
78
NRZI MODULATOR
79

70
GALOIS FIELD DUMMY DATA MULTIPLEXER
71
RS ENCODER
72
1 BLOCK MEMORY
74b
GALOIS FIELD MULTIPLEXER
73b
j Different Types of GALOIS FIELD MULTIPLEXER
73a
j Different Types of |DSV| CALCULATOR |DSV| COMPARATOR
75
RLL ENCODER
77
NRZI MODULATOR
78
79

(a) TRANSLATION
BEFORE TRANSLATION
AFTER TRANSLATION
INITIAL DATA TRANSLATING MODE
T I
D0 D1 D2 D3 D4 D5 Dn-2 Dn-1
D'0 D'1 D'2 D'3 D'4 D'5 D'n-2 D'n-1
D'i = Di ⊕ Ti (i = 0)
D'i = Di ⊕ D'i-1 (i = 1, ... n-1)
(b) INVERSE TRANSLATION
BEFORE INVERSE TRANSLATION
AFTER INVERSE TRANSLATION
Di = D'i ⊕ Ti (i = 0)
Di = D'i ⊕ D'i-1 (i = 1, ... n-1)

Fig.27

TRANSLATION TABLE

| $T_i$ or $D_{i-1}$ | $D_i$ | $D'_i$ |
|---|---|---|
| 00 | 00 | 00 |
| | 01 | 01 |
| | 11 | 11 |
| | 10 | 10 |
| 01 | 00 | 01 |
| | 01 | 11 |
| | 11 | 10 |
| | 10 | 00 |
| 11 | 00 | 11 |
| | 01 | 10 |
| | 11 | 00 |
| | 10 | 01 |
| 10 | 00 | 10 |
| | 01 | 00 |
| | 11 | 01 |
| | 10 | 11 |

90
91a
j Different Types of INITIAL DATA MULTIPLEXER
92a
DATA TRANSLATOR × j
93a
1 BLOCK MEMORY × j
94
j Different Types of |DSV| CALCULATOR |DSV| COMPARATOR
95
SELECTOR
96
RLL ENCODER
97
NRZI MODULATOR
98

90
93b
1 BLOCK MEMORY
91b
INITIAL DATA MULTIPLEXER
92b
DATA TRANSLATOR
96
R L L ENCODER
97
N R Z I MODULATOR
98
91a
j Different Types of INITIAL DATA MULTIPLEXER
92a
DATA TRANSLATOR × j
94
j Different Types of |D S V| CALCULATOR |D S V| COMPARATOR 70
GALOIS FIELD DUMMY DATA MULTIPLEXER
71
R S ENCODER
72
1 BLOCK MEMORY
74b
GALOIS FIELD MULTIPLEXER
73b
j Different Types of GALOIS FIELD MULTIPLEXER
73a
j Different Types of |DSV| CALCULATOR |DSV| COMPARATOR
75
TRANSLATING MODE CODE MEMORY
88
R S ENCODER
72a
SELECTOR
89
R L L ENCODER
77
N R Z I MODULATOR
78
79

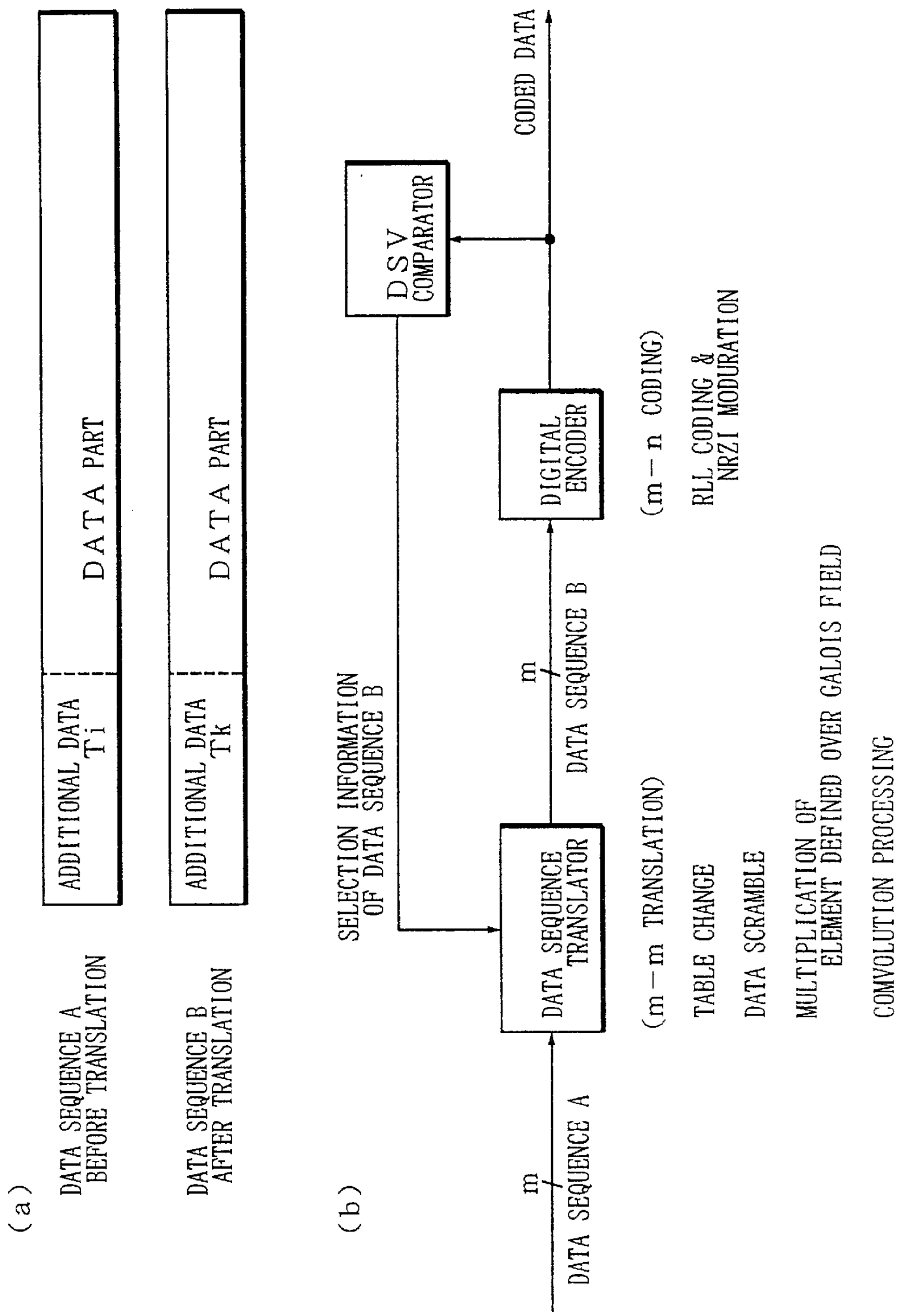
Fig.34
(a)
DATA SEQUENCE A
BEFORE TRANSLATION
ADDITIONAL DATA
Ti
DATA PART
DATA SEQUENCE B
AFTER TRANSLATION
ADDITIONAL DATA
Tk
DATA PART
(b)
m
DATA SEQUENCE A
DATA SEQUENCE
TRANSLATOR
SELECTION INFORMATION
OF DATA SEQUENCE B
m
DATA SEQUENCE B
DIGITAL
ENCODER
DSV
COMPARATOR
CODED DATA
(m－m TRANSLATION)
TABLE CHANGE
DATA SCRAMBLE
MULTIPLICATION OF
ELEMENT DEFINED OVER GALOIS FIELD
COMVOLUTION PROCESSING
(m－n CODING)
RLL CODING &
NRZI MODURATION

DIGITAL MODULATION CIRCUIT AND DIGITAL DEMODULATION CIRCUIT

BACKGROUND OF THE INVENTION

1. Field of the Invention

The present invention relates to a modulation circuit which translates each m-data-bits (=m-bit dataword) cut out of a binary data stream one after another into a n-code-bits (=n-bit codeword) respectively, then converts the translated RLL code data sequence into an NRZI (Non Return to Zero Inverted) code data sequence, and then outputs the NRZI code data sequence to an outer circuit. Also, the present invention relates to a demodulation circuit which demodulates an NRZI code data sequence into an RLL code data sequence, then decodes each n-code-bits cut out of the RLL code data sequence one after another into a m-data-bits respectively, and then outputs the decoded binary data sequence to an outer circuit.

2. Description of the Related Art

An input binary data stream is mapped to an RLL code data sequence, then modulated to an NRZI waveform, and then recorded onto a recording medium, and thereby the recording density can be increased.

In the RLL coding, m-bit datawords are cut out of the binary data stream one after another, and each m-bit dataword is mapped to an n-bit codeword. In this mapping or translating, a constraint is imposed to set the minimum value $T_{min}$ of the polarity inversion interval (=transition interval) of the NRZI code data sequence at a larger value and to set the maximum value $T_{max}$ thereof at a smaller value. Specifically, with respect to the RLL code data sequence, a constraint is imposed such that the number of bits 0's existing between the bit 1 and the adjacent bit 1 should be limited to be d or more and k or less. In other words, a constraint is imposed such that two logical 1's should be separated by a run of at least d consecutive zeros and any run of consecutive zeros has a length of at most k. The RLL code data sequence mapped to satisfy this constraint is called (d,k;m,n) RLL code.

In the NRZI modulation, an operation is performed such that the RLL czde data sequence is inverted only at the bit 1 and not inverted at the bit 0. In other words, the RLL code data sequence is converted into an NRZI waveform using a transition for a 1 and no transition for a 0. By such modulation or conversion, the minimum distance between transitions of the NRZI code data sequence becomes larger than that of the corresponding RLL code data sequence. Therefore, compared with a case where the RLL code signal before NRZI modulation is recorded onto a recording medium and read the same therefrom, the waveform distortion of the reading signal is reduced in a case where the NRZI-modulated code signal is recorded onto a recording medium and reading therefrom. As a result, the error rate of the reading signal can be lowered. If the same level of waveform distortion is acceptable in both the cases described above, the recording density can be heightened better in the case where the NRZI-modulated code signal is recorded onto a recording medium than in the case where the RLL code signal before NRZI modulation is recorded onto a recording medium.

In both the RLL coding and the NRZI modulation, the following conditions must be met:

(1) The minimum transition distance $T_{min}$

When the recording density becomes greater, the minimum transition interval $T_{min}$ of the recording signal becomes smaller. Therefore, the reading pulses may be distorted due to the interference of the adjacent pulses, and as a result, reading errors may arise. To reduce the distortion of the reading pulses from a high density recording medium and thereby reduce the reading errors, the minimum transition period of time $T_{min}$ should preferably be large.

(2) The maximum transition distance $T_{max}$

The reading pulse from a recording medium can not be obtained during the time period of no transition. Within that time period, the clock based on the reading pulse can not be generated, and therefore the clock may be inaccurate. On the other hand, when the transition interval of the recording signal is large, the DC component of the recording signal may become large. Therefore, the maximum transition period of time $T_{max}$ should preferably be small.

(3) DC component and low frequency component

Both the recording device and the reproducing device have AC coupling elements. The recording signal having the DC component or low frequency component is undesirably distorted through the AC coupling elements of the recording device, and this distorted signal is recorded onto a recording medium. As a result, the reading signal from the recording medium, which is recorded with the distorted signal, has inevitable distortion. Therefore, the DC component and low frequency component should preferably be small. The DC component or low frequency component of the recording signal is evaluated by using the DSV (digital sum value). The DSV is the sum of bit values from the specified start bit of the binary data sequence with the bit "1" taken as "+1" and the bit "0" as "−1." When the absolute value of DSV is small, the DC component or low frequency component of the binary data sequence is small. On the other hand, the DC component or low frequency component of each codeword is evaluated by using the CDS (codeword digital sum). The CDS is the sum of bit values from the start bit of the codeword to the end bit thereof with the bit "1" taken as "+1" and the bit "0" as "−1." When the absolute value of CDS is small, the DC component or low frequency component of the codeword is small.

(4) Window margin $T_w$

The window margin $T_w$ indicates the allowable range of the phase shift of the reading signal due to interference thereof, noise, etc. The window margin $T_w$ is given by (m/n)T. Here, T refers to the length of I-bit data before RLL-coding. The window margin $T_w$ should preferably be large.

(5) Constraint length $L_c$

To optimize the $T_{min}$, the $T_{max}$ and the DSV, coding may be performed by referring to the codewords before or after thereof. The length of the codewords before thereof, datawords before or after to be referred to then is called "constraint length $L_c$." The larger the $L_c$ is, the more extensive the error propagation is, and therefore, the $L_c$ should preferably be small.

In the Japanese Unexamined Patent Publication No. 52-128024, a technique to set the $T_{min}$ of the NRZI-modulated signal larger and to set the $T_{max}$ of the NRZI-modulated signal smaller is disclosed. According to the technique of the 52-128024, each 2-bit dataword serial/parallel converted from an input binary data stream is translated to a corresponding 3-bit codeword to generate a (1,7;2,3) RLL code. Then, the translated RLL code sequence is modulated to an NRZI code sequence. In such cases that the constraint d=1 is impossible to be satisfied in the above translation, a (1,7;4,6) RLL code is generated.

In the Japanese Examined Patent Publication No. 1-27510, a technique to reduce the DC component of the NRZI-modulated signal and to set the $T_{min}$ of the NRZI-modulated signal not smaller is disclosed. According to the technique disclosed in the No. 1-27510, the redundant data of a predetermined number of bits is inserted into between the adjacent n-bit codewords cut out of an Rll code data sequence one after another. Then, this inserted code sequence is modulated to an NRZI code sequence. Here, each redundant data is determined based on the necessity of the transition between the codewords and the state of the tail bit of the immediately preceding codeword. That is, the determination is made in such a way that the DC component of the NRZI-modulated signal can be reduced and the transition distance of the NRZI-modulated signal can not be set less than $T_{min}$.

In Japanese Examined Patent Publication No. 5-34747, a translating or a coding method to set the $T_{min}$ at 1.5T, set the $T_{max}$ at 4.5T and set the $L_c$ at 5T is disclosed. According to the technique disclosed in the No. 5-34747, the regulation of the coding is determined based on the arrangement of the input binary data sequence.

In the Japanese Examined Patent Publication No. 4-77991, a technique to reduce the DC component of the NRZI-modulated signal and to set the $T_{min}$ of the NRZI-modulated signal larger is disclosed. According to the technique disclosed in the No. 4-77991, each 8-bit dataword serial/parallel converted from an input binary data stream is translated to a corresponding 14-bit codeword to generate a (1,8;8,14) RLL code. That is, the conversion is performed in such a way that the number of bits 0's existing between the bit 1 and the adjacent bit 1 of the coded data sequence can be 1 or more and 8 or less. The table for use in the coding of the 8-bit dataword to the 14-bit codeword is made ready for 2 different types, and depending on the DSV of the tail bit of the codeword coded immediately before, the codeword in either of the tables is selected. That is, the selection of the table is made in such a way that the DC component of the NRZI modulated recording signal can be reduced.

In the Japanese Unexamined Patent Publication No. 6-311042, a technique for heightening the recording density ratio DR (density ratio) by sufficiently reducing the DC component of the NRZI modulated recording signal and setting the $T_{min}$ of the NRZI modulated recording signal large is disclosed. According to this technique disclosed in the No. 6-311042, 8-bit datawords are cut out of the input binary data stream one after another and translated to respective 17-bit codewords. The translation or mapping is performed in such a way that the number of bits 0's existing between the bit 1 and the adjacent bit 1 can be 2 or more and 9 or less. The above-mentioned 17-bit codeword is generated by adding the redundant data of 2-bit to the 15-bit code corresponding to the original 8-bit dataword. According to the technique disclosed in the No. 6-311042, the table for use in the mapping of the 8-bit dataword to the 15-bit code is made ready for 2 different types, and the redundant data of 2-bit is made ready for 3 different types. The above-described 8-bit dataword is translated to the 17-bit codeword selected based on the DSV at the tail bit of the data coded immediately before from among six different types of codewords obtained by combining the 2 different types of tables and the 3 different types of redundant data. That is, by the 17-bit codeword selected in such a way that the DC component of the NRZI modulated code data can be reduced, the above-described 8-bit dataword is replaced.

SUMMARY OF THE INVENTION

In each of the techniques disclosed in the above described publications, a technique is used such that redundant data is added or the optimum translation table is selected from among a plurality of translation tables or the like according to the input dataword to reduce the DC component or low-frequency components of the NRZI modulated recording signal. As a result, however, there is a problem that the constraint related to the "d" or "k" would be eased and the $T_{min}$ would be set a smaller value or the $T_{max}$ would be set a larger value. Furthermore, there is a problem that as the number of bits of the codeword is increased, the $T_w$ would be set a small value.

In view of these problems, it is an object of the present invention to minimize the DC component or low-frequency components of the NRZI modulated code sequence while setting the $T_{max}$ and $T_w$ not to be varied.

In order to achieve this object, according to the present invention, the m-n coding mode is determined for each data block composed of the predetermined number of m-bit datawords. That is, an m-n coding mode which minimizes the absolute value of the DSV, which is calculated within the current NRZI-modulated block, is selected and the selected m-n coding mode is utilized for the m-n coding of the current data block. The code data indicating the selected m-n coding mode is multiplexed to the m-n coded current block. Each m-n coding mode has the m-n translation table which maps the m-bit dataword to the n-bit codeword according to the bit-arrangement of the m—m-bit dataword Also, according to the present invention, the m—m mapping table is determined for each data block composed of the predetermined number of m-bit datawords. That is, such an m—m mapping table that minimizes the absolute value of the DSV, which is calculated within the current NRZI-modulated block, is selected and the selected m—m mapping table is utilized for the m—m translation of the current data block. Then, the m—m mapped data block is m-n translated by utilizing the single m-n translation table. Here, each m—m mapping table is a table which maps the m-bits input-dataword to the m-bits output-dataword according to the bit-arrangement of the m-bits input-dataword.

It is another object of the present invention to have a sufficient error correction power by using a simple error correction circuit.

In order to achieve this object, according to the present invention, for each current data block composed of the predetermined number of m-bit datawords, added with the dummy data of non-zero of the Galois field to the head, and generated the Reed Solomon (RS) code for each data block, the element of the Galois field selected in such a way that the absolute value of the DSV, which is calculated up to the NRZI-modulated current block, is the smallest is multiplied. Each data block thus multiplied by the element of the Galois field is m-n coded by utilizing the single m-n coding table. Also, according to the present invention, the RS code is generated from the predetermined number of the elements of the Galois field.

It is still another object of the present invention to minimize the propagation of the reading error.

In order to achieve this object, according to the present invention, the m-bit data is added to the head of each data block composed of the predetermined number of m-bit datawords, and the convolution processing is executed by using the added m-bits data. The additional m-bits data is determined to minimize the absolute value of the DSV which is calculated within the NRZI modulated current block.

BRIEF DESCRIPTION OF THE DRAWINGS

FIG. 6 is a code data table indicating with respect to the case d=1 the 15-bits coding mode number code for use in the fourth and fifth embodiments according to the present invention;

FIG. 8 is a code data table indicating with respect to the case d=2 the arrangement of the 15-bit coding mode number code for use in the fourth and fifth embodiments according to the present invention;

FIG. 9 shows the generation polynomial G and parity inspection matrix H of the error correcting code for use in the fourth, fifth and sixth embodiments according to the present invention, wherein (a) shows with respect to the case d=1 and (b) shows with respect to the case d=2;

FIG. 12 illustrates data formats according to the present invention, wherein the upper view (a) illustrates the data format for use in the first to sixth embodiments and the lower view (b) illustrates the data format for use in the seventh to ninth embodiments;

FIG. 16 is a table showing an example of the Galois field $GF(2^3)$;

FIG. 20 is a chart showing the conventional RS code and the element of the Galois Field multiplied RS code;

FIG. 22 illustrates block formats according to the present invention, wherein the upper view (a) illustrates the block format before the multiplication of the element of the Galois field and the lower view (b) illustrates the block format for use in the tenth and eleventh embodiments;

FIG. 27 is an example of a table for use in data translation according to the table data based on the principle of FIG. 26;

FIG. 34 (a) is an example of a block format of the present invention and (b) is an example of a block diagram of a digital modulation circuit of the present invention.

DETAILED DESCRIPTION OF THE PREFERRED EMBODIMENT

1. Digital Sum Value (DSV)

In the first place, a description will be given to an embodiment which minimizes the digital sum value (DSV) of a recording signal by selecting the optimum m-n coding mode for each block. The recording signal is obtained by coding every m—m-bit dataword cut out of an input binary data stream one after another to n-bit codeword and then converting the coded sequence to an NRZI waveform. Here, the block refers to a unit composed of the predetermined number of m-bit datawords, and the dataword referred to in the above does not contain any coding mode number data.

Figure 4:
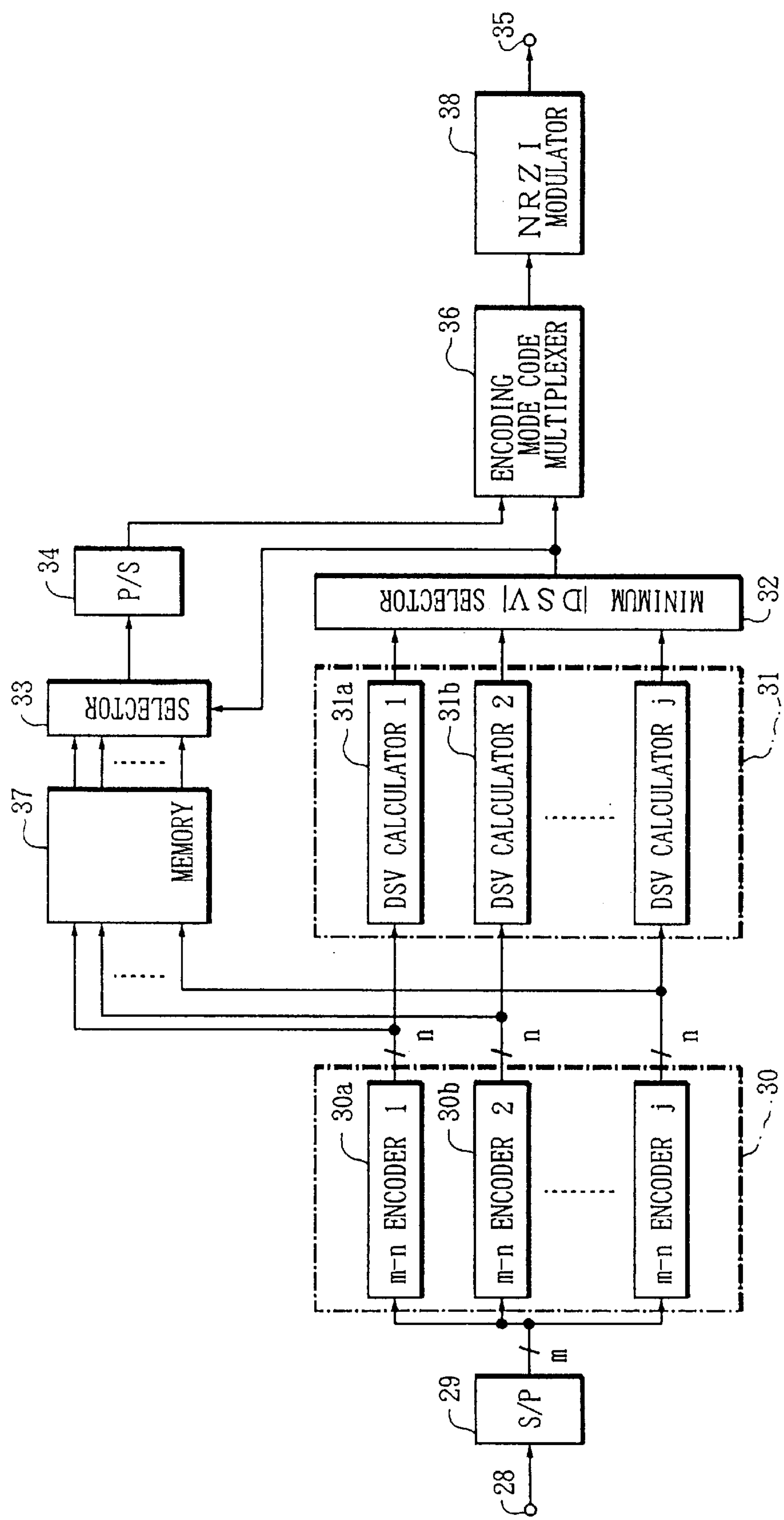
FIG. 4 is a block diagram showing the principle of the modulation according to the present invention.

1-1 Principle of Modulation (FIG. 4)

Referring to FIG. 4, the principle of a modulation technique according to the present invention will be described.

According to the present invention, m-bit datawords cut out of an input binary data stream one after another are coded into n-bit codewords, respectively. In other words, the input binary data stream is translated to (d,k;m,n) RLL codes. This coded data stream is NRZI-modulated. As an m-n coding mode for coding m-bit datawords into n-bit codewords, several different types of m-n coding modes are available. Among them an m-n coding mode which minimizes the DC component of the corresponding NRZI recording signal is selected for each block. By the selected m-n coding mode, each data block (=a block composed of a predetermined number of datawords) is translated to a code block (=a block composed of the same number of codewords), while the data indicating the selected m-n coding mode number is multiplexed to the code block. The code block after the multiplexing of the coding mode number data is modulated to an NRZI waveform.

In FIG. 4, an input binary data stream supplied to an input terminal 28 is input to a serial/parallel converter 29, and m-bit of parallel data (=dataword) is output therefrom. This m-bit dataword is translated to an n-bit codeword by an m-n encoder 30. The m-n encoder 30 is comprised of j different types of m-n encoders 30*a*, 30*b* . . . 30*j* with respective coding modes. The dataword is coded to the corresponding codewords by the respective m-n encoders 30*a*, 30*b* . . . 30*j*. At the same time, therefore, j different types of codewords are output from the m-n encoder 30 to both a DSV calculator 31 and a memory 37.

The DSV calculator 31 is comprised of j different types of DSV calculators 31*a*, 31*b* . . . 31*j*. The DSV calculators 31*a*, 31*b* . . . 31*j* operate the absolute values of DSVs (=|DSV|s) of corresponding NRZI signals based on the n-bit codewords output from the corresponding m-n encoders 30*a*, 30*b* . . . 30*j*. The results of these operations are sent to a minimum |DSV| selector 32. Here, the operation by the DSV calculator 31 is performed for each code block.

The minimum |DSV| selector 32 compares the |DSV| data outputted from the DSV calculators 31*a*, 31*b* . . . 31*j* and extracts the smallest |DSV| data from thereamong. Then, the m-n coding mode corresponding to the extracted |DSV| data is selected, and the coding mode number data indicating the selected m-n coding mode is supplied to a selector 33 and an encoding mode code multiplexer 36.

When the coding mode number data arrives from the minimum |DSV| selector 32 to the selector 33, the selector 33 selects the code block corresponding to the received coding mode number data from among the j different types of code blocks read out of the memory 37 and sends the selected code block to a parallel/serial converter 34. The parallel/serial converter 34 converts the selected code block into serial data and supplies the binary code string to the encoding mode code multiplexer 36.

The encoding mode code multiplexer 36 multiplexes the coding mode number data received from the minimum |DSV| selector 32 and the code block string received from the parallel/serial converter 34, and sends the multiplexed binary code string to an NRZI modulator 38. The NRZI modulator 38 modulates the multiplexed code string. The NRZI-modulated code sequence is output from the NRZI modulator 38 to an output terminal 35.

As described above, according to the present invention, an m-n coding mole which minimizes the |DSV| of the NRZI recording signal is selected for each block. Furthermore, the coding mode number data indicating the selected m-n coding mode is multiplexed to the code block string m-n coded by using the selected m-n coding mode. Then the multiplexed code string is modulated to an NRZI code signal.

Incidentally, the memory 37 may be omitted. If the memory 37 is omitted, it should be so arranged that the each m—m-bit dataword within the data block is coded to the n-bit codeword by the m-n encoder corresponding to the m-n coding mode pre-selected in such a way that the |DSV| of the NRZI modulated recording signal within the same data block can be the smallest, and the coding mode number data indicating the m-n coding mode selected as described above is multiplexed to the code block string, and then the multiplexed code block string is NRZI-modulated.

Furthermore, instead of the j different types of m-n encoders 30*a*, 30*b* . . . 30*j*, a single m-n encoder may be used. If the single m-n encoder is used, it should be arranged so that j different types of m-bit datawords are generated from every m—m-bit dataword cut out of the input binary data stream one after another, and the j different types of m-bit datawords are input to the single m-n encoder to be coded to j different types of n—n-bit codeword, respectively.

On the other hand, by using the codeword digital sum (CDS) values and polarity information corresponding to each of the j different types of n-bit codewords, the DSV may be operated without using the m-n encoder.

Moreover, instead of the j different types of m-n encoders 30*a*, 30*b* . . . 30*j*, a single m-n encoder may be used. If such single m-n encoder is used, the equivalent effect may be achieved by means of the high-speed driving of the single m-n encoder at a speed j times faster than the ordinary speed.

Figure 1:
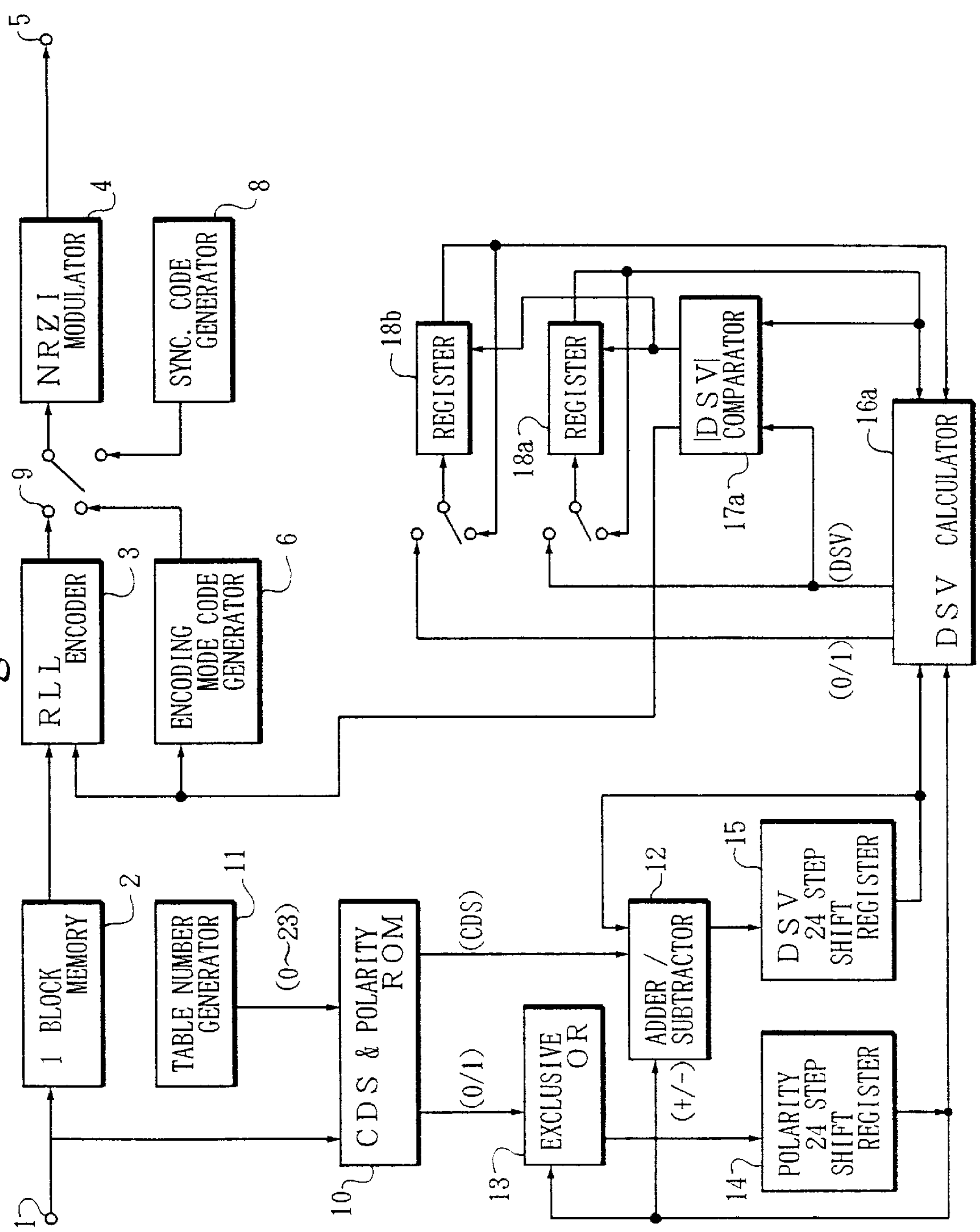
FIG. 1 is a block diagram of a digital modulation circuit of the first embodiment according to the present invention.

1-2 First Embodiment (Embodiment of Modulator: FIG. 1)

According to the first embodiment of the present invention, an m-n coding mode which minimizes the absolute value of DSV at the end of the NRZI modulated block is selected from among 24 different types of m-n coding modes for the same block. The respective m-bit datawords cut out of the input data block one after another are translated to the corresponding n-bit codewords, respectively, by the selected m-n coding mode, and the code block that is a string of the n-bit codewords is modulated to an NRZI code signal to be recorded onto a recording medium. One data block is composed of the predetermined number of m-bit datawords, and one code block is composed of the same number of n-bit codewords; for example, one data block is composed of 800 bits.

The binary data stream input through an input terminal 1 is stored in a one-block memory 2 in the first place. This one-block memory 2 is a FIFO (first in first out) memory, and the capacity thereof is equivalent to the number of bits of the one data block; for example, 800 bits, i.e., to the number of bits of the input binary data string existing between synchronous data.

The data stored in the one-block memory 2 is read out thereof one after another in the order of storing. Each m—m-bit dataword is m-n translated to the corresponding n-bit codeword by an RLL encoder 3, i.e., one data block stored in the one-block memory 2 is coded to the (d,k;m,n) RLL code. The type of the m-n coding mode to be used in the RLL encoder 3 is determined by the data supplied from a |DSV| comparator 17*a*.

The synchronization code and the encoding mode code indicating the selected m-n coding mode used for the block are multiplexed to the same code block output from the RLL encoder 3. This multiplexed code block is NRZI-modulated to an NRZI waveform by an NRZI modulator 4 and output through an output terminal 5 to a recorder (not shown).

The m-n coding mode applied to the RLL encoder 3 is selected for each block by the below-described processing from among the 24 different types of coding modes in a way such that the absolute value of DSV can be the smallest at the end of the NRZI modulated code block.

The binary data string input through the input terminal 1 is stored in the one-block memory 2 on the one hand, and input to a CDS and polarity ROM 10 on the other hand. Each time the m-bit dataword is input from the input terminal 1 to the CDS and polarity ROM 10, 24 different table number data "0–23" are input from a table number generator 11 to the CDS and polarity ROM 10 in numerical order.

The CDS and polarity ROM 10 outputs the polarity data to an exclusive OR circuit 13 in order of table number. This polarity data is specified by both the 0–23 table number data input from the table number generator 11 in numerical order and the m-bit dataword input from the input terminal 1. On the other hand, the CDS and polarity ROM 10 outputs the CDS data to an adder/subtractor circuit 12 in order of table number. This CDS data is specified by both the 0–23 table number data and the m-bit dataword.

The polarity data is a data such that, after the m-bit dataword is coded to the 24 n-bit codewords based on the m-n coding tables (0–23 tables), respectively, and then modulated to the NRZI waveforms, indicates whether the last bit of each NRZI modulated code is "1" (high level +) or "0" (low level −). The polarity data have been held in the CDS and polarity ROM 10 to be addressed by both the m-bit dataword and the table number. However, if the head bit of an n-bit codeword is "1," the NRZI-modulated code thereof is arranged to begin with "1;" if the head bit of an n-bit codeword is "0," the NRZI modulated code thereof is arranged to begin with "0."

The CDS data is a data such that, after the m-bit dataword is coded to the 24 n-bit codewords based on the m-n coding tables (0–23 tables), respectively, and then NRZI-modulated, indicates the DC component of each NRZI modulated code. The CDS data have been held in the CDS and polarity ROM 10 to be addressed by both the m-bit dataword and the table number. However, if the head bit of an n-bit codeword is "1," the NRZI-modulated code thereof is arranged to begin with "1;" if the head bit of an n-bit codeword is "0," the NRZI modulated code thereof is arranged to begin with "0."

The exclusive OR circuit 13 operates the XOR of the polarity data input from the ROM 10 and the preceding polarity data input from an output stage of a 24-stage (24-step) shift register 14 to output the operated XOR to the shift register 14. The preceding polarity data is such a polarity data that had been specified by both the immediately preceding m-bit dataword and the same table number, then operated the XOR the same way, and then stored in the 24-stage shift register 14.

The adder/subtractor circuit 12 operates the sum or the difference of the CDS data input from the ROM 10 and the preceding DSV data input from a 24-stage shift register 15 to output the operated DSV data (the sum or the difference) to the shift register 15.

Which operation, addition or subtraction, should be performed by the adder/subtractor circuit 12 is selected by the preceding polarity data input from the output stage of the 24-stage shift register 14. If the preceding polarity data of the immediately preceding m-bit dataword processed by the same table number is "0" (low level), as there is no need to invert the NRZI waveform of the codeword, addition is selected. If the preceding polarity data of the immediately preceding m-bit dataword processed by the same table number is "1" (high level), as there is a need to invert the NRZI waveform of the codeword, subtraction is selected. Here, whether the NRZI waveform of the codeword needs to be inverted or not is determined based on a definition such that the NRZI-modulated data begins with "1" when the head bit of the n-bit codeword to be NRZI-modulated is "1" and the NRZI-modulated data begins with "0" when the head bit of the n-bit codeword to be NRZI-modulated is "0." If the preceding polarity data at the end of the immediately preceding n-bit codeword is "1" (high level), the NRZI-modulated data must begin with "0" when the first bit of the n-bit codeword to be NRZI-modulated is "1", and the NRZI-modulated data must begin with "1" when the first bit of the n-bit codeword to be NRZI-modulated is "0".

In this way, the latest polarity data indicating the last polarities of NRZI modulated signals from the top of the block to the last bit of the current codeword are stored in the shift register 14 in order of table number. Here, the NRZI modulated signals are signals which are supposed to be generated when the lastly input m-bit dataword is coded to the 24 n-bit codewords based on the m-n coding tables of "0–23", respectively, and then the 24 n-bit codewords are NRZI-modulated. In the same way, the latest DSV data indicating the last DSVs of NRZI modulated signals from the top of the block to the last bit of the current codeword are stored in the shift register 15 in the order of table number.

Therefore, when processing for one block has been completed, the block polarity data indicating the latest polarities at the end of the block for the NRZI modulated block signals are stored in the shift register 14 in the order of table number. In the same way, when processing for one block has been completed, the block DSV data indicating the latest DSVs at the end of the block for the NRZI modulated block signals are stored in the shift register 15 in the order of table number.

When processing for one block has been completed, the respective block polarity data stored in the shift register 14 and the respective block DSV data stored in the shift register 15 are output to a DSV calculator 16*a* in order of table number. Then, both the shift register 14 and the shift register 15 are reset, and the processing for the next block is performed in the same way.

The preceding total block polarity data indicating the last DSV of the NRZI modulated signal from the top of the first block to the end of the immediately preceding block is input to the DSV calculator 16*a* from a register 18*b*, and the preceding total block DSV data indicating the last polarity of the NRZI modulated signal from the top of the first block to the end of the immediately preceding block is input to the DSV calculator 16*a* from a register 18*a*. These data are input to the DSV calculator 16*a* and held therein when both the processings for one block in the shift registers 14 and 15 have been completed.

The DSV calculator 16*a* adds or subtracts each current block DSV data, which are input from the shift register 15 in the order of table number, to or from the preceding total block DSV data calculated from the first block to the immediately preceding block. That is, according to the hysteresis, each of the current total block DSV data is determined. Each current block DSV data being determined according to the hysteresis is output to both a |DSV| comparator 17*a* and a switch input terminal of the register 18*a* in order of table number. Which operation, addition or subtraction, should be performed by the DSV calculator 16*a* is selected by the preceding total block polarity data operated from the first block to the immediately preceding block. If the preceding total block polarity data is "0" (low level), as there is no need to invert the codewords within a block, addition is selected; if the preceding total block polarity data is "1" (high level), as there is need to invert the codewords within a block, subtraction is selected.

The |DSV| comparator 17*a* compares each of the current total block DSV data input from the DSV calculator 16*a* in order of the table number with the previously-stored block DSV data. The |DSV| comparator 17*a* updates the stored data therein with the total block DSV data having a smaller absolute value. Here, the initial data for the comparison is the total block DSV data operated with table number 0 from the DSV calculator 16*a*.

On the other hand, if the absolute value of the current block DSV data input from the DSV calculator 16*a* is smaller than the absolute value of the previously stored block DSV data (=the comparison data), the switch input terminals of the registers 18*a* and 18*b* are set respectively to an input terminal receiving data from the DSV calculator 16*a*. Accordingly, the register 18*a* stores the total block DSV data having the smaller absolute value than the previous absolute value, while the register 18*b* stores the total block polarity data of such total block DSV data.

Therefore, when processing for one block has been completed, the new total block DSV data indicating the DSV, which has the minimum absolute value in the last DSVs of the NRZI modulated signals from the first block to the last bit of the current block, of NRZI modulated signal is stored in the register 18_a_. This new total block DSV data will be used as the preceding total block DSV data to operate the total block DSV of the next block. In the same way, the total block polarity data indicating the last bit polarity, which is correspond to the extracted new total block DSV data, of NRZI modulated block signal is stored in the register 18_b_. This total block polarity data will be used as the preceding total block polarity data to operate the total block DSV and polarity of the next block.

When the operation corresponding to the last table number of the block has been completed, the |DSV| comparator 17_a_ outputs the table number data indicating the table number of the m-n coding mode that minimizes the absolute value of the total block DSV data to the RLL encoder 3 and a encoding mode code generator 6. Then, the |DSV| comparator 17_a_ is reset, and the operation for the next block is performed in the same way.

The RLL encoder 3 reads the data in the one-block memory 2 out thereof in the order of storing, and translates the m-bit datawords into the respective n-bit codewords. The m-n coding table used in such translation is such a table that is specified by the table number data input from the |DSV| comparator 17_a_.

The encoding mode code generator 6 generates the encoding mode code corresponding to the table number data input from the |DSV| comparator 17_a_. The synchronization code generator 8 generates the synchronous code.

One block code string composed of the predetermined number of the n-bit codewords, the encoding mode code and the synchronous code are multiplexed by the switch 9. This multiplexed code string inputs to a NRZI modulator 4 to be modulated to a NRZI waveform. Here, the CDS and polarity of the encoding mode code and the synchronous code is used to calculate the total block DSV. If they are more than 2, one of them is selected in such a way that the absolute value of the total block DSV data can be small.

Figure 2:
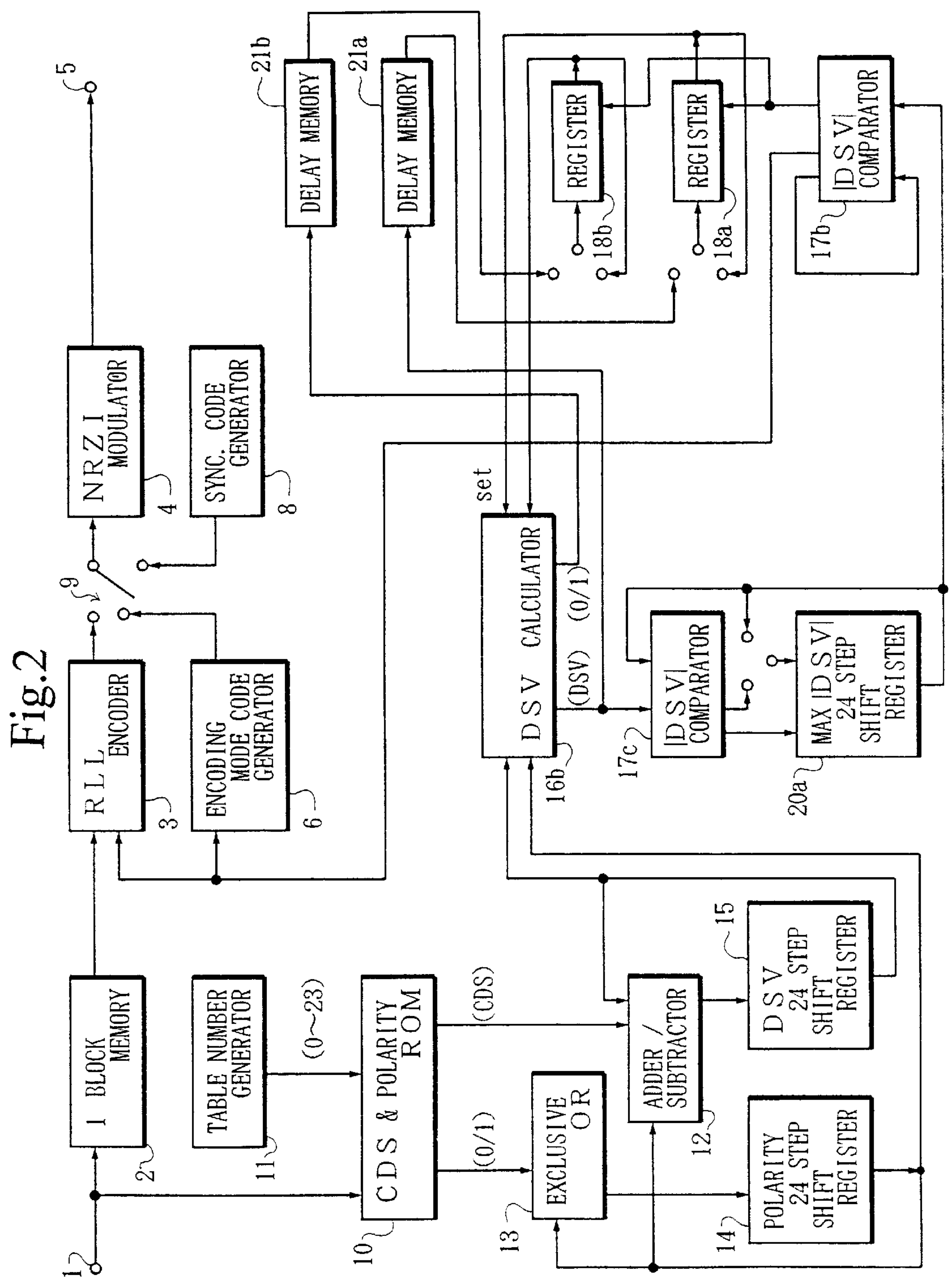
FIG. 2 is a block diagram of a digital modulation circuit of the second embodiment according to the present invention.

1-3 Second Embodiment (Embodiment of Modulator: FIG. 2)

According to the second embodiment, an m-n coding mode which minimizes the absolute value of the maximum amplitude DSV, which has the largest absolute value at some bit in the NRZI-modulated block, is selected from among the 24 different types of m-n coding modes for the same block. The respective m-bit datawords cut out of the input data block one after another are coded to the corresponding n-bit codewords, respectively, by using the selected m-n coding mode, and the code block which is a string of the n-bit codewords is modulated to an NRZI code signal to be recorded onto a recording medium. Here, the composition of one block is identical to that of the first embodiment described above.

In the description of the second embodiment, the parts identical in construction to those of the first embodiment will be indicated with the same reference numerals and the description thereof will be simplified.

The binary data string input through the input terminal 1 is stored in the one-block memory 2 in the first place. The data stored in the one-block memory 2 is read out thereof in the order of storing, and m-n coded into the (d,k;m,n)RLL code by the RLL encoder 3. The m-n coding table used for this m-n translation is specified by the table number data sent from the |DSV| comparator 17_b_. Synchronization code and the encoding mode code indicating the selected m-n coding mode within the block are multiplexed to the same code block output from the RLL encoder 3. This multiplexed code block is modulated to an NRZI recording code by an NRZI modulator 4 and output through an output terminal 5 to a recorder (not shown).

In the above arrangement, as an m-n coding table used for the m-n coding by the RLL encoder 3, an m-n coding table which minimizes the absolute value of the maximum amplitude DSV, which has the largest absolute value at some bit in the NRZI-modulated block, is selected for each block from among the 24 different types of m-n coding tables in such a way as described below.

The binary data string input through the input terminal 1 is stored in the one-block memory 2 on the one hand, and sent to the CDS and polarity ROM 10 on the other hand. Whenever an m-bit dataword is input from the input terminal 1 into the CDS and polarity ROM 10, 24 different table number data "0–23" are input from the table number generator 11, one after another, into this CDS and polarity ROM 10 in numerical order.

The CDS and polarity ROM 10 outputs the polarity data to an exclusive OR circuit 13 in order of table number. This polarity data is specified by both the 0–23 table number data input from the table number generator 11 in numerical order and the m-bit dataword input from the input terminal 1. On the other hand, the CDS and polarity ROM 10 outputs the CDS data to an adder/subtractor circuit 12 in order of table number. This CDS data is specified by both the 0–23 table number data and the m-bit dataword.

The polarity data and the CDS data are defined identically to those of the first embodiment.

The exclusive OR circuit 13 operates the XOR of the polarity data input from the ROM 10 and the preceding polarity data input from the 24-stage shift register 14 to output the operated XOR to the shift register 14 in the same way as the first embodiment. The adder/subtractor circuit 12 operates the sum or the difference of the CDS data input from the ROM 10 and the preceding DSV data input from the 24-stage shift register 15 to output the operated DSV data to the shift register 15 in the same way as in the first embodiment.

As a result of the above-described operation, the latest polarity data indicating the last polarities of NRZI modulated signals from the top of the block to the last bit of the current codeword are stored in the shift register 14 in the order of table number. Here, the NRZI modulated signals are signals which are supposed to be generated when the most recent input m-bit dataword is coded to the 24 n-bit codewords based on the m-n coding tables of "0–23", respectively, and then the 24 n-bit codewords are NRZI-modulated. In the same way, the latest DSV data indicating the last DSVs of NRZI modulated signals from the top of the block to the last bit of the current codeword are stored in the shift register 15 in the order of table number.

In the second embodiment, the respective latest polarity data stored in the shift register 14 and the respective latest DSV data stored in the shift register 15 are output to a DSV calculator 16_b_ one after another in the order of table number.

The preceding total block polarity data indicating the last DSV of the NRZI modulated signal from the top of the first block to the end of the immediately preceding block is input to the DSV calculator 16_b_ from a register 18_b_, and the preceding total block DSV data indicating the most recent polarity of the NRZI modulated signal from the top of the first block to the end of the immediately preceding block is input to the DSV calculator 16_b_ from a register 18_a_. The preceding total DSV and polarity data are input to the DSV calculator 16_b_ when both the latest polarity data at the last bit of the first codeword in the current block and the latest DSV data at the last bit of the first codeword in the current block are input to the DSV calculator 16*b*, respectively. The preceding total DSV and polarity data are held in the DSV calculator 16*b* until the operations for the current block are completed.

The DSV calculator 16*b* adds or subtracts each latest DSV data at the last bit of the current codeword, which are input from the shift register 15 in order of table number, to or from the preceding total block DSV data at the end of the immediately preceding block. That is, each of the total latest DSV data indicating the last DSVs of NRZI modulated signals from the top of the first block to the end of the current codeword is determined. Each total latest DSV data is output to both a |DSV| comparator 17*c* and a delay memory 21*a* in the order of table number. And each total latest polarity data is output to a delay memory 21*b* in order of table number. Which operation, addition or subtraction, should be performed by the DSV calculator 16*b* is selected by the preceding total block polarity data. If the preceding total block polarity data is "0" (low level), as there is no need to invert the codewords from the first codeword to the latest codeword in the block, addition is selected; if the preceding total block polarity data is "1" (high level), as there is need to invert the codewords from the first codeword to the latest codeword in the block, subtraction is selected. Inversion or no inversion of the total latest polarity data is determined in a similar manner.

The |DSV| comparator 17*c* compares each of the total latest DSV data input from the DSV calculator 16*b* in order of the table number with the preceding maximum amplitude DSV data of the same table number input from a 24-stage shift register 20*a*. The |DSV| comparator 17*c* outputs the word DSV data having a larger absolute value to the 24-stage shift register 20*a*. In other words, the |DSV| comparator 17*c* updates the respective word DSV data stored in the shift register 20*a* with the total latest DSV data of the same table number having a greater absolute value, respectively.

As a result of the processing described above, the maximum amplitude DSV data having the largest absolute value are stored into the shift register 20*a* in order of the table number. Accordingly, when the processing of one block has been completed, the maximum amplitude DSV data having the greatest absolute value within that block respectively are stored in the order of table number. When the operation of one block has been completed, the maximum amplitude DSV data stored in the shift register 20*a* are output to the |DSV| comparator 17*b* in order of the table number. Then, the shift register 20*a* is reset, and the processing for the next block is performed in the same way.

The |DSV| comparator 17*b* compares each of the maximum amplitude DSV data input from the shift register 20*a* in order of the table number with the previously stored maximum amplitude word DSV data. The |DSV| comparator 17*b* updates the stored data therein with the maximum amplitude DSV data having a smaller absolute value.

On the other hand, if the maximum amplitude DSV data input from the shift register 20*a* is less than the previously stored maximum amplitude DSV data, the switch input terminal of the register 18*a* is set to the delay memory 21*a*, and the switch input terminal of the register 18*b* is set to the delay memory 21*b*. Accordingly, the total latest DSV data at the last bit of the block specified by the maximum amplitude word DSV data having the smaller absolute value is stored into the register 18*a*, and the polarity data corresponding to the above total latest DSV data is stored into the register 18*b*.

Therefore, when the operation of one block by the |DSV| comparator 17*b* has been completed, the DSV data at the last bit of the block specified by the maximum amplitude word DSV data having the smallest absolute value among the 24 m-n coding mode is stored in the register 18*a*, and the polarity data corresponding to the above total latest DSV data is stored in the register 18*b*.

When the operation corresponding to the last table number of the block has been completed, the |DSV| comparator 17*b* outputs the table number data indicating the table number of the m-n coding mode that minimizes the maximum amplitude DSV data to the RLL encoder 3 and the encoding mode code generator 6. Then, the |DSV| comparator 17*b* is reset, and the operation for the next block is performed in the same way.

Figure 3:
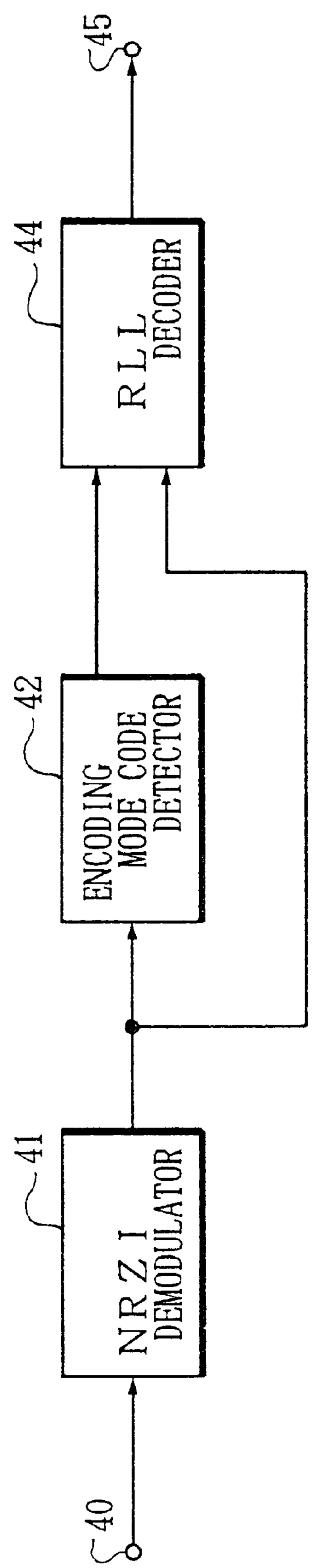
FIG. 3 is a block diagram of a digital demodulation circuit of the third embodiment according to the present invention.

The processing by the RLL encoder 3, the coding mode number generator 6, a synchronous code generator 8, a switch 9 and the NRZI modulator 4 are identical to those of the first embodiment. 1-4 Third Embodiment (Embodiment of Demodulator: FIG. 3)

The data modulated by the modulator according to the first or second embodiment described above and recorded onto an optical disk is read by an apparatus equipped with a demodulating circuit illustrated in FIG. 3.

That is, the NRZI code data stream read out of an optical disk (not illustrated), subjected to processings including A/D conversion, and then input through an input terminal 40 is demodulated to the RLL code by an NRZI demodulator 41. The RLL code string output from the NRZI demodulator 41 is input to both an encoding mode code detector 42 and an RLL decoder 44.

The encoding mode code detector 42 detects the coding mode number code input succeedingly to the synchronous code and supplies the coding mode number data to the RLL decoder 44.

The RLL decoder 44 converts the RLL code string composed of the predetermined number of the n-bit codewords into a data string composed of the same number of the m-bit datawords by using an n-m translation table specified by the coding mode number data. In this way, the demodulated binary data string composed of the m-bit datawords is output through an output terminal 45 to an outer circuit (not shown).

2. Coding Mode Number Data

Now, description will be given to an example case where to the head of the m-n coded block is multiplexed r-bits coding mode number data indicating such m-n coding mode and the m-n coding mode is selected in such a way that, when the m-n coded and r-bits-data multiplexed block is NRZI-modulated, the absolute value of the DSV within such a block can be the smallest.

Figure 11:
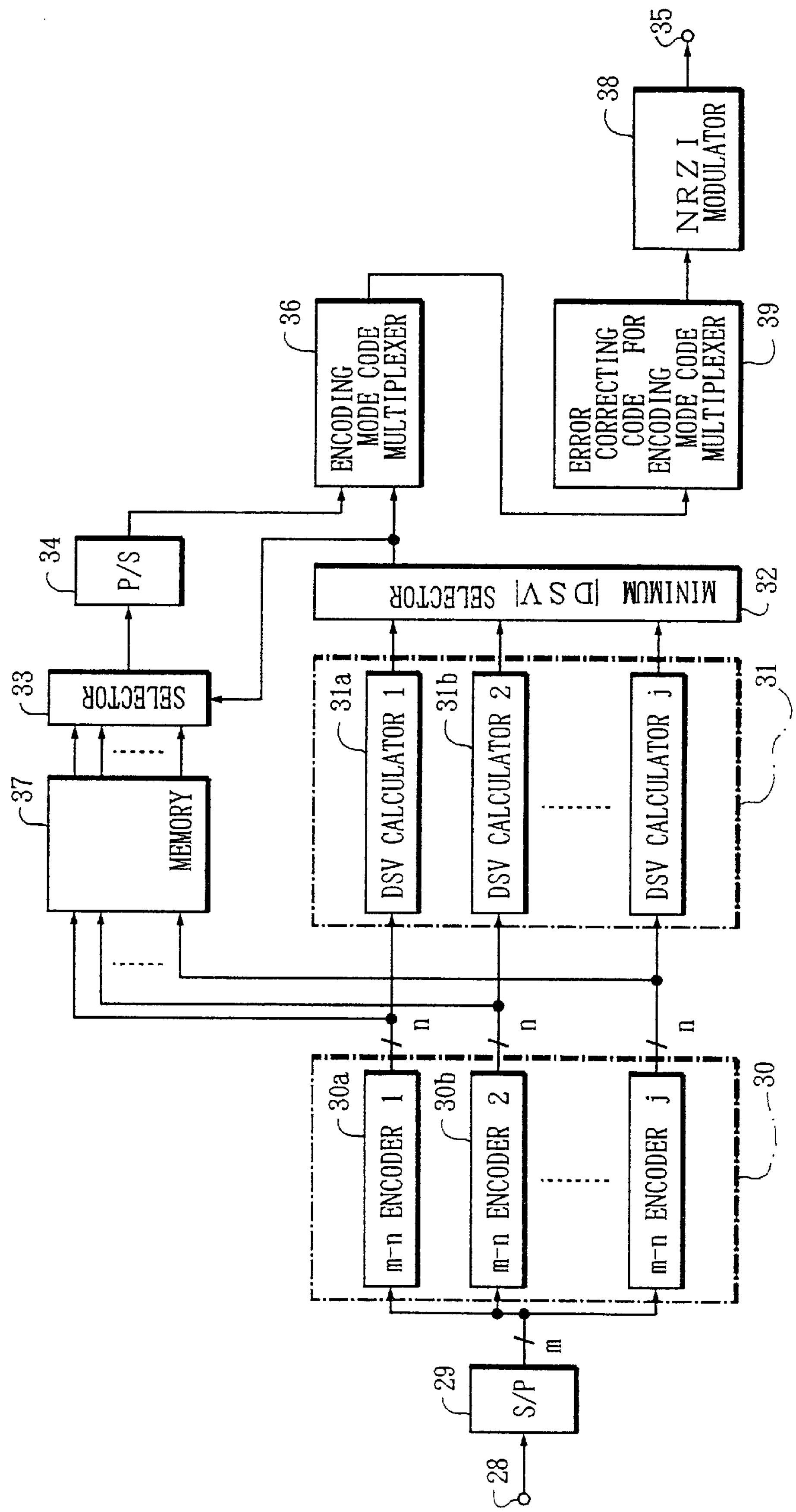
FIG. 11 is a block diagram showing the different principle of the modulation according to the present invention.

2-1 Principle of Modulation (FIG. 11)

By referring to FIG. 11, the principle of the encoding method according to the present invention will now be described.

A part in which each m-bit dataword cut out of an input binary data stream one after another is converted to the n-bit codeword is identical to that illustrated in FIG. 4 described above. FIG. 11 is identical to FIG. 4 in such components as an input terminal 28, a serial/parallel converter 29, an m-n encoder 30, a DSV calculator 31, a minimum |DSV| selector 32, a memory 37, a selector 33, a parallel/serial converter 34, an encoding mode code multiplexer 36, an NRZI modulator 38 and an output terminal 35.

In FIG. 11, an error correcting code, which is r-bits encoding mode code, is generated from each of j different types of number data indicating j different types of m-n coding modes. Here, the r-bits encoding mode code is generated to satisfy the constraint d. Furthermore, the r-bits encoding mode code is multiplexed to the corresponding m-n coded block data in a encoding mode code multiplexer 39. Here, the m-n coded block data is data which has been m-n coded by using the m-n coding mode selected in a way such that the absolute value of DSV, which is calculated within the NRZI-modurated block including the multiplexed and NRZI-modulated r-bits encoding mode code, can be the smallest. Also, the constraint d is a constraint such that a run of at least d consecutive 0s should separate two logical 1s.

FIG. 6 shows a case where the constraint "d=1" is imposed on 15-bits encoding mode code corresponding to 24 numbers "0–23." Here, each 15-bits coding mode number data includes an 8-bit parity code. As these 24 numbers "0–23" are fewer than 32, it is possible to express the same in binary data of 5-bits. However, to obtain 24 different types of bit strings that can satisfy the constraint "d=1," 7-bits strings are necessary. For this reason, 24 different types of bit strings which can satisfy "d=1" are extracted from among the 128 different types of 7-bit strings and allocated to the 24 numbers "0–23." Each of these 7-bit strings is shown in the Information Bits section of FIG. 6.

Each of the 24 different types of 7-bit data extracted as described above is multiplied by the generating function G (generating polynomial G for d=1) shown in FIG. 9(*a*), and thereby 4-bit parity code is generated. However, some 4-bits parity codes can not satisfy the constraint "d=1." That is, some 4-bits parity codes contain the bit-arrangement "11" in its 4-bits string. For this reason, by allocating each of the 4-bits parity codes generated as described above to odd number bits in an 8-bit string in odd numerical order and substituting 0 for the respective even number bits in the 8-bits string, the 8-bits string that can satisfy the constraint "d=1" is generated. Each of these 8-bits strings is shown in the Parity Bits section of FIG. 6. As shown in FIG. 6, these 8-bits data (parity-bits) are added to the tail of the corresponding 7-bits data (information-bits), respectively.

Some 0s substituted for the even number bits in the above described 8-bits string satisfy the constraint "d=1" even if those are replaced by is. That is, if both the odd number bits immediately before and immediately after the 0 substituted for the even number bit in the above described 8-bits string are 0, the arrangement of these three bits is "000." Therefore, even if the "0" in the middle, i.e., an even-number bit, is replaced by "1," the constraint "d=1" can be satisfied. Accordingly, in this case, two different types of the extra bits exist. In FIG. 6, such bits are identified with "*." As described above, if two different types of 8-bit data (parity-bits) exist, "0" or "1" is selected in such a way that the absolute value of the DSV, which is calculated within the NRZI-modurated block including the multiplexed and NRZI-modurated 15-bit coding mode code, can be the smallest.

FIG. 8 shows a case where the constraint "d=2" is imposed on 15-bit coding mode code corresponding to 24 numbers "0–23."

In the first place, a sufficient number of bits strings that can satisfy the constraint "d=2" are extracted from the 2048 different types of 11-bits strings. Next, these sufficient number of 11-bit strings are multiplied by the generating function G (generating polynomial for d=2) shown in FIG. 9(*b*), and thereby 4-bit parity codes are generated respectively. These 4-bit parity codes are added to the corresponding 11-bit strings to generate 15-bit strings, respectively. However, some 15-bit strings generated in this way cannot satisfy the constraint "d=2." Such 15-bit strings are removed, and 24 different types of 15-bit strings are extracted from the remaining 15-bits strings. These 24 different types of 15-bit strings are allocated to the 24 numbers "0–23", respectively.

In the following paragraphs, description will be given to specific circuits.

Figure 5:
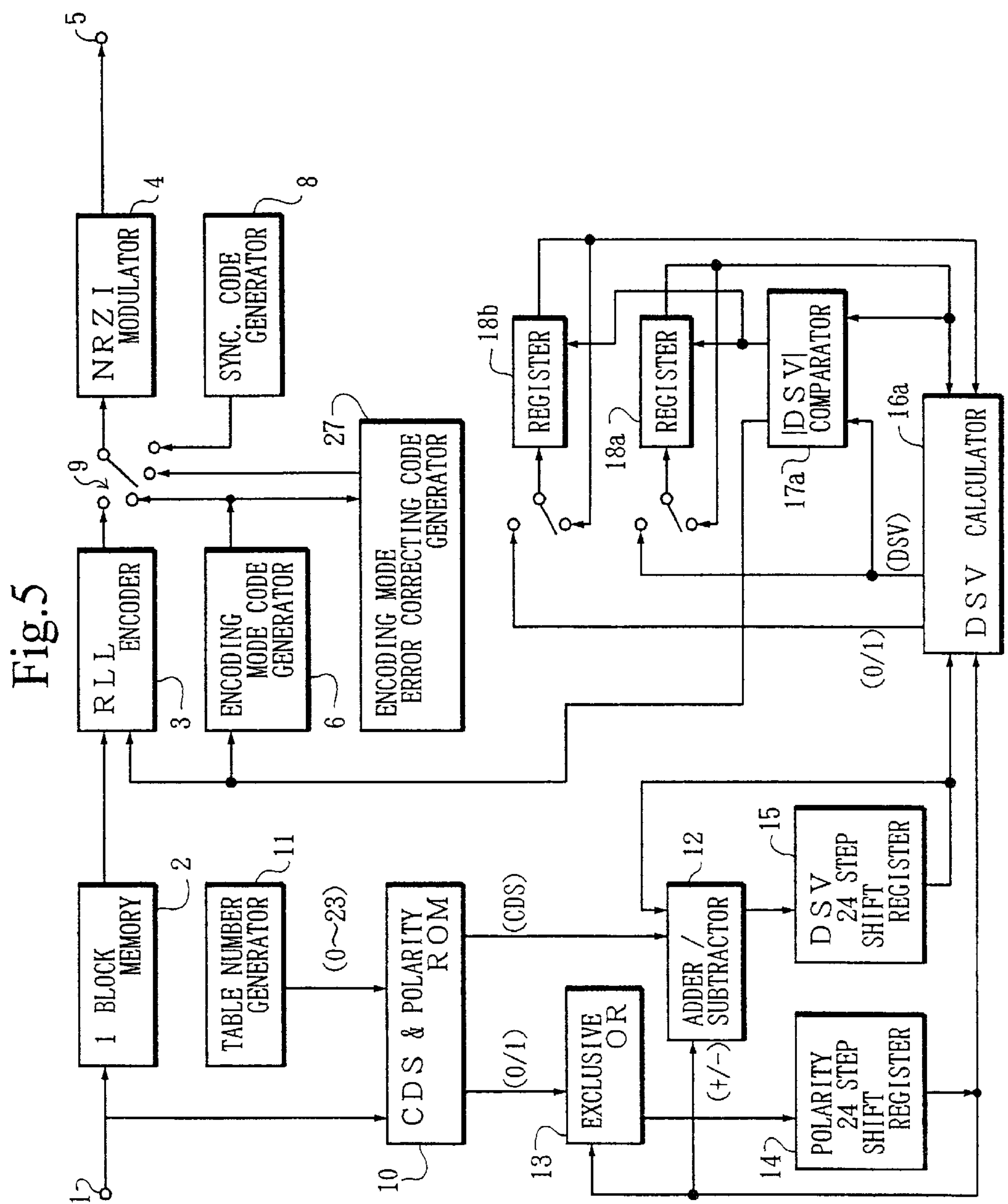
FIG. 5 is a block diagram of a digital modulation circuit of the fourth embodiment according to the present invention.

2-2 Fourth Embodiment (Embodiment of Modulator: FIG. 5)

The fourth embodiment (FIG. 5) is roughly identical to the first embodiment (FIG. 1). Therefore, those parts that are the identical to those of the first embodiment are referred to with the same reference numerals and the description thereof will be omitted. The parts identical to those in FIG. 1 are an input terminal 1, a one-block memory 2, an RLL modulator 3, an NRZI modulator 4, an output terminal 5, a CDS and polarity ROM 10, a table number generator 11, an exclusive OR circuit 13, an adder/subtractor 12, a 24-stage polarity shift register 14, a 24-stage DSV shift register 15, a DSV calculator **16*a*, a |DSV| comparator 17*a*, a register 18*a*, a register 18*b*, an encoding mode code generator 6 and a synchronous code generator 8**.

A part not in FIG. 1 is a encoding mode error correcting code generator 27, and a part different from the counterpart in FIG. 1 is a switch 9.

As described above, when the operation corresponding to the last table number of the block has been completed, the |DSV| comparator **17*a* outputs the table number data indicating the table number of the m-n coding mode that minimizes the absolute value of the block DSV data of the same block to the RLL encoder 3 and the encoding mode code generator 6**.

On the other hand, the encoding mode code generator 6 generates the 7-bit number code corresponding to the table number data input from the |DSV| comparator **17*a*, i.e., generates the 7-bit number data (Information Bits) shown in FIG. 6. The 7-bit number data are output to the terminal of the switch 9 on one hand, and output to the encoding mode error correcting code generator 27** on the other hand.

The encoding mode error correcting code generator 27 multiplies the 7-bit number code input from the encoding mode code generator 6 by the generating function G (for d=1) shown in FIG. 9(*a*), and generates the 8-bits error correction code including "0" allocated to the respective even number bits so that the constraint "d=1" can be satisfied. If the error correcting code generated in this way exists in two different types as indicated with "*" in FIG. 6, as described above, the 8-bit error correcting code is selected in such a way that the absolute value of the DSV, which is calculated within the NRZI-modulated block including the multiplexed and NRZI-modulated 15-bit encoding mode code (=7 information bits+8 correction bits), can be the smallest. The 8-bit parity code is output from the encoding mode error correction code generator 27 to the terminal of the switch 9.

The switch 9 multiplexes the synchronous code generated by and input from the synchronous code generator 8, the 7-bit encoding mode code generated by and input from the encoding mode code generator 6, the 8-bit parity code generated by and input from the encoding mode error correcting code generator 27, and the m-n coded block data output from the RLL encoder 3. The multiplexed code data sequence is output to the NRZI modulator 4, and is then modulated to the NRZI waveform.

A case of "d=1" is described above. In a case of "d=2," as described above referring to FIG. 8, there is only one type of error correcting code. Therefore, in the case of "d=2," the encoding mode error correcting code generator 27 does not compare the absolute values of the DSV's. That is, the generated parity code for the block is output to the terminal of the switch 9 without any further processing.

Figure 7:
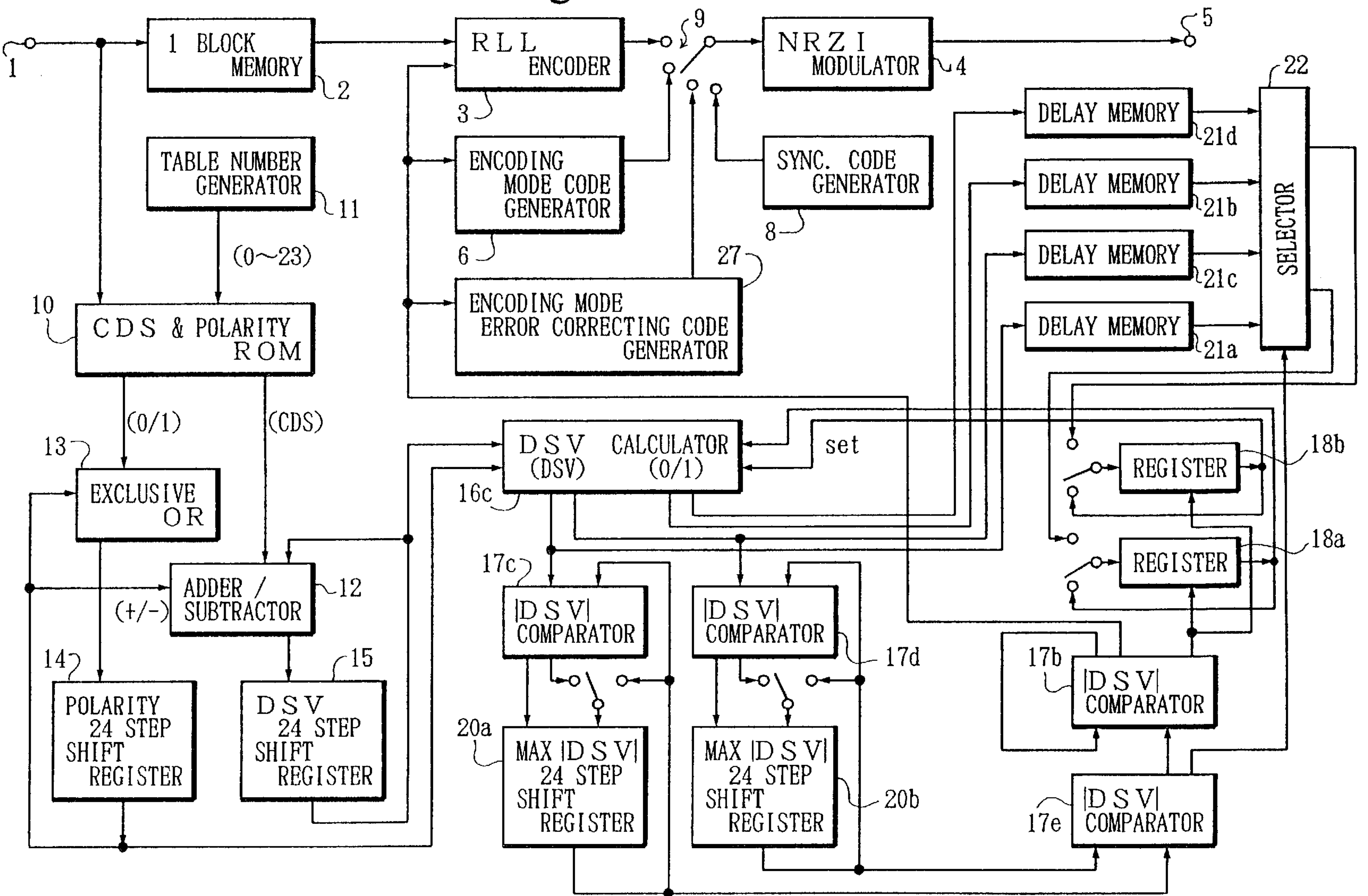
FIG. 7 is a block diagram of a digital modulation circuit of the fifth embodiment according to the present invention.

2-3 Fifth Embodiment (Embodiment of Modulator: FIG. 7)

The fifth embodiment (FIG. 7) is roughly the identical to the second embodiment (FIG. 2). Therefore, those parts identical to those of the second embodiment are referred to with the same reference numerals and the description thereof will be omitted. Those parts identical to those in FIG. 1 are an input terminal 1, a one-block memory 2, an RLL encoder 3, an NRZI modulator 4, an output terminal 5, a CDS and polarity ROM 10, a table number generator 11, an exclusive OR circuit 13, an added/subtractor 12, a 24-stage polarity shift register 14, a 24-stage DSV shift register 15, a |DSV| comparator 17*c*, a 24-stage MAX|DSV| shift register 20*a*, a register 18*a*, a register 18*b*, a |DSV| comparator 17*b*, a delay memory 21*a*, a delay memory 21*b*, an encoding mode code generator 6 and a synchronous code generator 8.

The parts not in FIG. 2 are an encoding mode error correcting code generator 27, a |DSV| comparator 17*d*, a 24-stage MAX|DSV| shift register 20*b*, a |DSV| comparator 17*e*, a delay memory 21*c*, a delay memory 21*d* and a selector 22.

The parts slightly different from those in FIG. 2 are a DSV calculator 16*c* (the DSV calculator 16*b* in FIG. 2) and a switch 9.

According to the embodiment shown in FIG. 2 described above, the DSV calculator 16*b*, the |DSV| comparator 17*c* and the 24-stage MAX|DSV| shift register 20*a* calculate the absolute value of the DSV to the n-bit codeword that is the m-n coded data of the m—m-bit dataword currently in processing within the block currently in processing for each table number. Then, the |DSV| comparator 17*b* compares these DSV's, and the m-n coding mode that minimizes the maximum absolute value of the DSV within the block currently in processing is selected.

According to the fifth embodiment, such selection is performed considering two different types of hysteresis caused by the two different types of encoding mode code indicated with "*" in FIG. 6. That is, although the encoding mode code is multiplexed to the head of the m-n coded block data output from the RLL encoder 3 by using the switch 9, when there are two different types of encoding mode codes as shown in FIG. 6, depending on which encoding mode code is multiplexed, the absolute value of the DSV described above differs, and as a result, the m-n coding mode that minimizes the maximum absolute value of the DSV within the current block differs as well.

To solve this problem, according to this embodiment, a DSV calculator 16*c* is provided instead of the DSV calculator 16*b* in FIG. 2. The DSV calculator 16*c* processes in two different routes (the calculation of the DSV when *=0 and the DSV when *=1 in FIG. 6), and the |DSV| comparator 17*e* compares the results of such processing, and specifies the m-n coding mode that minimizes the largest absolute value of the DSV within the current block considering the two different types of hysteresis caused by the two different types of encoding mode number code data, and at the same time, specifies one of the two different types of encoding mode code and minimizes the absolute value of the DSV of the bit sequence output from the NRZI modulator 4.

Here, the two different routes of processing are processing by "the |DSV| comparator 17*c*, 24-stage MAX|DSV| shift register 20*a*, delay memory 21*a* and delay memory 21*b*" and processing by "the |DSV| comparator 17*d*, 24-stage MAX|DSV| shift register 20*b*, delay memory 21*c* and delay memory 21*d*."

The |DSV| comparator 17*e* compares the results of the processing of both the routes and selects one route (*=0 or *=1 in FIG. 6) the largest absolute value of the DSV within the current block is smaller for each table number. Depending on which route is selected for each table number, the selector 22 is switched for each table number. The |DSV| comparator 17*b* specifies the encoding mode code that minimizes the maximum absolute value of the DSV by selecting one DSV from among 24 kinds of DSVs which have selected one DSV from 2 kinds of DSV before in |DSV| comparator 17*e* and outputs such encoding mode code to the encoding mode code generator 6 and the encoding mode error correcting code generator 27 for the processing described above.

In short, the switch 9 multiplexes the synchronous code generated by and input from the synchronous code generator 8, the 7-bit encoding mode code generated by and input from the encoding mode code generator 6, the 8-bit parity code generated by and input from the encoding mode error correction code generator 27, and the m-n coded block output from the RLL encoder 3, and outputs the multiplexed code block sequence to the NRZI modulator 4. In this way, the multiplexed code sequence is modulated to an NRZI recording code.

Here, a case of "d=1" is described above. In a case of "d=2" (FIG. 8), as there is only one type of error correcting code as described above, one of the two routes of processing is not required.

Figure 10:
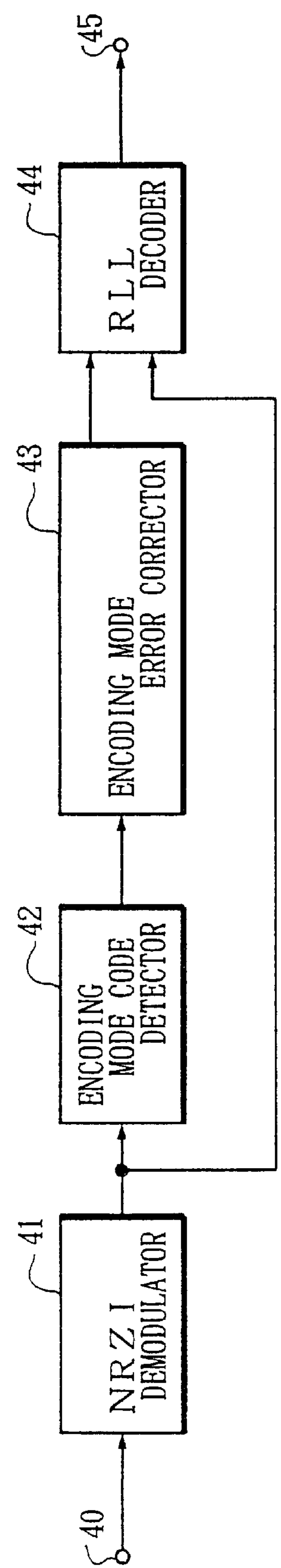
FIG. 10 is a block diagram of a digital demodulation circuit of the sixth embodiment according to the present invention.

2-4 Sixth Embodiment (Embodiment of Demodulator: FIG. 10)

The data modulated by the modulator according to the fourth or fifth embodiment described above and recorded into an optical disk is read and reproduced by an apparatus equipped with a demodulation circuit, as illustrated in FIG. 10.

As the circuit in FIG. 10 is roughly identical to the circuit in FIG. 3 described above, the elements identical to those of the circuit in FIG. 3 will be referred to with the same reference numerals and the description thereof will be omitted. The circuit in FIG. 10 is different from the circuit in FIG. 3 in that an encoding mode error corrector 43 is provided.

The encoding mode error corrector 43 multiplies the encoding mode code removes the extra bits (odd number bits of parity code in FIG. 6) by the parity check matrix H (FIG. 9(*a*) 9(*b*)) to generate the syndrome polynomial, and specifies the correct coding mode code using the syndrome polynomial. Here, while FIG. 9(*a*) and FIG. 6 refer to the case of "d=1," FIG. 9(*b*) and FIG. 8 are referred to in the case of "d=2."

3. m-n Coding the Coding Mode Number Data

In each embodiment of the modulator described above, each data block composed of a predetermined number of the m-bit datawords is translated to the code block composed of the same number of n-bit codewords by using the m-n translation table selected for the data block. On the other hand, to the head of each m-n translated code block the encoding mode code indicating the m-n coding mode used for the same block is multiplexed. However, instead of this method, the encoding mode data may be m-n translated together with the data block. Before m-n translating, the error correcting code may be generated from the data block including encoding mode data.

In the following paragraphs, such an alternative method will be described.

3-1 Data Format

Figure 13:
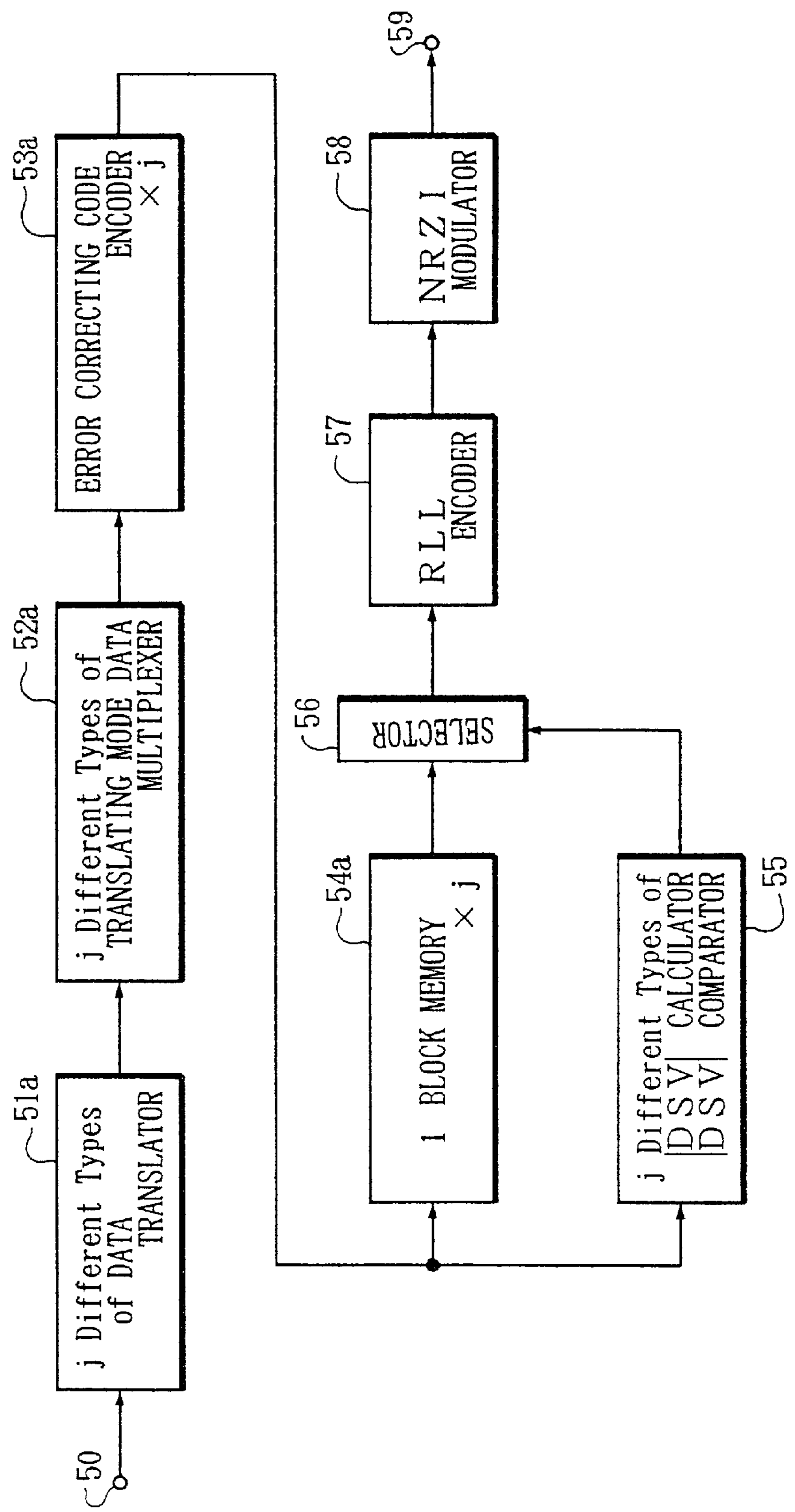
FIG. 13 is a block diagram of a digital modulation circuit of the seventh embodiment according to the present invention.
Figure 14:
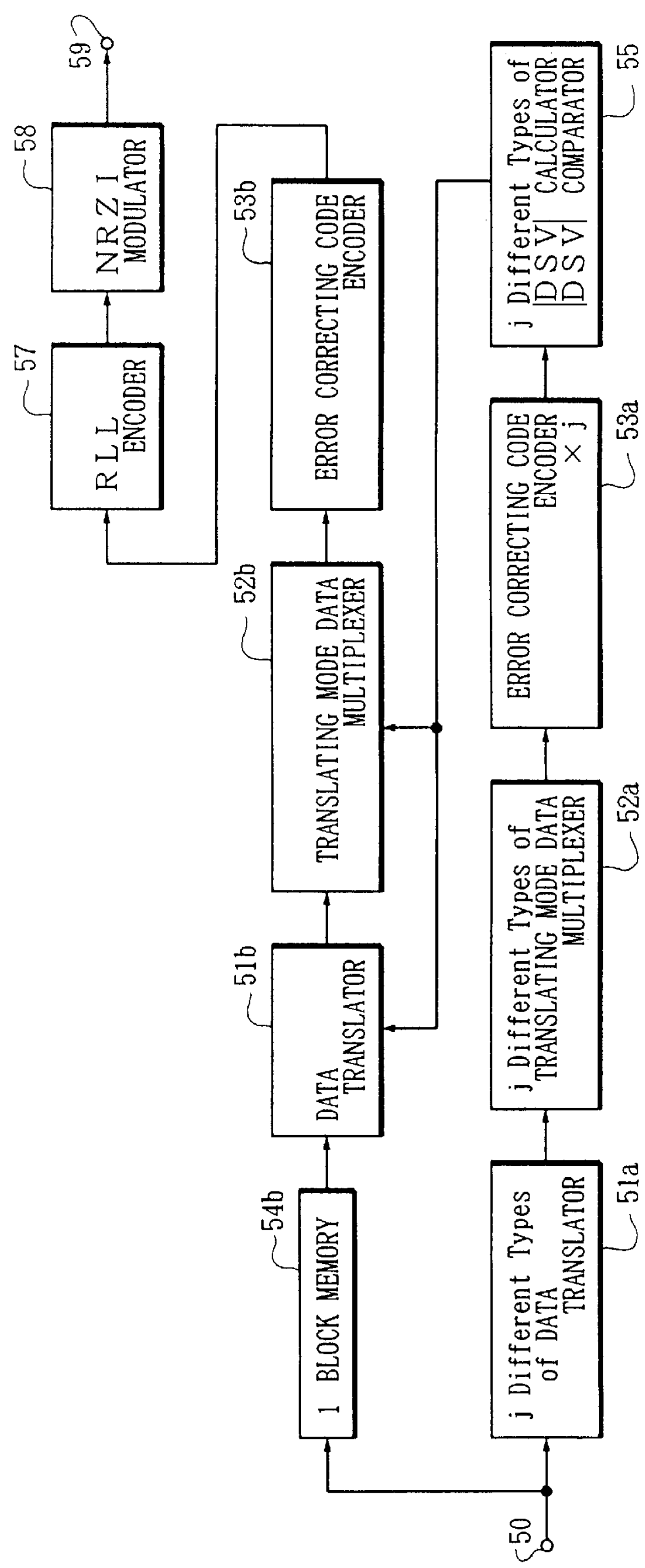
FIG. 14 is a block diagram of a digital modulation circuit of the eighth embodiment according to the present invention.

FIG. 12(*a*) shows a data format of a code block to be processed by the modulator in FIGS. 1, 2, 4, 5, 7 and 11, and FIG. 12(*b*) shows a data format of a code block to be processed by the modulator in FIGS. 13 and 14.

In the data format shown in FIG. 12(*a*), the code for one block, which is an m-n coding mode selection unit, is composed of a synchronous code SYNC, an encoding mode code indicating the m-n coding mode of the block, and a data part. The error correction code is multiplexed to the encoding mode code as "parity bits" and to the data part as "parity code for data."

In the data format shown in FIG. 12(*b*), the data for one block is composed of a synchronous code SYNC and a data part. The data part is composed of data having original information data to be recorded or read and a translating mode code indicating the way how to translate the entire block. The parity code is operated for and multiplexed to the entire data composed of the translating mode data and the original data. The mapping is a technique which translates any (m-bits) word described by a certain rule to the corresponding (m-bits) word described by another rule. Between any two different types of rules, at least one word indicating the same data is described by different bit-arrangement. There are several different types of rules already made ready.

For example, to data of "A" are allocated "0000" in the first description rule, "1000" in the second description rule differently from the first description rule, and "1000" in the third description rule in the same way as the second description rule. On the other hand, to data of "B" are allocated "0001" in the first description rule, "0001" in the second description rule in the same way as the first description rule, and "0010" in the third description rule differently from the second description rule.

3-2 Seventh Embodiment (Embodiment of Demodulator: FIG. 13)

In the first place, an input data string is translated to j different types of data strings described by different rules. That is, m-bit datawords cut out of the input data string one after another are m—m translated to j different types of m—m-bit datawords with different description rules by j different types of data translator 51*a*. Here, the m—m translation means the translation of an m-bits word (dataword) described by a certain description rule indicating an any data into an m-bits word (dataword) described by another description rule indicating the same data. The unit of bits for use in translation is not necessarily "m-bits," only if the translated word is described in the same m-bits as that before the translation as the unit of the m—m translation.

The data string for one block m—m translated to the data strings described by j different types of description rules are multiplexed with the translating mode data indicating the respective description rules by j different types of translating mode data multiplexer 52*a*. Here, one block means a data volume composed of a predetermined number of the m-bit datawords. The data string of one block is the unit of |DSV| comparison.

The j different types of multiplexed mode data blocks indicating the respective description rules are subjected to the addition of the parity codes by j different types of error correcting code encoder 53*a*. Here, error correcting code is generated from j kinds of blocks multiplexed with the mode data. In this way, according to the seventh embodiment illustrated in FIG. 13, as error correcting is generated from the entire data composed of the translating mode code and the original data to be recorded or read, the application of the product code, etc., is possible, i.e., error correcting capability can be strengthened.

The j different types of blocks to which are added the parity code are stored into one block memory 54*a*, respectively, and at the same time input into j different types of |DSV| calculator/comparator 55, respectively.

The j different types of |DSV| calculator/comparator 55 compares j different types of blocks multiplexed with the parity code on |DSV| therebetween, and select such a block multiplexed with the parity code that minimizes the absolute value of the DSV. Here, the absolute values compared here may be the DSV of the respective blocks at the last bit or the absolute values of the largest amplitude DSV within the respective blocks. This point has already been described in detail in the description of the first embodiment, etc., and therefore the description thereof will be omitted here. Also, the construction of the j different types of |DSV| calculator/comparator 55 has been described in detail in the description of the first embodiment, etc., and therefore the description thereof will be omitted here.

When the block with the smallest |DSV| is selected, the selective data indicating the selected block is output to a selector 56. The selector 56 reads the block with the smallest |DSV| out of the one-block memory 54*a* and outputs the selected block to an RLL encoder 57. Thereby, the RLL encoder 57 m-n encodes the block with the smallest |DSV| to the RLL code block and output the selected block to an NRZI modulator 58 to NRZI-modulate. The construction and function of the RLL encoder 57 and NRZI modulator 58 have already been described in the description of the first embodiment, etc., and therefore the description thereof will not be described here.

3-3 Eighth Embodiment (Embodiment of Demodulator: FIG. 14)

The eighth embodiment is a circuit constructed to reduce the number of block memories. That is, according to the seventh embodiment described above, as the blocks to which is added the parity code in j different types of description rules are stored in the one-block memory 54*a*, the block memory 54*a* totally requires a capacity large enough for j blocks. In light of this, according to the eighth embodiment, by storing the input data block into a one-block memory 54*b*, the required capacity of the one-block memory 54*b* is set for one block. In the following description, those parts which are identical to those of the seventh embodiment will not be described.

In the first place, the blocks to which is added the parity code corresponding to j different types of description rules are operated by j different types of data translator 51*a*, j different types of translating mode code multiplexer 52*a* and j different types of error correcting code encoder 53*a*. These j different types of blocks to which is added the parity code are compared on |DSV| with each other by j different types of |DSV| calculator/comparators 55. As a result, the block with the smallest |DSV| is selected. The selective data indicating the selected block is output to a data translator 51*b* and a translating mode data multiplexer 52*b*.

The data translator 51*b* m—m translates the data read out of the one-block memory 54*b* into a data string in such a description rule that corresponds to the way of the selection. The m—m translated data is multiplexed with the translating mode data indicating the selected description rule by the translating mode data multiplexer 52*b*. Furthermore, in the error correcting code encoder 53*b*, the error correcting code is generated to the selected data block. Then, the block data added the parity code is m-n coded by an RLL encoder 57 and further NRZI-modulated by an NRZI modulator 58.

Figure 15:
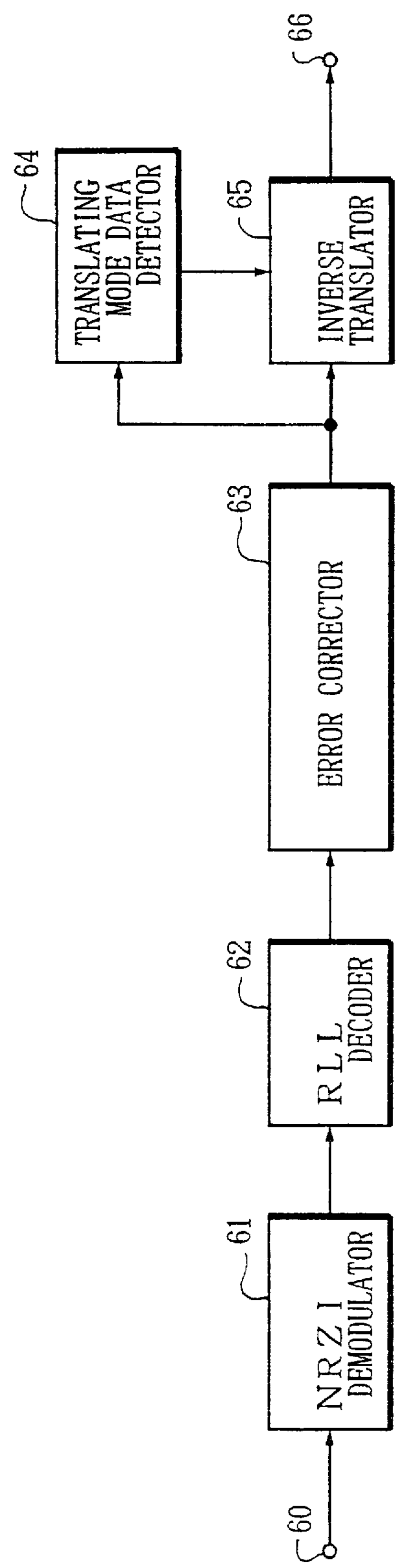
FIG. 15 is a block diagram of a digital demodulation circuit of the ninth embodiment according to the present invention.

3-4 Ninth Embodiment (Embodiment of Demodulator: FIG. 15)

FIG. 15 illustrates a circuit which demodulates the block code to which is added the parity code as shown in FIG. 12(*b*).

The block to which is added the parity code input through an input terminal 60 is NRZI-demodulated by an NRZI demodulator 61 and then n-m decoded by an RLL decoder 62. The n-m decoded data is then subjected to error correction by an error corrector 63.

Following this, translating mode data indicating the description rule of the block is detected from the decoded data by a translating mode data detector 64, and this translating mode data is output to an inverse translator 65.

The inverse translator 65 m—m inverse translates the data input from the error corrector 63 using the translating mode data input from the translating mode data detector 64, and thereby the data in the different description rule is restored to the data in the original description rule.

4. Multiplication of Galois Field

According to the seventh, eighth and ninth embodiments described above, j different types of blocks obtained by m—m-translating the data to be recorded or read are multiplexed with the translating mode data indicating the respective description rules, and the respective error correcting codes are obtained by operation for the blocks to which are added the j different types of translating mode data. Therefore, j error correcting code encoders are required.

In the following embodiments, Reed Solomon (RS) code is used as an error correcting code, and j different types of blocks are generated based on the multiplication of the element defined over the Galois field. That is, instead of the m—m translation according to the seventh, eighth and ninth embodiments described above, j different types of blocks are generated by the multiplication of the element defined over the Galois field. Therefore, only one error correcting code encoder is required.

In the first place, Galois field and the RS code will be briefed, and then the modulation mode using Galois field and RS code will be described in the description of the tenth, eleventh and twelfth embodiments.

4-1 Galois Field

Figure 17:
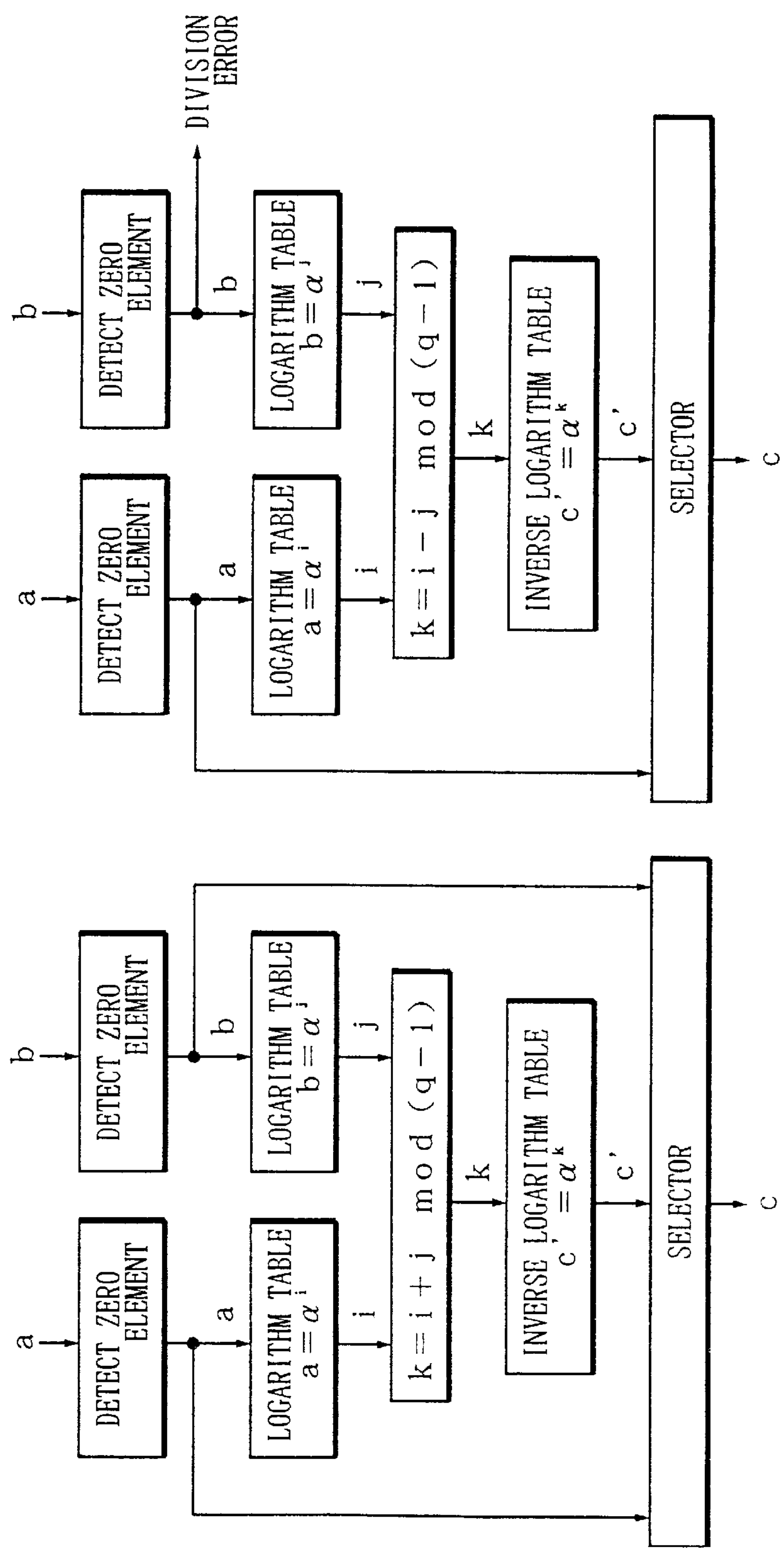
FIG. 17 is a chart illustrating the multiplication mode and division mode of the Galois field.
Figure 18:
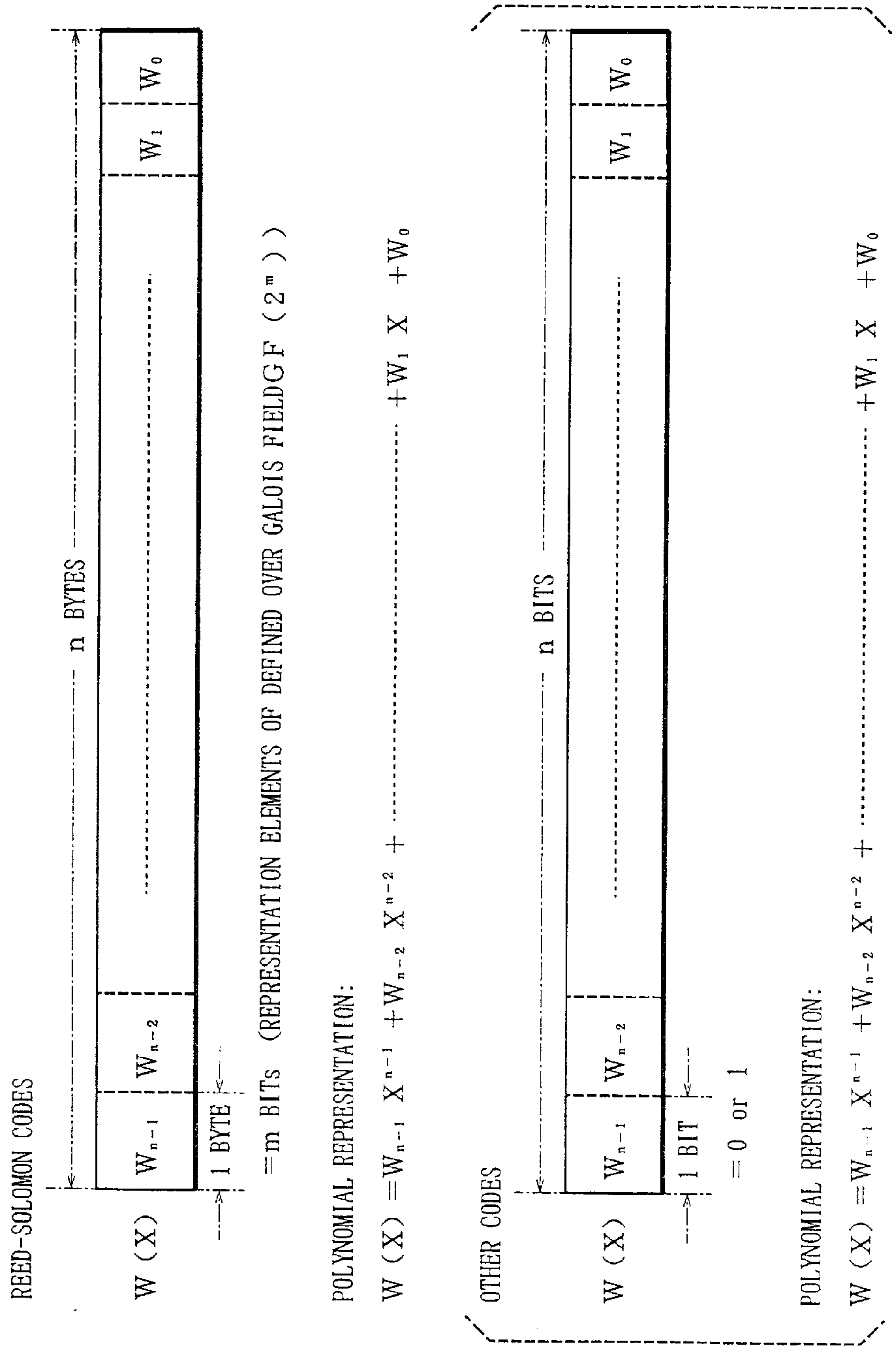
FIG. 18 is a block format for describing the Reed Solomon (RS) code.
Figure 19:
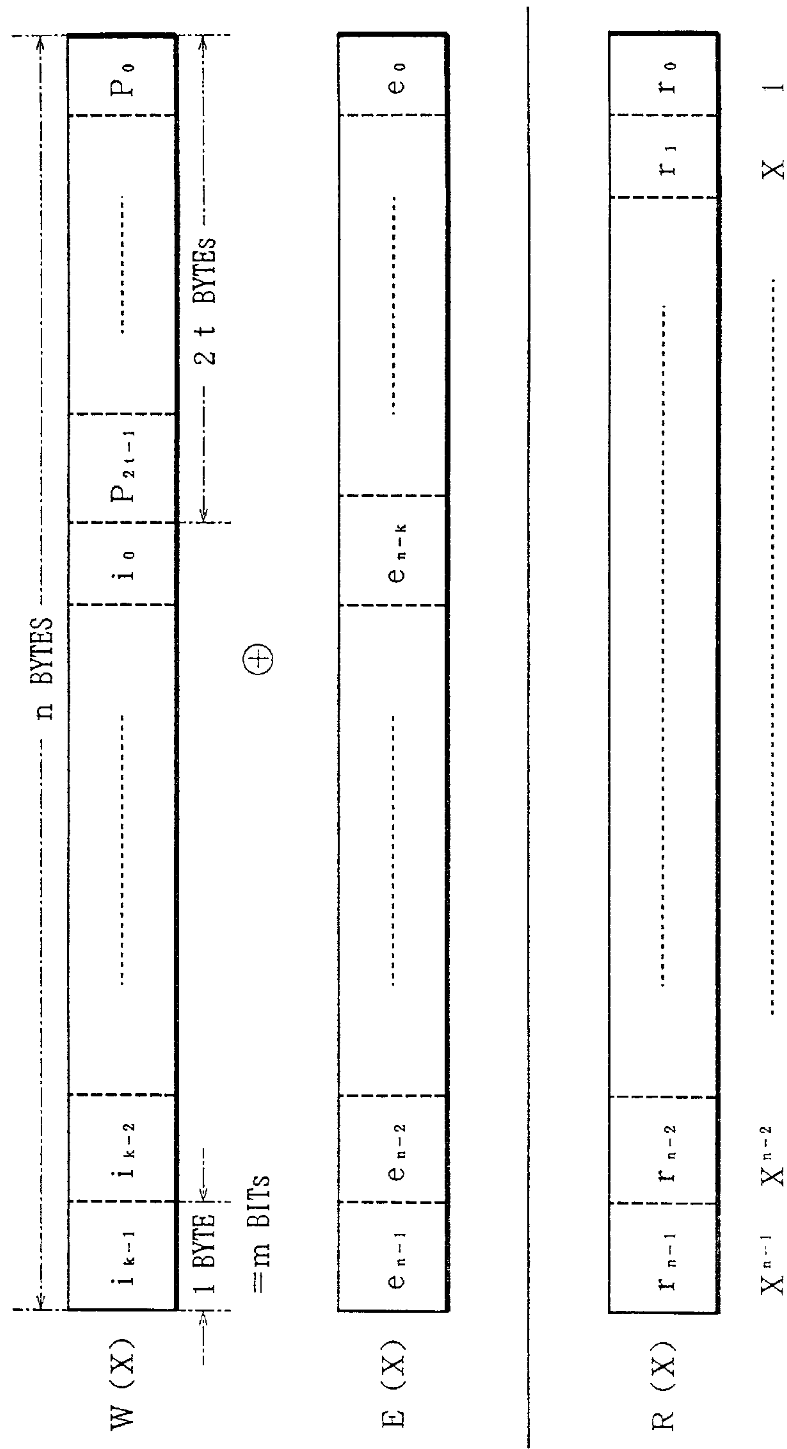
FIG. 19 is a conventional block format illustrating the RS code polynomial W(X), the error polynomial E(X) and the receiving polynomial R(X)

Galois field GF $(2^m)$ enables four fundamental operations with respect to $2^m$ different types of numerals (elements). FIG. 16 shows an example of the Galois field GF $(2^3)$. Addition is made among vector elements. However, as the vector elements are the elements defined over GF $(2^3)$ (0 or 1), the addition is made by using the operation of mod 2. As subtraction is also made by the operation of mod 2, the results are the same as those of the addition. Multiplication and division are made by using the exponent of the primitive element $\alpha$ as shown in FIG. 17. However, as the primitive element 0 has no index number, a detector of the primitive element 0 is required. 4-2 Reed Solomon (RS) Code In the RS code, as illustrated in FIG. 18, the data is processed in a unit of 1 byte made of m bits. One byte is expressed as elements defined over the Galois field GF $(2^m)$. FIG. 19 shows how to generate the RS code. Specifically, the data polynomial I(x) to be input to the error correction encoder is shifted by 2t bytes, and then divided by the generator polynomial G(x), and thereby the remainder polynomial P(x) is obtained. Here, A mod B indicates the remainder obtained by dividing A by B. The polynomial connected the remainder polynomial P(x) to the end of the data polynomial $I(x)x^{2t}$ shifted by 2t bytes is the code polynomial W(x) output from the error correction encoder.

The code polynomial W(x) can apparently be divided by the generator polynomial G(x). If an error occurs, however, the error polynomial E(x) is added to the code polynomial W(x). Therefore, in case of the error correcting, the remainder obtained by dividing the receiving polynomial R(x) by the generator polynomial G(x) is not 0. This division is illustrated in FIG. 20 as the syndrome polynomial S(x). The conventional syndrome polynomial S(x) of RS code is:

$$\begin{aligned} S(x) &= (I(x)x^{2t} + P(x) + E(x))\mathrm{mod}G(x) \\ &= (I(x)x^{2t} + P(x))\mathrm{mod}G(x) + E(x)\mathrm{mod}G(x) \\ &= E(x)\mathrm{mod}G(x) \end{aligned}$$

By using this syndrome polynomial S(x), the error can be corrected on the condition that the error should be of t bytes or less.

4-3 Multiplication of RS Code by an Element of Galois Field

Figure 21:
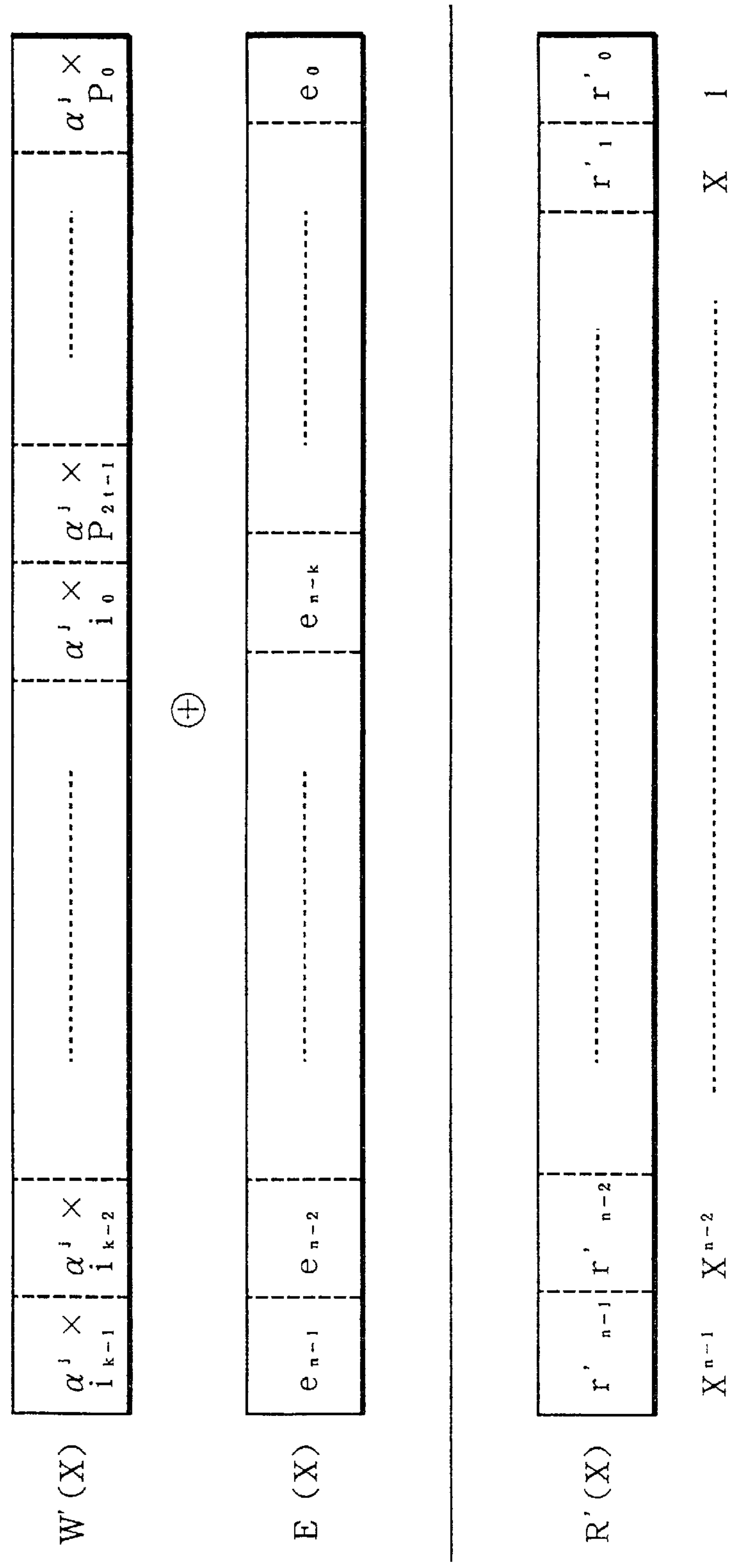
FIG. 21 is a Galois-Field-multiplied block format illustrating the RS code polynomial W'(X), the error polynomial E(X) and the receiving polynomial R'(X)

Now, a case where the coefficient of the RS code polynomial W(x) is multiplied by the element $\alpha^i$ (0: definite value) defined over the Galois field GF$(2^m)$ will be considered. FIG. 21 shows the code polynomial W'(x) obtained by multiplying the code polynomial $W(x)=I(x)x^{2t}+P(x)$ output from the RS encoder by an element $\alpha^i$ defined over Galois field in comparison with FIG. 19.

As shown in FIG. 21, when the error polynomial E(x) is added, the receiver polynomial R'(x) is obtained in the same way as shown in FIG. 19. On the decoder side, processing is performed to divide the receiver polynomial R'(x) by the generator polynomial G(x), and thereby the error is corrected.

The syndrome polynomial S'(x), which is a polynomial expression of such division processing, is:

$$\begin{aligned} S'(x) &= (\alpha^i(I(x)x^{2t} + P(x)) + E(x))\mathrm{mod}G(x) \\ &= \alpha^i(I(x)x^{2t} + P(x))\mathrm{mod}G(x) + E(x)\mathrm{mod}G(x) \\ &= E(x)\mathrm{mod}G(x) \end{aligned}$$

as indicated in the column of the RS code obtained by multiplying the Galois field in FIG. 20.

As described above, both the syndrome polynomial S(x) of the conventional RS code and the syndrome polynomial S'(x) obtained by multiplying any element defined over Galois field are reduced to E(x)modG(x), i.e., both the polynomials are equal to each other. Therefore, it is also possible to correct the error for the block for which the datawords are changed by multiplying the code polynomial W(x) by the element defined over the Galois field. In other words, by dividing the code polynomial W'(x) by the multiplied element defined over the Galois field, the original dataword can be obtained.

4-4 The Data Format Multiplied The Element defined over Galois Field

FIG. 22 shows the data format of one block containing the element defined over the Galois field. To the head of the block the dummy data is multiplexed. As the dummy data, the element $\alpha^o$ of the Galois field, for example, can be used. From the block multiplexed with the dummy data the error correction code is generated by the RS encoder.

The block multiplexed with the parity code is multiplied by any element defined over the Galois field. This enables the element using the multiplying process to exist in the dummy data part. When the dummy data is the element $\alpha^o$, for example, the element $\alpha^i$ exists in the dummy data part. Also, the data in the dummy data part is incorporated in the m-n coded block.

In decoding, the data is output from the RS decoder the data of one block in a unit of m bits is divided by the element at the head of the block if the dummy data is $\alpha^o$, and thereby the original data can be obtained.

Figure 23:
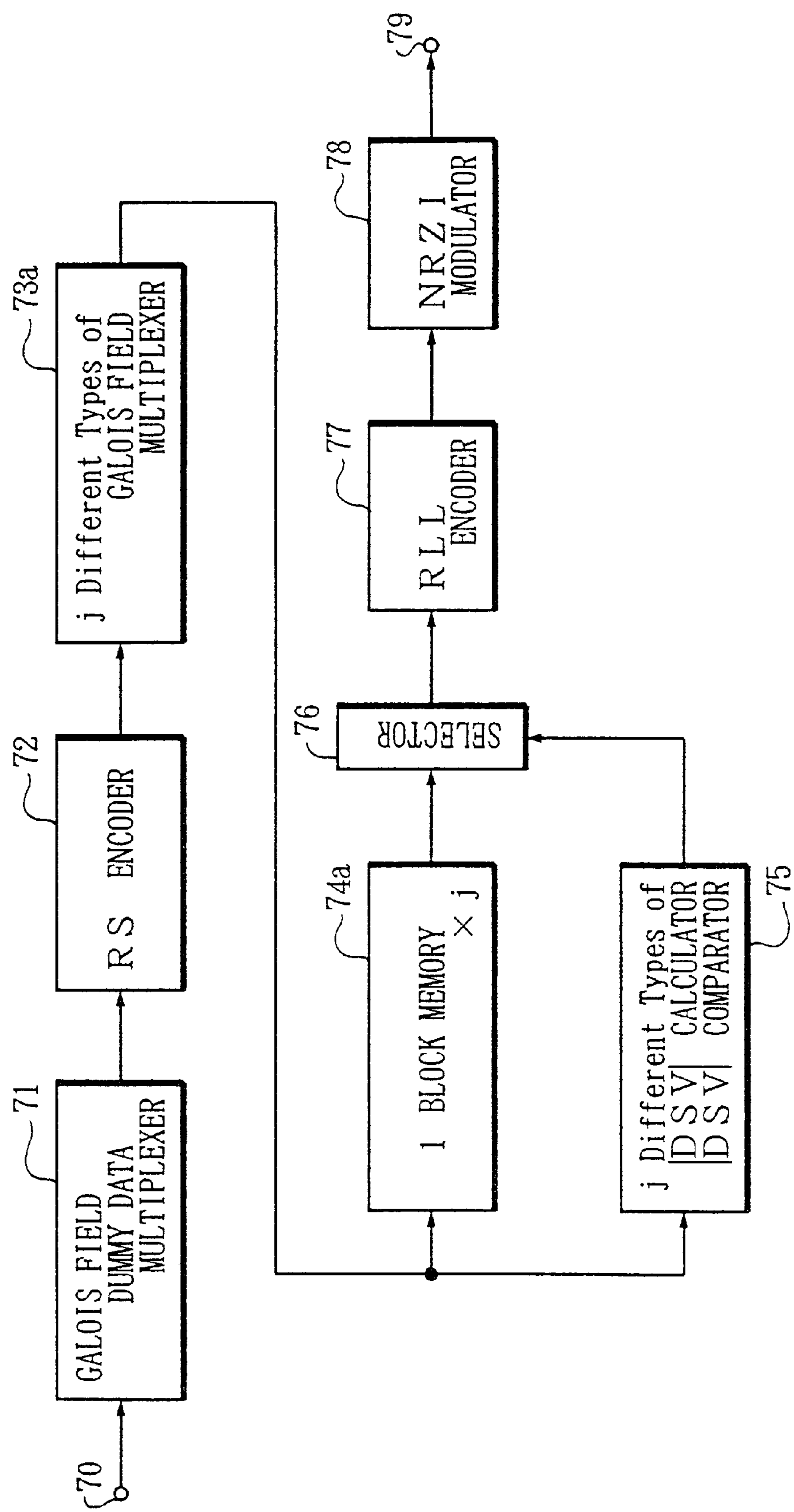
FIG. 23 is a block diagram of a digital modulation circuit of the tenth embodiment according to the present invention.

4-5 Tenth Embodiment (Embodiment of Modulator: FIG. 23)

At the head of each block input through an input terminal 70 the predetermined 1 byte (m bits) of the dummy data is multiplexed. Here, the one block is composed of a predetermined number of bytes (1 byte=m bits), and this one block constitutes a unit of the |DSV| comparison.

The data of the one block multiplexed with the dummy data is input to an RS encoder 72. In the RS encoder 72, the error correction code with respect to the block multiplexed with the dummy data is operated, and the parity code is multiplexed to the same block, and the block becomes the block multiplexed an error correction code.

This block is input to j different types of Galois field multiplier 73*a*. In the j different types of Galois field multiplier 73*a*, the m-bit datawords cut out of the block one after another are multiplied respectively by the element $\alpha^i$. By multiplying all the datawords of one block by the element $\alpha^i$, it is possible to correct the error with respect to the j different types of converted blocks in RS decoding as well as the original blocks before converting.

Accordingly, there is no need to perform processing such that j different types of converted blocks are input to the respective RS encoders and the error correction codes thereof are operated. Instead, only the processing that the block before the multiplication of the element $\alpha^i$ is input to the RS encoder and the error correction code thereof is operated is suffice. Therefore, only one RS encoder 72 is provided. On the other hand, the predetermined dummy data multiplexed by the dummy data multiplexer 71 is known. For this reason, by checking the dummy data part, the element $\alpha^i$ can be specified on the receiving side (reading side). If the element $\alpha^o$ (=1) is used as a dummy data, the multiplied dummy data constitutes the element $\alpha^i$.

The j different types of block data generated by multiplying j different types of the elements $\alpha^i$ over the Galois field are stored into respective one-block memory 74*a* and at the same time into respective j different types of |DSV| calculator/comparator 75. In the j different types of |DSV| calculator/comparator 75, the |DSV|s of the j different types of blocks are compared with each other, and such a block that minimizes the |DSV| is selected therefrom. Here, the absolute values of the DSV to be compared may be the values at the last bit of the respective blocks or the absolute values of the DSV with the largest amplitude within the respective blocks. This point has already been detailed in the description of the first embodiment, the description thereof will be omitted here. Also, the construction of the j-different types of calculator/comparator 55 has also been described in the description of the first embodiment, the description thereof will be omitted here.

When the block with the smallest |DSV| is selected, the data indicating the selected block is output to a selector 76. Then, the selector 76 reads the block with the smallest |DSV| from the one-block memory 74*a*, and outputs the selected block to an RLL encoder 77. The subsequent processing is the same as that of the seventh and eighth embodiments.

Figure 24:
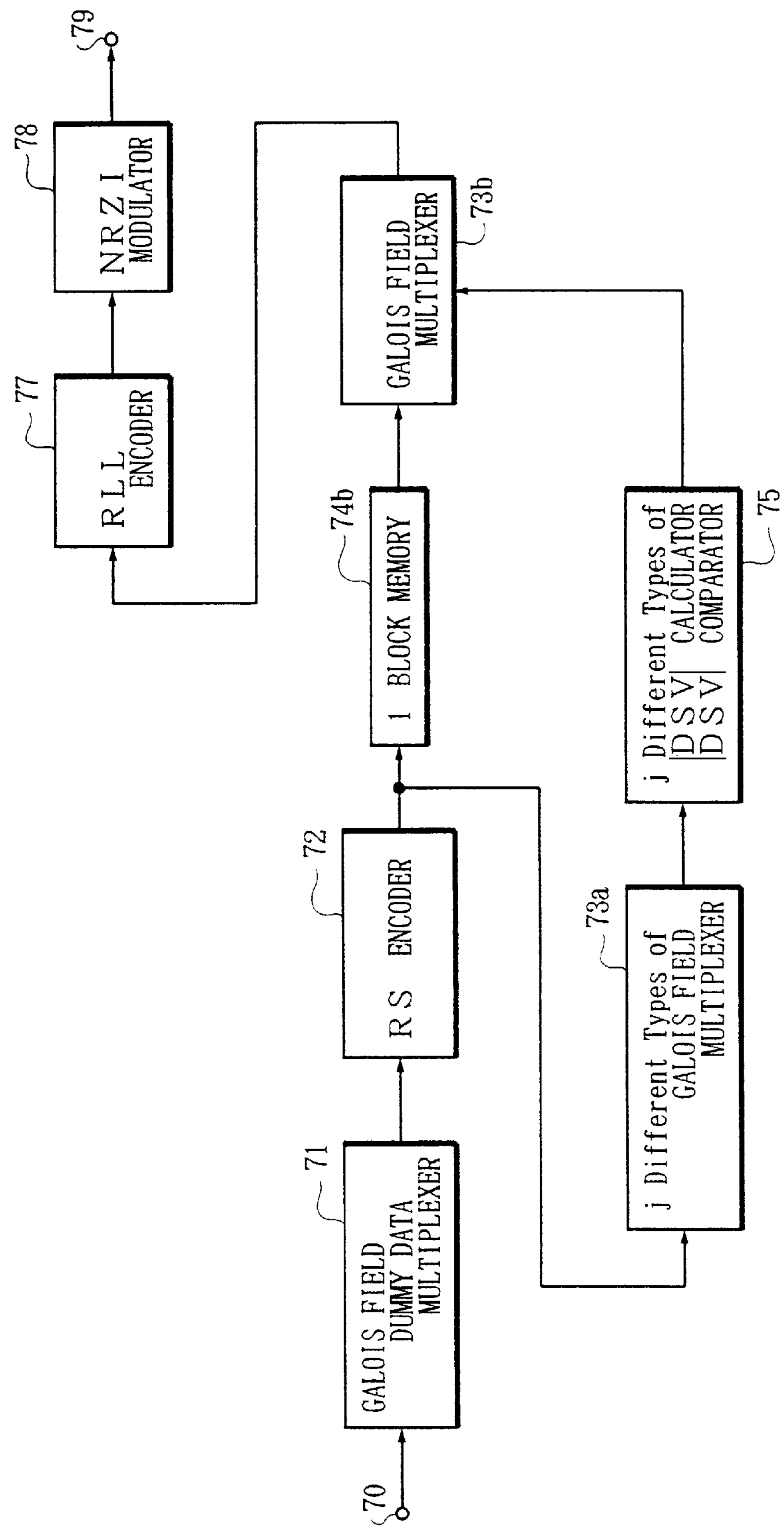
FIG. 24 is a block diagram of a digital modulation circuit of the eleventh embodiment according to the present invention.

4-6 Eleventh Embodiment (Embodiment of Modulator: FIG. 24)

The eleventh embodiment is a circuit constructed for the purpose of reducing the number of block memories. In the tenth embodiment, as j different types of blocks multiplexed with the parity code are stored into the 1 block memory 74*a*, respectively, the 1 block memory 74*a* needs a capacity large enough to store j pieces of blocks. In light of this, in the eleventh embodiment, by storing the block multiplexed with the dummy data and the parity code into a one-block memory 74*b*, the required capacity of the one-block memory 74*b* is made large enough to store only one block. In the following description, the description of those parts identical to those of the tenth embodiment will be omitted.

The block multiplexed with the parity code is stored into the one block memory 74*b* and at the same time input to j different types of Galois field multiplier 73*a*, and multiplied by j different types of elements of Galois field, respectively, and thereby j different types of the blocks are produced. In the j different types of |DSV| calculator/comparator 75, the |DSV|s of the j different types of blocks are compared with each other. As a result, such a block that has the smallest |DSV| is selected from thereamong, and the data indicating what element the data is multiplied by is output to the Galois field multiplier 73*b*.

According to the selection described above, the Galois field multiplier 73*b* reads the block before the multiplication by any element over the Galois field out of the one-block memory 74*b* and multiplies such block by the element over the Galois field that enables the |DSV| of the block after the multiplication to be the smallest. Here, the element over the Galois field in the dummy data part is equivalent to the translating mode data of the seventh and eighth embodiments described above. The block after the multiplication by the element over the Galois field is immediately m-n coded by the RLL encoder 77, then modulated to the NRZI recording code by an NRZI modulator 78, and then output to an output terminal 79.

Figure 25:
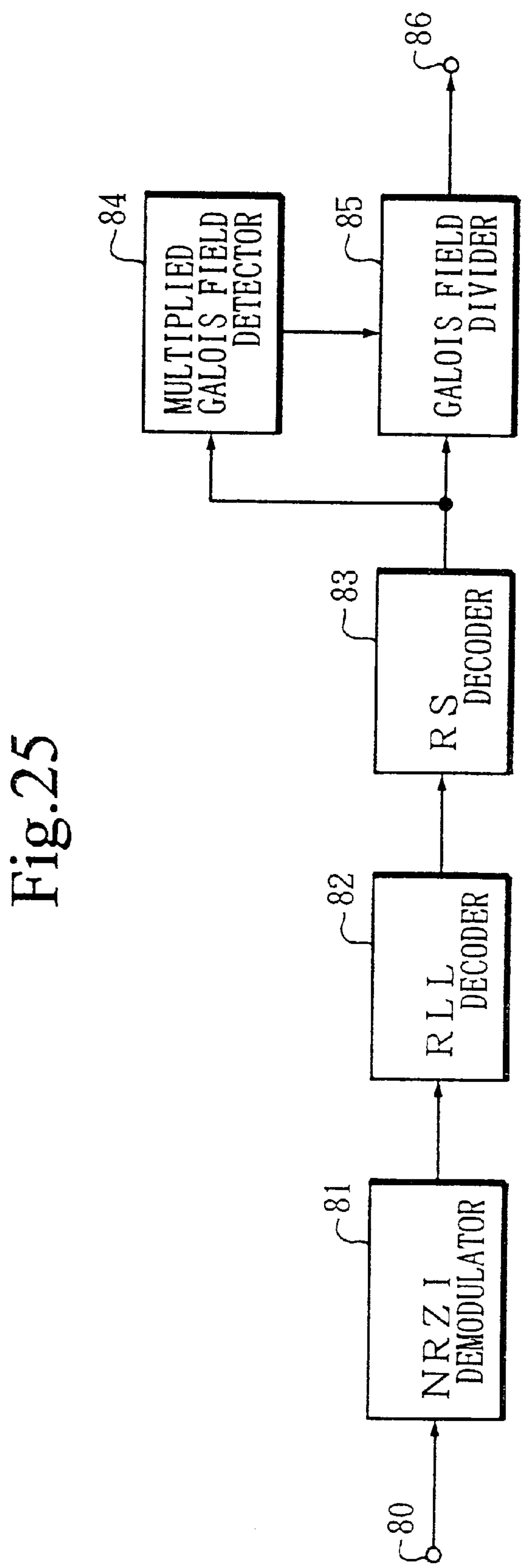
FIG. 25 is a block diagram of a digital demodulation circuit of the twelfth embodiment according to the present invention.

4-7 Twelfth Embodiment (Embodiment of Demodulator: FIG. 25)

FIG. 25 illustrates a circuit which demodulates the block multiplexed with the parity code as shown in FIG. 22(*b*).

The code string to be input into this decoder is NRZI-demodulated by an NRZI demodulator 81 and then n-m decoded by an RLL decoder 82. With respect to this, n-m decoded data error correction processing is performed by an RS decoder 83.

Next, the element over the Galois field multiplied by the modulator illustrated in FIG. 23 or 24 is detected at the top of the block by a multiplied Galois field detector 84. This detected element over the Galois field is output to a Galois field divider 85.

In the Galois field divider 85, the data input from the RS decoder 83 is divided by the element over the Galois field input from the multiplied Galois field detector 84. Thereby the data is restored to the data so constructed as shown in FIG. 22(*a*).

5. Convolution Processing

In the seventh and eight embodiments described above, the data to be recorded or read is m—m translated into j different types of translated blocks, these j different types of translated blocks are multiplexed with translating mode code data indicating the respective translating mode to generate the blocks multiplexed j different types of translating mode number, then the blocks multiplexed with these j different types of translating mode code are multiplexed with the parity code, respectively, and thereby the blocks multiplexed with the parity code are obtained.

In the tenth and eleventh embodiments described above, the data to be recorded or read is multiplexed with the dummy data over the Galois field to generate the block multiplexed with the dummy data, then the block multiplexed the dummy data is multiplexed with the parity code, then the block multiplexed the parity code is multiplied by j different types of elements over the Galois field respectively, and thereby the blocks with the element over the Galois fields multiplexed with j different types of parity code are obtained.

In the block multiplexed the parity code described above, if errors occur to the translating mode code and the number of such errors exceeds the limited number of erroneous elements the RS encoder can correct within the block, as the translating mode code after RS decoding is wrong, the inverse conversion of the data cannot properly be performed, and therefore the errors may be propagated throughout the block. In order to prevent the errors from propagation throughout the block, according to the embodiment described below, conversion into j different types of blocks in a unit of m-bit dataword is performed.

5-1 Data Format Using Converted Data

Figure 26:
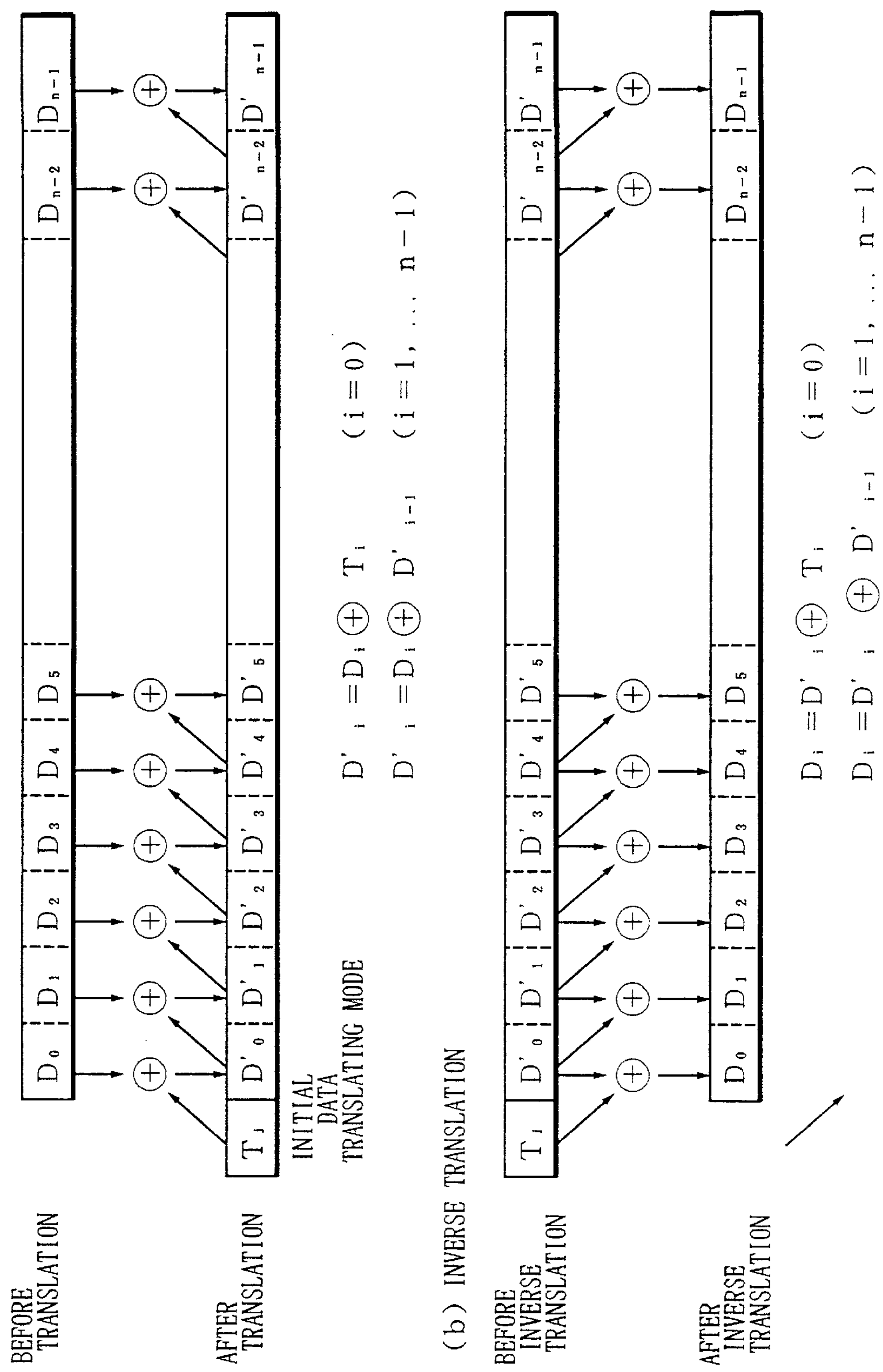
FIG. 26 is a block format illustrating the principle of a data translation of the 13th embodiment according to the present invention.

FIG. 26 illustrates the data format of one block before and after the data conversion by using the convolution processing used in the 13th to 15th embodiments. In FIG. 26, each of the data $D_o$ to $D_{n-1}$ is an m-bit dataword.

In data conversion, j different types of initial data $T_j$ are multiplexed at the head of one block respectively, and thereby the blocks multiplexed with j different types of initial data are generated.

With respect to each of these blocks multiplexed with j different types of initial data, exclusive OR is operated between the current dataword, which is a dataword to be converted, and the dataword immediately preceding such current dataword in order from the forefront dataword $D_o$, and the current dataword is replaced by the operation results. This operation is called "convolution processing." Here, the initial data $T_j$ is used as the first immediately preceding dataword.

Specifically, by the operation of mod 2 between the forefront dataword $D_o$ and the initial data $T_j$, $D'_o$ is generated, and the $D_o$ is replaced by this $D'_o$. Then, by the operation of mod 2 between the next dataword $D_1$ and the above-mentioned converted dataword $D'_o$, $D'_1$ is generated, and the $D_1$ is replaced by this $D'_1$. Such processing is repeated in the same way with respect to all the datawords until the last dataword.

By performing the convolution processing described above for each of j different types of initial data multiplexed with blocks, j different types of converted blocks multiplexed with the initial data are generated.

In the inverse conversion of the data, the exclusive OR is operated between the current dataword, which is a dataword to be inverse converted, and the dataword immediately after such current dataword in order from the forefront dataword $T_j$, and the current dataword is replaced by the operation results.

Specifically, by the operation of mod 2 between the initial data $T_j$, which is the forefront dataword, and the dataword $D'_o$ immediately thereafter, $D_o$ is generated, and the $T_j$ is replaced by this $D_o$. Then, by the operation of mod 2 between the next dataword $D'_o$ and the dataword D'1 immediately thereafter, $D_1$ is generated, and the $D'_o$ is replaced by this $D_1$. Then, such processing is repeated in the same way with respect to all the datawords until the last dataword. In this way, inverse conversion is performed.

As described above, as the current dataword is inverse converted by using the current dataword before inverse conversion and the dataword immediately thereafter before inverse conversion, even if an error occurs, the influence of the error propagates only to the dataword to be used for inverse conversion of the current dataword, and the datawords thereafter remain unaffected. For example, even if an error occurs to the dataword $D'_i$ before inverse conversion, the influence of the error propagates only to the $D_i$ and $D_{i+1}$.

According to the example shown in FIG. 26, the conversion and inverse conversion of the data are performed by operating mod 2. However, as shown in FIG. 27, the conversion and inverse conversion of the data may be performed based on a table for use in obtaining the converted dataword $D'_i$ from the immediately preceding converted dataword $D_{i-1}$ or the initial data $T_j$ and the unconverted dataword $D'_i$. FIG. 27 shows a 2-bit conversion table, which enables the conversion by using up to 4 different types of initial data $T_j$.

Also, according to the examples shown in FIGS. 26 and 27, the data conversion is performed by using one piece of the immediately preceding converted dataword. However, the data conversion may be performed by using k (k 1) pieces of the immediately preceding converted dataword. So is the case with the inverse conversion of the data.

Figure 28:
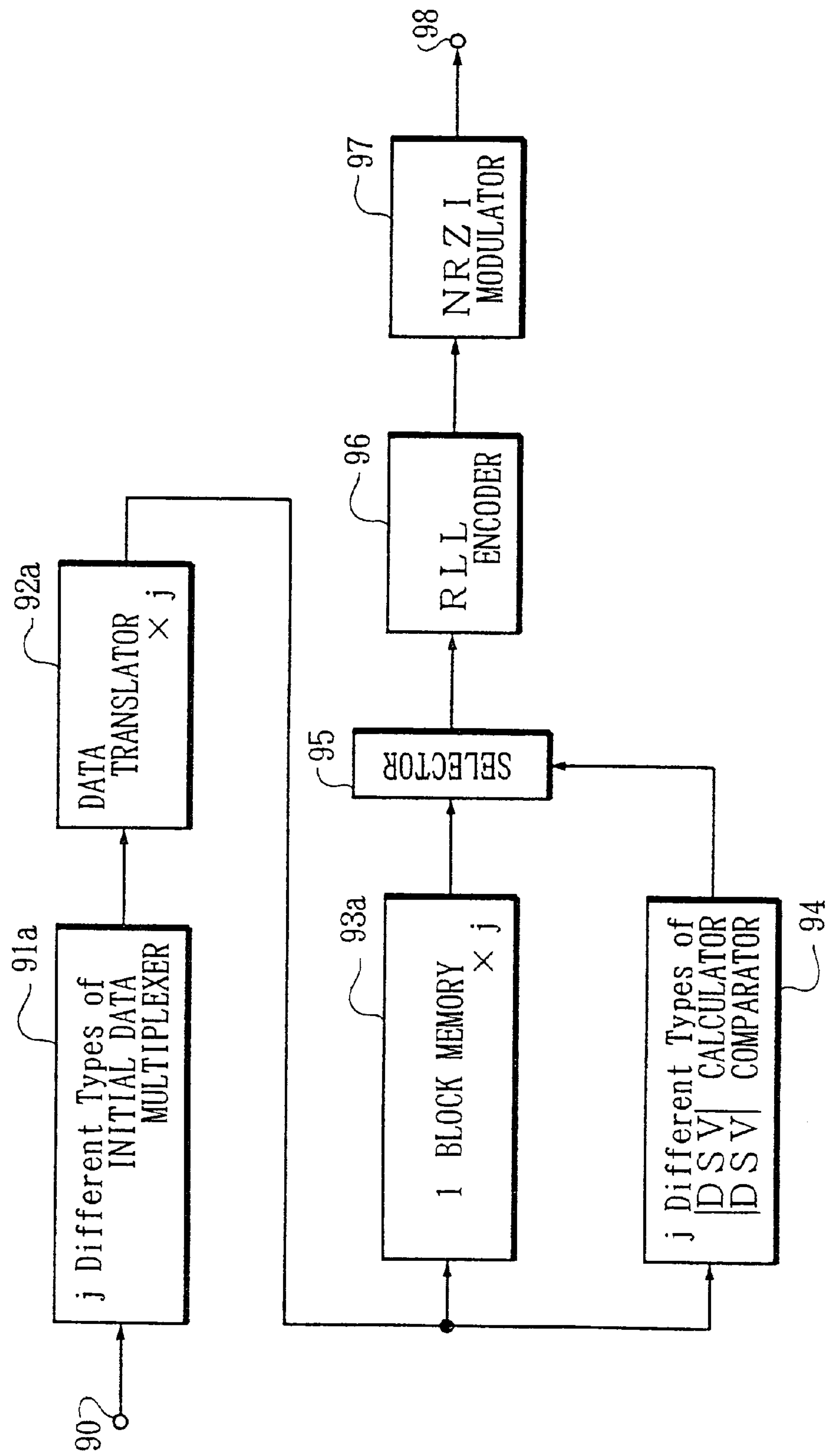
FIG. 28 is a block diagram of a digital modulation circuit of the 13th embodiment according to the present invention.

5-2 13th Embodiment (Embodiment of Modulator: FIG. 28)

When a data string composed of m-bit datawords is input through an input terminal 90, the j different types of initial data multiplexer 91*a* multiplexes the m-bits initial data $T_j$ at the head of the block to output j different types of blocks multiplexed the initial data to a data translator 92*a*. Here, the one block means a data string composed of the predetermined number of m-bit datawords, and this block is a unit for use in comparison of the absolute values of DSV.

Data translator 92*a* translates each of blocks multiplexed j different types of the initial data by using the convulsion processing technique to output j different types of converted blocks multiplexed with the initial data.

Each of j different types of converted blocks multiplexed with the initial data is stored into a one-block memory 93*a* and at the same time input to j different types of |DSV| calculator/comparator 94. In these j different types of |DSV| calculator/comparator 94, the |DSV|s of j different types of converted blocks multiplexed the initial data are compared with each other, and a converted block which has the smallest absolute value of the DSV is selected. The absolute values to be compared may be the absolute values at the last bit of the converted blocks or the absolute values having the largest amplitude within the converted blocks. As these possible modifications and the construction of the j different types of |DSV| calculator/comparator have been detailed in the description of the first embodiment, the description thereof will be omitted here.

When the converted block having the smallest |DSV| is selected, the selective data indicating the selected block is output to a selector 95. The selector 95 reads the converted block corresponding to the selective data out of the one block memory 93*a* and inputs the selected block into an RLL encoder 96. Then, such initial data multiplexed converted block is RLL coded by the RLL encoder 96 and then NRZI-modulated by an NRZI modulator 97.

Figure 29:
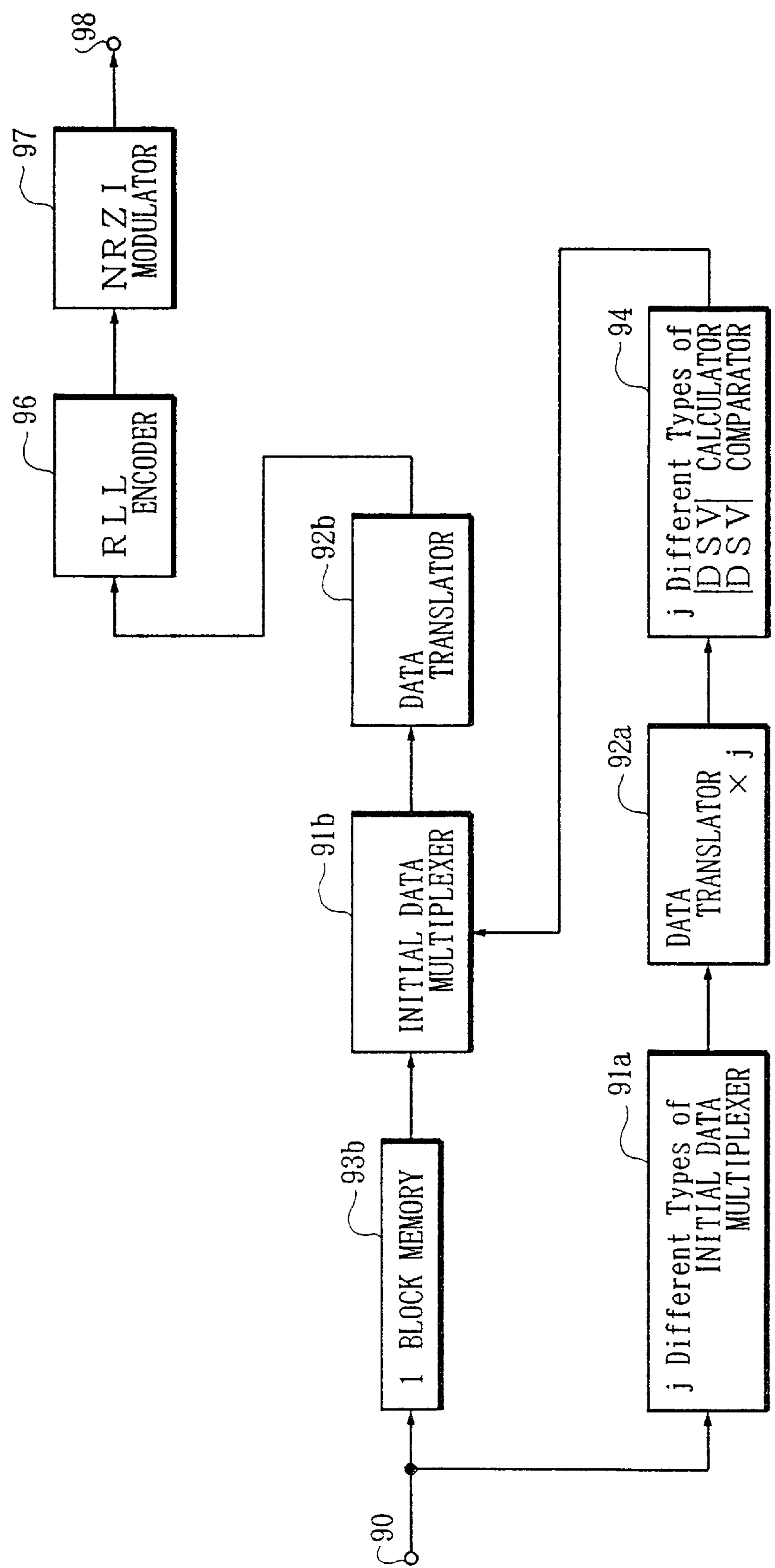
FIG. 29 is a block diagram of a digital modulation circuit of the 14th embodiment according to the present invention.

5-3 14th Embodiment (Embodiment of Modulator: FIG. 29)

The 14th embodiment is also constructed to reduce the number of one block memory. According to the 13th embodiment, as j different types of converted blocks converted by using j different types of initial data $T_j$ are stored into the one block memory 93*a* respectively, the one block memory 93*a* totally requires a capacity large enough to store j pieces of blocks. However, according to the 14th embodiment, by memorizing the unconverted block data, the necessary capacity of the block memory is so arranged to be large enough for the storage of one block. In the following description, the description of those parts identical to those of the 13th embodiment will be simplified.

When a data string composed of m-bit datawords is input through an input terminal 90, the data string is stored into a one-block memory 93$b$ and at the same time into j different types of initial data multiplexer 91$a$. In the j different types of initial data multiplexer 91$a$, j different types of initial data $T_j$ are multiplexed one after another, and thereby j different types of blocks multiplexed the initial data are generated. Here, the one block means a data string composed of the predetermined number of m-bit datawords. These j different types of blocks multiplexed the initial data are input to data translator 92$a$ and subjected to the convolution processing describe above, respectively, and thereby j different types of converted blocks multiplexed with the initial data are generated. The |DSV|s of these converted blocks are compared with each other by the j different types of |DSV| calculator/comparator 94, and such a converted block that has the smallest |DSV| is detected. The initial data $T_j$ corresponding to the detected block is selected, and the selective data indicating the detected initial data $T_j$ is output to an initial data multiplexer 91$b$.

In the initial data multiplexer 91$b$, at the head of the input block read out of the one-block memory 93$b$ the initial data $T_j$ corresponding to the selection result is multiplexed, and thereby the block multiplexed the initial data is generated. The block multiplexed the initial data is output to a data translator 92$b$ and subjected to the convulsion processing described above. The thus generated converted block is RLL-coded by an RLL encoder 96 and then NRZI-modulated by an NRZI modulator 97, and then output to an output terminal 98.

Figure 30:
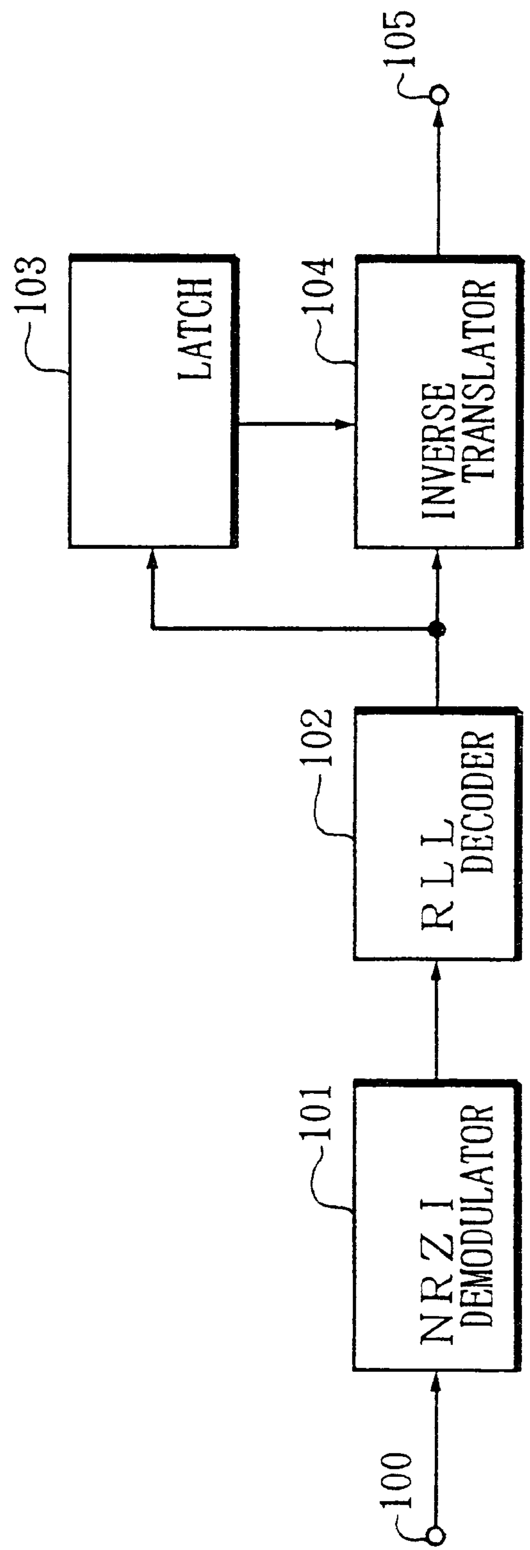
FIG. 30 is a block diagram of a digital demodulation circuit of the 15th embodiment according to the present invention.

5-4 15th Embodiment (Embodiment of Demodulator: FIG. 30)

FIG. 30 illustrates a circuit designed to demodulate the data modulated by the modulator illustrated in FIG. 28 or 29. The data input into this demodulator is NRZI-demodulated by an NRZI demodulator 101 and then RLL-decoded by an RLL decoder 102. The RLL-decoded data is output to a latch 103 and held there on the one hand, and output to an inverse translator 104 on the other hand.

In the inverse translator 104, inverse translation by means of the convulsion processing described above is performed to the delay data input from the latch 103 (current dataword to be inverse translated) and the dataword input from the RLL decoder 102 (dataword immediately thereafter). Thereby, the converted data is restored to the original data.

6. Two-Dimensional Error Correction

As described above, according to the seventh, eighth, tenth and eleventh embodiments, in the block multiplexed with the parity code, if errors occur to the translating mode code and the number of such errors exceeds the limited number of erroneous elements the RS code can correct within the block, as either translating mode code after RS decoding is wrong, the inverse conversion of the data can not properly be performed, and therefore the errors may be propagated throughout the block. In order to prevent the errors from propagation throughout the block, according to the embodiment described below, the error correction ability is strengthened by adding further error correction codes to the translating mode code.

6-1 Data Format with Strengthened Error Correction Ability

Figure 31:
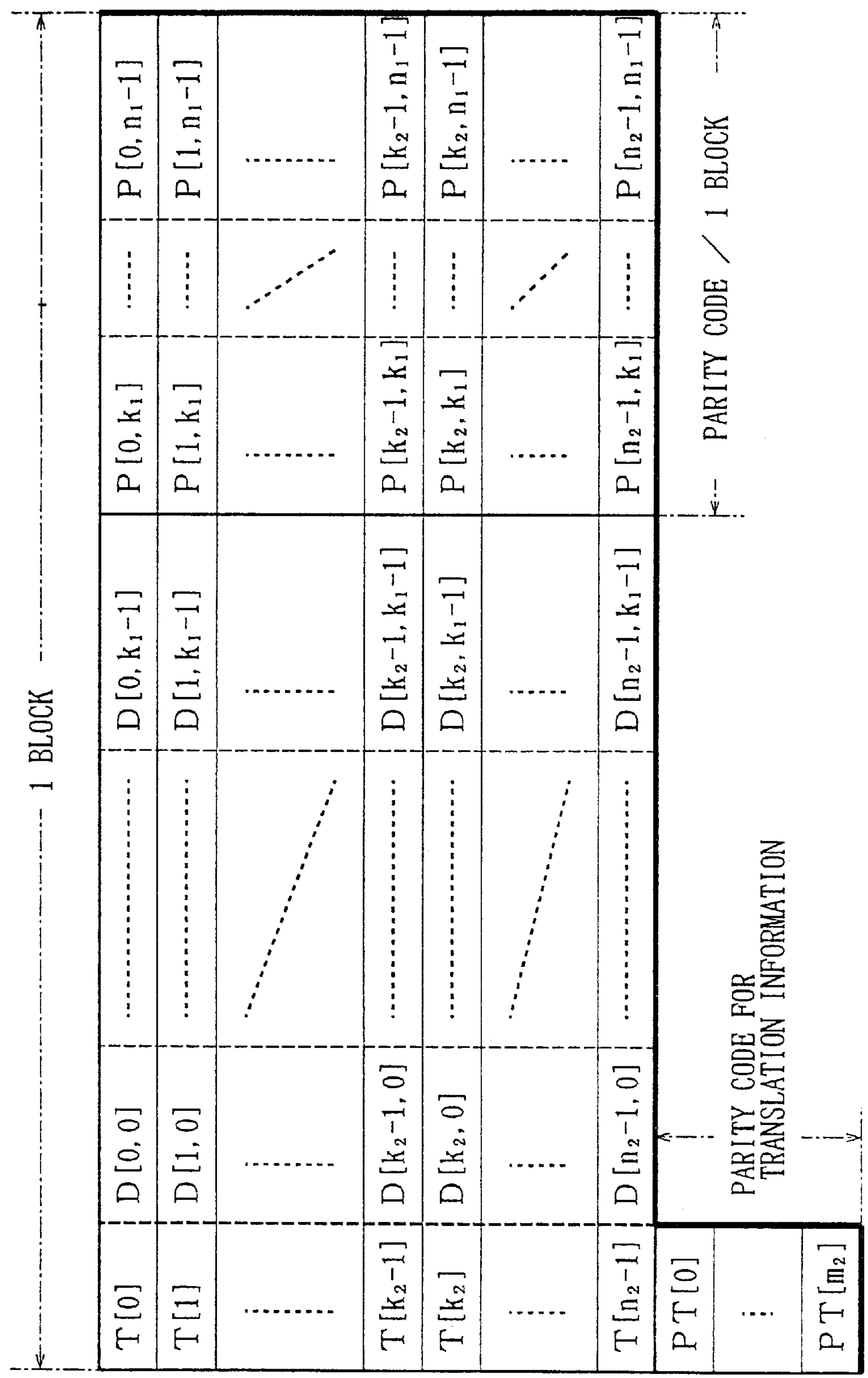
FIG. 31 is a chart illustrating a data format of plural blocks where the error correction ability is strengthened.

FIG. 31 shows the data format for use in a case where the error correction ability of the translating mode code has been strengthened. Each line ($n_1$ bite data) in FIG. 31 is the block multiplexed with the parity code, which is selected in such a way that each |DSV| can be the smallest. At the head part of each line of the data format composed of $n_2$ line blocks is multiplexed the translating mode code. The parity codes PT[0] to PT[$m_2$] are generated from the $n_2$ pieces of translating mode code. Each translating mode code has error correction ability within the block, as described above, therefore the translating mode code is judged to have doubled error correction ability by this processing.

Figure 32:
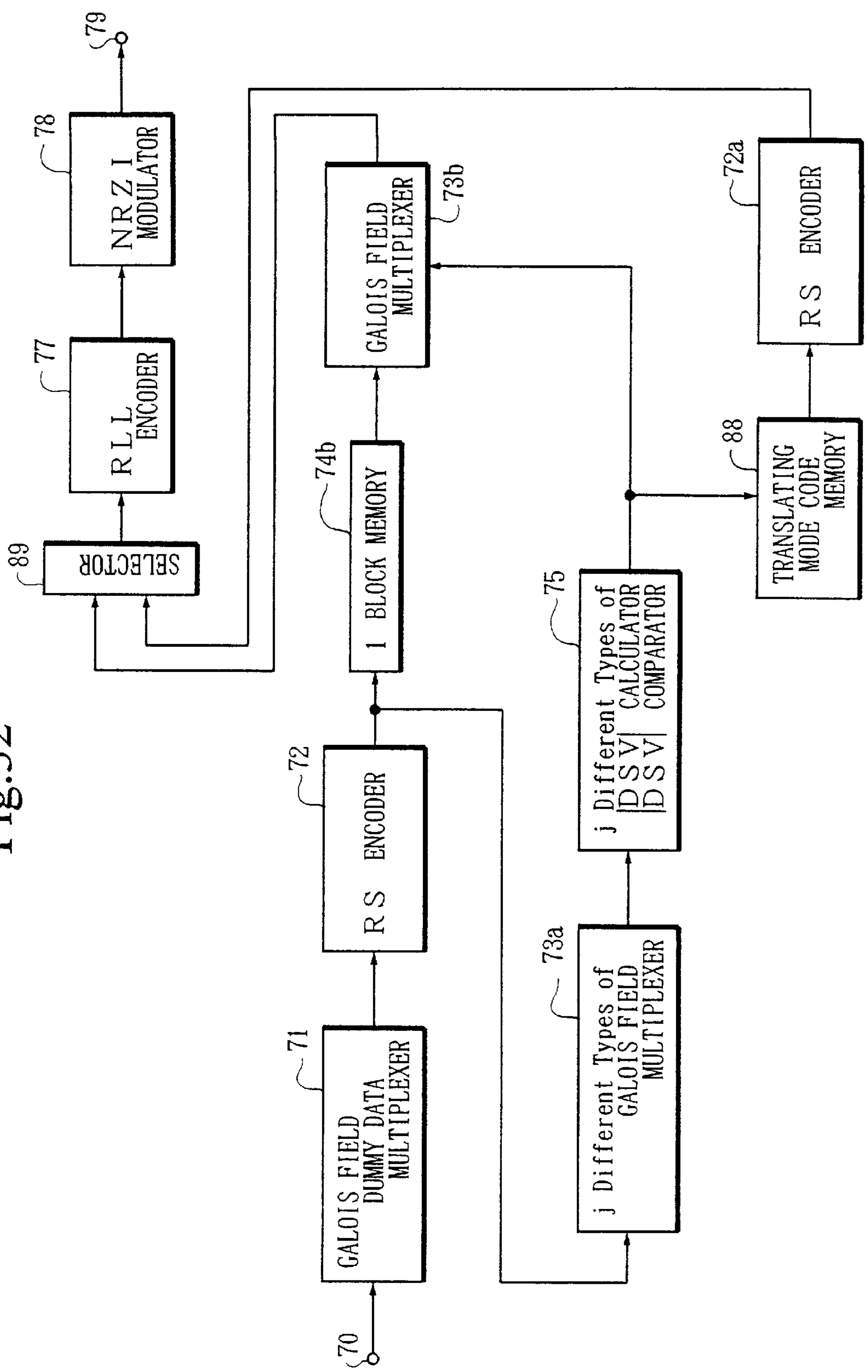
FIG. 32 is a block diagram of a digital modulation circuit of the 16th embodiment according to the present invention.

6-2 Sixteenth Embodiment (Embodiment of Modulator: FIG. 32)

Format data illustrated in FIG. 31 can be obtained by using the extended 7th, 8th, 10th or 11th embodiment. The 16th embodiment illustrated in FIG. 32 is an extension of the 11th embodiment illustrated in FIG. 24. In the following description, the description of those parts identical to those of the 11th embodiment will be omitted.

The block multiplexed with the parity code is input to a j different types of Galois field multiplier 73$a$, and multiplied by j different types of elements over the Galois field, and thereby j different types of blocks are generated. The j different types of |DSV| calculator/comparator 75 compares the |DSV|s of j different types of multiplied blocks each other. As a result, a block which has the smallest |DSV| is selected therefrom, and the data indicating the element over the Galois field corresponding to the selected block is output to the Galois field multiplier 73$b$ and a translating mode code memory 88.

The Galois field multiplier 73$b$ reads the block multiplexed with the parity code out of the one-block memory 74$b$ and multiplies the block by the element over the Galois field indicated by the data input from the |DSV| calculator/comparator 75. The block multiplexed with the parity code after the multiplication by the element over the Galois field is output to a selector 89.

The translating mode code memory 88 stores translating mode code input from the |DSV| calculator/comparator 75. When the $n_2$ number of the translating mode codes is stored in the translating mode code memory 88, these elements are output to an RS encoder 72$a$. In the RS encoder 72$a$, the error correction code for the $n_2$ number of the elements over the Galois field is operated, and this error correction code is output to the selector 89.

The selector 89 firstly outputs the $n_2$ number of the blocks and then outputs the $m_2$-byte parity codes to an RLL encoder 77. The data output from the selector 77 is m-n coded by the RLL encoder 77, then NRZI modulated by the NRZI modulator 78, and then output to an output terminal 79.

Figure 33:
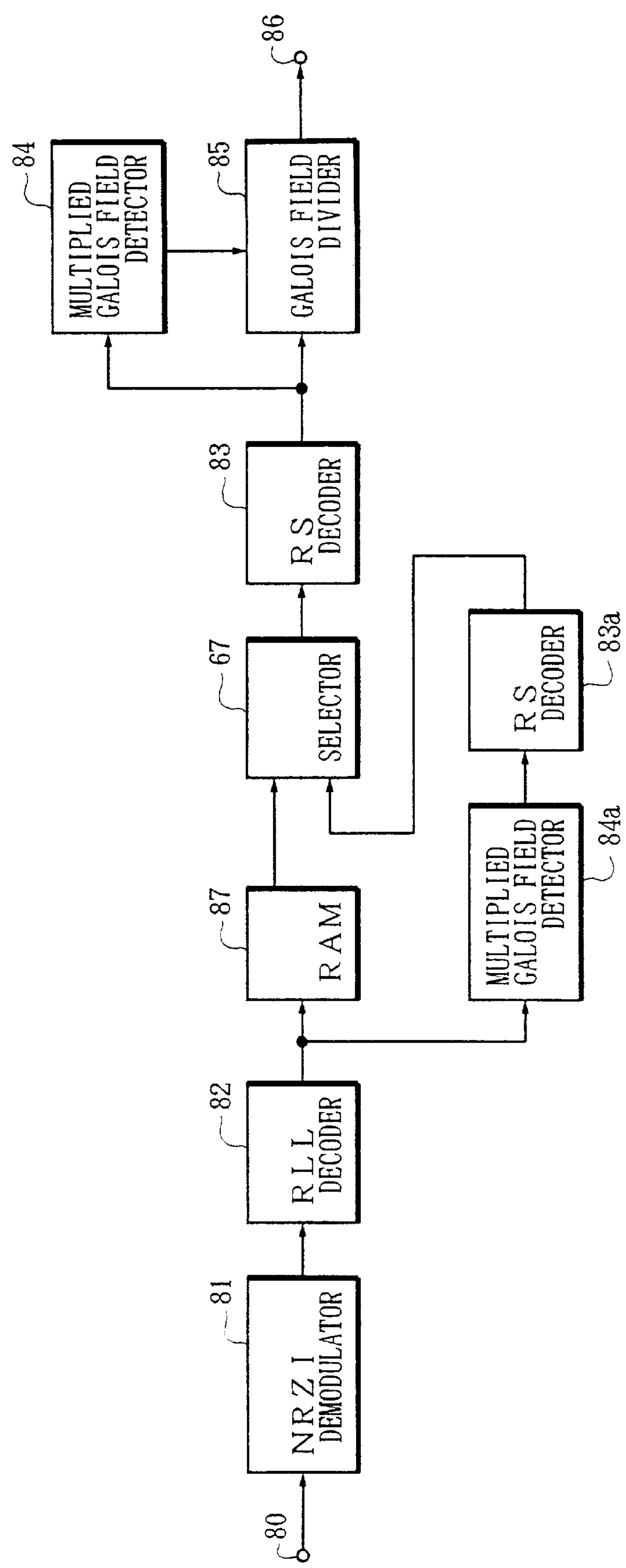
FIG. 33 is a block diagram of a digital demodulation circuit of the 17th embodiment according to the present invention.

6-3 Seventeenth Embodiment (Embodiment of Demodulator: FIG. 33)

Format data illustrated in FIG. 31 can be obtained by using the extended 9th or 12th embodiment. The 17th embodiment illustrated in FIG. 33 is an extension of the 12th embodiment illustrated in FIG. 25. In the following description, the description of those parts identical to those of the 12th embodiment will be omitted.

The NRZI code string input through an input terminal 80 is demodulated to an RLL code sequence by an NRZI demodulator 81 and then n-m decoded by an RLL decoder 82. This n-m decoded data is stored into a RAM 87.

Multiplied Galois field detector 84$a$ detects the translating mode code and the error correction code thereof from the n-m decoded data sequence. The detected translating mode code and its parity code thereof are output to an RS decoder 83$a$ to be performed error correction processing. The error corrected $n_2$ number of the translating mode code is output to a selector 67.

The selector 67 reads data excluding the translating mode code from the RAM 87 and multiplexes by the translating mode code input from the RS decoder 83$a$. That is, the selector 67 substitutes the corrected translating mode code input from the RS decoder 83$a$ for the erroneous translating mode code read out of the RAM 87. The data output from the selector 67 is RS decoded by the RS decoder 83, then detects the corrected translating mode code by the multiplied Galois field detector 84. The thus detected corrected translating mode code is output to a Galois field divider 85.

In the Galois field divider 85, the data input from the RS decoder 83 is divided by the corrected translating mode code input from the multiplied Galois field detector 84.

7 Eighteenth Embodiment (Embodiment of Modulator: FIG. 34)

A digital modulation circuit being comprised of a data sequence translator, a digital encoder and a DSV comparator is shown in FIG. 34.

The data sequence translator translates a first data block composed of a predetermined number of m-bit datawords to one of second data blocks composed of the same predetermined number of m-bit datawords in certain order. The above data translation or data mapping may be executed by using techniques of the table changing (as described in the 7th or 8th embodiment), the data scrambling, the multiplying by elements over the Galois field (as described in the 10th or 11th embodiment) or the convolutional processing (as described in the 13th or 14th embodiment).

The digital encoder encodes the second data block to a code sequence composed of the same predetermined number of n-bit codewords. For example, the digital encoder encodes the second data sequence B to the (d,k;m,n)RLL code sequence, and then converts the (d,k;m,n)RLL code sequence to the NRZI code sequence.

The DSV comparator compares the DSV the digital encoder outputs to those of the previous outputs derived from the same first data block. The DSV comparator selects such a translation mode that minimizes the DSV of the digital encoder outputs within the block. This selection information is output to the data sequence translator.

The data sequence translator translates the first data block to the second data block by using the translation mode indicated by the selection information.

We claim:

1. A digital modulation circuit which encodes an m-bit dataword cut out of an input binary data stream one after another to an n-bit codeword, where n≧m, comprising:

obtaining means for obtaining respective DC components of code blocks composed of a predetermined number of the n-bit codewords, respectively, and encoding to a data block composed of the same number of m-bit datawords by using different types of m-n encoding modes, respectively;

comparing means for comparing respective sizes of absolute values of the DC components with each other;

selecting means for selecting the m-n encoding mode corresponding to the code block having the smallest absolute value of the DC components;

encoding means for encoding the data block to a target code block by using the selected m-n encoding mode; and a multiplexer for multiplexing a number code indicating the selected m-n encoding mode to the target code block.

2. A digital modulation circuit according to claim 1, wherein said selecting means selects the m-n encoding mode corresponding to the code block having the smallest absolute value of the DC components, where the DC component is the DSV at the end bit of the code block.

3. A digital modulation circuit according to claim 1, wherein said selecting means selects the m-n encoding mode corresponding to the code block having the smallest absolute value of the DC components, where the DC component is the DSV at such a bit that has the maximum amplitude of the DSV within the code block.

4. A digital modulation circuit according to claim 1, wherein said code blocks in which sizes of absolute values of the DC components are to be compared are such blocks that have been NRZI-modulated after the m-n encoding.

5. A digital modulation circuit which encodes an m-bit dataword cut out of an input binary data stream one after another to an n-bit codeword, where n≧m, comprising:

a ROM storing basic values corresponding to DC components of code blocks composed of a predetermined number of the n-bit codewords, respectively, and encoding to a data block composed of the same number of the m-bit datawords by using different types of m-n encoding modes, respectively, each of the basic values being addressed by the m-bit dataword and the m-n encoding mode;

calculating means for calculating the respective DC components based on the basic values read from the ROM;

comparing means for comparing respective sizes of absolute values of the DC components with each other;

selecting means for selecting the m-n encoding mode corresponding to the code block having the smallest absolute value of the DC components;

encoding means for encoding the data block to a target code block by using the selected m-n encoding mode; and a multiplexer for multiplexing a number code indicating the selected m-n encoding mode to the target code block.

6. A digital demodulation circuit which decodes an n-bit codeword cut out of an input binary code stream one after another to an m-bit dataword, where n≧m, comprising:

detecting means for detecting a number code indicating an m-n encoding mode used within a code block composed of a predetermined number of the n-bit codewords from the input binary code stream;

determining means for determining the n-m decoding mode used within the code block based on the detected number code multiplexed thereto; and decoding means for decoding the code block to an original data block composed of the predetermined number of the m-bit datawords by using the determined n-m decoding mode.

7. A digital modulation circuit which encodes an m-bit dataword cut out of an input binary data stream one after another to an e-bit codeword to generate a (d,k;m,n) RLL code sequence, where n≧m, comprising:

obtaining means for obtaining respective DC components of multiplexed code blocks composed of code blocks and formal number codes multiplexed thereto, the code blocks being composed of a predetermined number of the n-bit codewords and encoding to a data block composed of the same number of the m-bit datawords by using different types of m-n encoding modes, respectively, the formal number codes indicating the different types of m-n encoding mode, respectively;

first selecting means for selecting each of the formal number codes to be multiplexed to the corresponding code blocks, respectively, from among different types of number codes indicating the same m-n encoding mode, respectively, in such a way that minimizes the DC component of the resultant multiplexed code block, where the different types of number codes satisfy the constraint d of the (d,k;m,n) RLL code;

comparing means for comparing respective sizes of absolute values of the DC components of the multiplexed code blocks with each other;

second selecting means for selecting the m-n encoding mode corresponding to the multiplexed code block having the smallest absolute value of the DC components;

encoding means for encoding the data block to a target code block by using the selected m-n encoding mode; and a multiplexer for multiplexing the formal number code indicating the selected men encoding mode to the target code block.

8. A digital modulation circuit according to claim 7, wherein said second selecting means selects the m-n encoding mode corresponding to the multiplexed code block having the smallest absolute value of the DC components, where the DC component is the DSV at the end bit of the code block.

9. A digital modulation circuit according to claim 7, wherein said second selecting means selects the m-n encoding mode corresponding to the multiplexed code block having the smallest absolute value of the DC components, where the DC component is the DSV at such a bit that has the maximum amplitude of the DSV within the code block.

10. A digital modulation circuit according to claim 7, wherein said multiplexed code blocks in which sizes of absolute values of the DC components are to be compared are such blocks that have been NRZI-modulated after the multiplexing and m-n encoding.

11. A digital modulation circuit according to claim 7, wherein said different types of number codes indicating the same m-n encoding mode, respectively, are two number codes.

12. A digital modulation circuit which encodes an m-bit dataword cut out of an input binary data stream one after another to an n-bit codeword to generate a (d,k;m,n) RLL code sequence, where n≧m, comprising:

a ROM stored basic values corresponding to DC components of code blocks composed of a predetermined number of the n-bit codewords, respectively, and encoded from a data block composed of the same number of the m-bit datawords by using different types of m-n encoding modes, respectively, each of the basic values being addressed by the m-bit dataword and the m-n encoding mode;

obtaining means for obtaining respective DC components of multiplexed code blocks by calculating the respective DC components of the code blocks based on the basic values read from the ROM, the multiplexed code blocks being composed of code blocks and formal number codes multiplexed thereto, the code blocks being composed of a predetermined number of the n-bit codewords and encoded a data block composed of the same number of the m-bit datawords to by using different types of m-n encoding modes, respectively, the formal number codes indicating the different types of men encoding modes, respectively;

first selecting means for selecting each of the formal number codes to be multiplexed to the corresponding code blocks, respectively, from among different types of number codes indicating the same m-n encoding mode, respectively, in such a way that minimizes the DC component of the resultant multiplexed code block, where the different types of number codes satisfy the constraint d of the (d,k;m,n) RLL code;

comparing means for comparing respective sizes of absolute values of the DC components of the multiplexed code blocks with each other;

second selecting means for selecting the m-n encoding mode corresponding to the multiplexed code block having the smallest absolute value of the DC components;

encoding means for encoding the data block to a target code block by using the selected m-n encoding mode; and a multiplexer for multiplexing the formal number code indicating the selected m-n encoding mode to the target code block.

13. A digital modulation circuit which encodes an m-bit dataword cut out of an input binary data stream one after another to an n-bit codeword to generate a (d,k;m,n) RLL code sequence, where n≧m, comprising:

obtaining means for obtaining respective DC components of code blocks composed of a predetermined number of the n-bit codewords, respectively, and encoding to a data block composed of the same number of the m-bit datawords by using different types of m-n encoding modes, respectively;

comparing means for comparing respective sizes of absolute values of the DC components with each other;

selecting means for selecting the m-n encoding mode corresponding to the code block having the smallest absolute value of the DC components;

encoding means for encoding the data block to a target code block by using the selected m-n encoding mode;

a number code generator for extracting a number code indicating the selected m-n encoding mode from among different types of number codes satisfying the constraint d of the (d,k;m,n) RLL code, respectively; and, a multiplexer for multiplexer code to the target code block.

14. A digital modulation circuit according to claim 13, wherein said number code generator has a table including the number codes obtained by generating original number codes satisfying the constraint d of the (d,k;m,n) RLL code more than the total number of the m-n encoding modes, then error-correction coding the original number codes to generate error correcting number codes, and then selecting such code that satisfies the constraint of the (d,k;m,n)RLL code to generate the desirable number codes.

15. A digital modulation circuit which encodes an m-bit dataword cut out of an input binary data stream one after another to an n-bit codeword, where n≧m, comprising:

a data mapping circuit for mapping a data block composed of a predetermined number of the m-bit datawords described according to an original description rule to mapped blocks composed of the same number of m-bit datawords described according to other description rules;

a multiplexer for multiplexing number codes indicating the description rules to the corresponding mapped blocks to generate number-multiplexed blocks, respectively;

an error correction coding circuit for error correction coding the number-multiplexed blocks to generate error correcting coded blocks, respectively;

obtaining means for obtaining DC components of m-n coded blocks obtained by m-n encoding the error-correction-coded blocks, respectively;

comparing means for comparing respective sizes of absolute values of the DC components with each other;

selecting means for selecting the description rule corresponding to the m-n coded block having the smallest absolute value of the DC components; and encoding means for encoding the error-correction-coded block described according to the selected description rule to a target code block composed of the predetermined number of the n-bit codewords.

16. A digital modulation circuit according to claim 15, wherein said selecting means selects the description rule corresponding to the m-n coded block having the smallest absolute value of the DC components, where the DC component is the DSV at the end bit of the m-n coded block.

17. A digital modulation circuit according to claim 15, wherein said selecting means selects the description rule corresponding to the m-n coded block having the smallest absolute value of the DC components, where the DC component is the DSV at such a bit that has the maximum amplitude of the DSV within the m-n coded block.

18. A digital modulation circuit which encodes an m-bit dataword cut out of an input binary data stream one after another to an e-bit codeword, where n≧m, comprising:

a data mapping circuit for mapping a data block composed of a predetermined number of the m-bit datawords described according to an original description rule to mapped blocks composed of the same number of m-bit datawords described according to other description rules;

a multiplexer for multiplexing number codes indicating the description rules to the corresponding mapped blocks to generate number multiplexed blocks, respectively;

an error correction coding circuit for error correction coding the number-multiplexed blocks to generate error-correction-coded blocks, respectively;

a memory for storing the error-correction-coded blocks;

obtaining means for obtaining DC components of m-n coded blocks obtained by m-n encoding the error correcting code blocks, respectively;

comparing means for comparing respective sizes of absolute values of the DC components with each other;

selecting means for selecting the description rule corresponding to the men coded block having the smallest absolute value of the DC components; and encoding means for reading the error-correction coded block specified by the selected description rule from the memory and encoding the error-correction-coded block to a target code block composed of the predetermined number of the n-bit codewords.

19. A digital modulation circuit which encodes an m-bit dataword cut out of an input binary data stream one after another to an n-bit codeword, where n≧m, comprising:

a memory for storing an input binary data stream for a block composed of predetermined number of the m-bit datawords according to an original description rule;

a first data mapping circuit for mapping an input binary data stream for a block to mapped blocks composed of the same number of m-bit datawords described according to other description rules;

a first multiplexer for multiplexing number codes indicating the description rules to the corresponding mapped blocks input from the first data mapping circuit to generate number-multiplexed blocks, respectively;

a first error correction coding circuit for error correction coding the number-multiplexed blocks input from the first multiplexer to generate error-correction-coded blocks, respectively;

obtaining means for obtaining DC components of m-n coded blocks obtained by m-n encoding the error-correction-coded blocks input from the first error correction coding circuit, respectively;

comparing means for comparing respective sizes of absolute values of the DC components with each other;

selecting means for selecting the description rule corresponding to the men coded block having the smallest absolute value of the DC components;

a second data mapping circuit for mapping the data block read from the memory to the mapped block described to according to the selected description rule;

a second multiplexer for multiplexing the number code indicating the selected description rule to the mapped block input from the second data mapping circuit to generate the number-multiplexed block;

a second error correction coding circuit for error-correction-coding the number-multiplexed block input from the second multiplexer to generate error-correction-coded block; and encoding means for encoding the error-correction-coded block input from the second error correction coding circuit to a target code block composed of the predetermined number of the n-bit codewords.

20. A digital demodulation circuit, comprising:

a decoder for decoding an n-bit codeword cut out of an input binary code stream one after another to an m-bit dataword to generate a decoded block composed of predetermined number of the m-bit datawords, where n≧m;

an error correcting circuit for correcting errors within the decoded block;

a detecting circuit for detecting a number code indicating a description rule from the decoded block; and a mapping circuit for mapping the decoded block to a data block described according to a description rule being indicated by the detected number code.

21. A digital modulation circuit which encodes an m-bit dataword cut out of an input binary data stream one after another to an n-bit codeword, where n≧m, comprising:

a multiplexer for multiplexing a dummy code of a non-zero element defied over the Galois field $GF(2^m)$ at the head of an input data block composed of the m-bit datawords to generate a multiplexed block;

a Reed Solomon coding circuit for RS coding the multiplexed block to generate an RS coded block;

a multiplying circuit for multiplying the RS coded block by one of different types of elements defined over the Galois field $GF(2^m)$ to generate different types of GF-multiplied blocks;

obtaining means for obtaining DC components of m-n coded blocks composed of the predetermined number of n-bit codewords, the m-n coded blocks being encoded with the GF-multiplied blocks, respectively;

comparing means for comparing respective sizes absolute values of the DC components each other;

selecting means for selecting an element defined over the Galois field $GF(2^m)$ corresponding to the men coded block having the smallest absolute value of the DC components; and encoding means for encoding the GF multiplied block multiplied by the selected element defined over the Galois field $GF(2^m)$ to a target m-n coded block.

22. A digital modulation circuit according to claim 21, wherein said selecting means selects the element defined over the Galois field $GF(2^m)$ corresponding to the m-n coded block having the smallest absolute value of the DC components, where the DC component is the DSV at the end bit of the m-n coded block.

23. A digital modulation circuit according to claim 21, wherein said selecting means selects the element defined over the Galois field $GF(2^m)$ corresponding to the m-n coded block having the smallest absolute value of the DC components, where the DC component is the DSV at such a bit that has the maximum amplitude to of the DSV within the m-n coded block.

24. A digital modulation circuit which encodes an m-bit dataword cut out of an input binary data stream one after another to an e-bit codeword, where n≧m, comprising:

a multiplexer for multiplexing a dummy code of a non-zero element defined over the Galois field $GF(2^m)$ at the head of an input data block composed of the m-bit datawords to generate a multiplexed block;

a Reed Solomon coding circuit for RS coding the multiplexed block to generate an RS coded block;

a multiplying circuit for multiplying the RS coded block by elements defined over the Galois field $GF(2^m)$ to generate different types of GF-multiplied blocks;

a memory for storing the GF-multiplied blocks;

obtaining means for obtaining DC components of m-n coded blocks composed of the predetermined number of n-bit codewords, the m-n coded blocks being encoded from the GF-multiplied blocks, respectively;

comparing means for comparing respective sizes of absolute values of the DC components with each other;

selecting means for selecting an element defined over the Galois field $GF(2^m)$ corresponding to the m-n coded block having the smallest absolute value of the DC components; and encoding means for reading the GF-multiplied block specified by the selected element defined over the Galois field $GF(2^m)$ from the memory and encoding the GF-multiplied block multiplied by the selected element defined over the Galois field $GF(2^m)$ to a target m-n coded block.

25. A digital modulation circuit which encodes an m-bit dataword cut out of an input binary data stream one after another to an e-bit codeword, where n≧m, comprising:

a multiplexer for multiplexing a dummy code of a non-zero element defined over the Galois field $GF(2^m)$ at the head of an input data block composed of the m-bit datawords to generate a multiplexed block;

a Reed Solomon coding circuit for RS coding the multiplexed block to generate an RS-coded block; a memory for storing the RS-coded block;

a first multiplying circuit for multiplying the RS-coded block by elements defined over the Galois field $GF(2^m)$ to generate different types of GF-multiplied blocks;

obtaining means for obtaining DC components of m-n coded blocks composed of the predetermined number of n-bit codewords, the m-n coded blocks being encoded with the GF-multiplied blocks input from the first multiplying circuit, respectively;

comparing means for comparing respective sizes of absolute values of the DC components with each other;

selecting means for selecting an element defined over the Galois field $GF(2^m)$ corresponding to the m-n coded block having the smallest absolute value of the DC components;

a second multiplying circuit for multiplying the RS coded block read from the memory by the selected element defined over the Galois field $GF(2^m)$ to generate a GF-multiplied block;

encoding means for encoding the GF-multiplied block input from the second multiplying circuit to a target m-n coded block.

26. A digital demodulation circuit, comprising:

a decoder for decoding an n-bit codeword cut out of an input binary code stream one after another to an m-bit dataword to generate a decoded block composed of a predetermined number of the m-bit datawords, where n≧m;

an error correcting circuit for correcting errors within the decoded block;

a detecting circuit for detecting an element defined over the Galois field $GF(2^m)$ from the error corrected block; and, a dividing circuit for dividing the error corrected block by an the detected element defined over the Galois field $GF(2^m)$.

27. A digital modulation circuit which encodes an m-bit dataword cut out of an input binary data stream one after another to an n-bit codeword, where n≧m, comprising:

a multiplexer for multiplexing different types of m-bit initial codes at the head of an input data block composed of a predetermined number of the m-bit datawords to generate different types of multiplexed blocks;

first substituting means for substituting the initial code and then a converted dataword sequentially for a preceding variable;

second substituting means for substituting a current dataword read from the multiplexed block to a current variable;

first operating means for operating an exclusive-OR between the preceding variable and the current variable to output the converted dataword to the first substituting means and second operating means;

second operating means for replacing the current dataword in the multiplexed block with the converted dataword output from the first operating means;

a controller for controlling the first substituting means, second substituting means, first operating means and the second operating means to execute their process to all the different types of multiplexed blocks to generate converted blocks;

obtaining means for obtaining DC components of the m-n coded blocks composed of the predetermined number of the n-bit codewords, the m-n coded blocks being encoded with the converted blocks, respectively;

comparing means for comparing respective sizes of absolute values of the DC components with each other;

selecting means for selecting the m-bit initial code corresponding to the converted block having the smallest absolute value of the DC components; and encoding means for encoding the multiplexed block multiplexed with the selected m-bit initial code to a target m-n coded block.

28. A digital modulation circuit according to claim 27, wherein said selecting means selects the m-bit initial code corresponding to the m-n coded block having the smallest absolute value of the DC components, where the DC component is the DSV at the end bit of the men coded block.

29. A digital modulation circuit according to claim 27, wherein said selecting means selects the m-bit initial code corresponding to the m-n coded block having the smallest absolute value of the DC components, where the DC component is the DSV at such a bit that has the maximum amplitude of the DSV within the m-n coded block.

30. A digital modulation circuit which encodes an m-bit dataword cut out of an input binary data stream one after another to an n-bit codeword, where n≧m, comprising:

a multiplexer for multiplexing different types of types of m-bit initial codes at the head of an input data block composed of predetermined number of the m-bit datawords to generate different types of multiplexed blocks;

first substituting means for substituting the initial code then a converted dataword sequentially for a preceding variable;

second substituting means for substituting a current dataword read from the multiplexed block for a current variable;

first operating means for operating an exclusive-OR between the preceding variable and the current variable to output the converted dataword to the first substituting means and second operating means;

second operating means for replacing the current dataword in the multiplexed block with the converted dataword output from the first operating means;

a controller for controlling the first substituting means, second substituting means, first operating means and the to second operating means to excuse their process to all the different types of multiplexed blocks to generate converted blocks;

a memory for storing the converted blocks;

obtaining means for obtaining DC components of the m-n coded blocks composed of the predetermined number of the n-bit codewords, the m-n coded blocks being encoded with the converted blocks, respectively;

comparing means for comparing respective sizes of absolute values of the DC components with each other;

selecting means for selecting the m-bit initial code corresponding to the converted block having the smallest absolute value of the DC components; and encoding means for reading the converted block corresponding to the selected m-bit initial code from the memory and encoding the converted block to a target men coded block.

31. A digital modulation circuit which encodes an m-bit dataword cut out of an input binary data stream one after another to an e-bit codeword, where n≧m, comprising:

a memory for storing an input binary data stream for a block composed of predetermined number of the m-bit datawords;

a first multiplexer for multiplexing different types of types of m-bit initial codes at the head of an input data block composed of predetermined number of the m-bit datawords to generate different types of multiplexed blocks;

first substituting means for substituting the initial code then a converted dataword sequentially for a preceding variable;

second substituting means for substituting a current dataword read from the multiplexed block for a current variable;

first operating means for operating an exclusive-OR between the preceding variable and the current variable to output the converted dataword to the first substituting means and second operating means;

second operating means for replacing the current dataword in the multiplexed block with the converted dataword output from the first operating means;

a controller for controlling the first substituting means, second substituting means, first operating means and the second operating means to execute their process to all the different types of multiplexed blocks to generate converted blocks;

obtaining means for obtaining DC components of the m-n coded blocks composed of the predetermined number of the n-bit codewords, the m-n coded blocks being encoded to the converted blocks, respectively;

comparing means for comparing respective sizes of absolute values of the DC components with each other;

selecting means for selecting the m-bit initial code corresponding to the converted block having the smallest absolute value of the DC components;

a second multiplexer for multiplexing the selected m-bit initial codes at the head of a data block read from the memory to generate a multiplexed block; and encoding means for encoding the multiplexed block input from the second multiplexer to a target m-n coded block.

32. A digital demodulation circuit, comprising:

a decoder for decoding an n-bit codeword cut out of an input binary code data stream one after another to an m-bit dataword to generate a decoded block composed of a predetermined number of the m-bit datawords, where n≧m;

first substituting means for substituting the initial code and then a preceding codeword read from the input code block sequentially for a preceding variable;

second substituting means for substituting a current codeword read from the input code block for a current variable; and operating means to operating an exclusive-OR between the preceding variable and the current variable to output the m-bit dataword to an output terminal.

33. A method for encoding an m-bit dataword cut out of an input binary data stream one after another to an n-bit codeword, where n≧m, comprising the steps of:

obtaining respective DC components of code blocks composed of predetermined number of the n-bit codewords, respectively, and encoding to a data block composed of the same number of the m-bit datawords by using different types of m-n encoding modes, respectively;

comparing respective sizes of absolute values of the DC components with each other;

selecting the m-n encoding mode corresponding to the code block having the smallest absolute value of the DC components;

encoding the data block to a target code block by using the selected m-n encoding mode; and multiplexing a number code indicating the selected encoding mode to the target code block.

34. A method for decoding an n-bit codeword cut out of an input binary code stream one after another to an m-bit dataword, where n≧m, comprising the steps of:

detecting a number code indicating an m-n encoding mode used within a code block composed of predetermined number of the n-bit codewords from the input binary code stream;

determining the n-m decoding mode used within the code block based on the detected number code multiplexed thereto; and decoding the code block to an original data block composed of the predetermined number of the m-bit datawords by using the determined n-m decoding mode.

35. A method for encoding an m-bit dataword cut out of an input binary data stream one after another to an n-bit codeword to generate a (d,k;m,n)RLL code sequence, where n≧m, comprising the steps of:

obtaining respective DC components of multiplexed code blocks composed of code blocks and formal number codes multiplexed thereto, the code blocks being composed of a predetermined number of the n-bit codewords and encoded to a data block composed of the same number of the m-bit datawords by using different types of m-n encoding modes, respectively, the formal number codes indicating the different types of m-n encoding modes, respectively;

selecting each of the formal number codes to be multiplexed to the corresponding code blocks, respectively, from among different types of number codes indicating the same m-n encoding mode, respectively, in such a way that minimizes the DC component of the resultant multiplexed code block, where the different types of number codes satisfy the constraint of the (d,k;m,n) RLL code;

comparing respective sizes of absolute values of the DC components of the multiplexed code blocks with each other;

selecting the m-n encoding more corresponding to the multiplexed code block having the smallest absolute value of the DC components;

encoding the data block to a target code block by using the selected m-n encoding mode; and, multiplexing the formal number code indicating the selected m-n encoding mode to the target code block.

36. A method for encoding an m-bit dataword cut out of an input binary data stream one after another to an n-bit codeword to generate a (d,k;m,n)RLL code sequence, where n≧m, comprising the steps of:

obtaining respective DC components of code blocks composed of a predetermined number of the n-bit codewords, respectively, and encoded to a data block composed of the same number of the m-bit datawords by using different types of m-n encoding modes, respectively;

comparing respective sizes of absolute values of the DC components with each other;

selecting the m-n encoding mode corresponding to the code block having the smallest absolute value of the DC components;

encoding the data block to a target code block by using the selected m-n encoding mode;

extracting a number code indicating the selected m-n encoding mode from among different types of number codes satisfying the constraint d of the (d,k;m,n)RLL code, respectively; and, multiplexing the generated number code to the target code block.

37. A method for encoding an m-bit dataword cut out of an input binary data stream one after another to an n-bit codeword, where n≧m, comprising the steps of:

mapping a data block composed of predetermined number of the m-bit datawords described according to an original description rule to mapped blocks composed of the same number of m-bit datawords described according to other description rules;

multiplexing number codes indicating the description rules to the corresponding mapped blocks to generate number-multiplexed blocks, respectively;

error-correction-coding the number-multiplexed blocks to generate error-correction-coded blocks, respectively;

obtaining DC components of m-n coded blocks obtained by m-n encoding the error-correction-coded blocks, respectively;

comparing respective sizes of absolute values of the DC components with each other;

selecting the description rule corresponding to the m-n coded block having the smallest absolute value of the DC components; and encoding the error-correction-coded block described according to the selected description rule to a target code block composed of the predetermined number of the n-bit codewords.

38. A method for demodulating, comprising the steps of:

decoding an n-bit codeword cut out of an input binary code stream one after another to an m-bit dataword to generate a decoded block composed of a predetermined number of the m-bit datawords, where n≧m;

correcting errors within the decoded block;

detecting a number code indicating a description rule from the decoded block; and, mapping the decoded block to a data block described according to a description rule being indicated by the detected number code.

39. A method for encoding an m-bit dataword cut out of an input binary data stream one after another to an n-bit codeword, where n≧m, comprising:

multiplexing a dummy code of a non-zero element defied over the Galois field $GF(2^m)$ at the head of an input data block composed of the m-bit datawords to generate a multiplexed block;

Reed-Solomon coding the multiplexed block to generate an RS coded block;

multiplying the RS coded block by one of different types of elements defined over the Galois field $GF(2^m)$ to generate different types of GF-multiplied blocks;

obtaining DC components of m-n coded blocks composed of the predetermined number of n-bit codewords, the m-n coded blocks being encoded to the GF-multiplied blocks, respectively;

comparing respective sizes of absolute values of the DC components with each other;

selecting an element defined over the Galois field $GF(2^m)$ corresponding to the m-n coded block having the smallest absolute value of the DC components; and encoding the GF-multiplied block multiplied by the selected element defined over the Galois field $GF(2^m)$ to a target m-n coded block.

40. A method for demodulating, comprising the steps of:

decoding an n-bit codeword cut out of an input binary code stream one after another to an m-bit dataword to generate a decoded block composed of a predetermined number of the m-bit datawords, where n≧m;

correcting errors within the decoded block;

detecting an element defined over the Galois field $GF(2^m)$ from the error-corrected block; and dividing the error-corrected block by an the detected element defined over the Galois field $GF(2^m)$.

41. A method for encoding an m-bit dataword cut out of an input binary data stream one after another to an n-bit codeword, where n≧m, comprising:

multiplexing different types of types of m-bit initial codes at the head of an input data block composed of the predetermined number of the m-bit datawords to generate different types of multiplexed blocks;

substituting the initial code and then a converted dataword sequentially for a preceding variable;

substituting a current dataword read from the multiplexed block for a current variable;

operating an exclusive-OR between the preceding variable and the current variable to output the converted dataword to the first substituting means and second operating means;

replacing the current dataword in the multiplexed block with the converted dataword output from the first operating means;

controlling the first substituting means, second substituting means, first operating means and the second operating means to excuse their process to all the different types of multiplexed blocks to generate converted blocks;

obtaining DC components of the m-n coded blocks composed of the predetermined number of the n-bit codewords, the m-n coded blocks being encoded to the converted blocks, respectively;

comparing respective sizes of absolute values of the DC components with each other;

selecting the m-bit initial code corresponding to the converted block having the smallest absolute value of the DC components; and encoding the multiplexed block multiplexed with the selected m-bit initial code to a target m-n coded block.

42. A method for demodulating, comprising the steps of:

decoding an n-bit codeword cut out of an input binary code data stream one after another to an m-bit dataword to generate a decoded block composed of predetermined number of the m-bit datawords, where $n \geqq m$;

substituting the initial code then a preceding codeword read from the input code block sequentially for a preceding variable;

substituting a current codeword read from the input code block for a current variable; and operating an exclusive-OR between the preceding variable and the current variable to output the m-bit dataword to an output terminal.

* * * * *